(12) United States Patent
Fukuda et al.

(10) Patent No.: US 12,101,928 B2
(45) Date of Patent: Sep. 24, 2024

(54) SEMICONDUCTOR STORAGE DEVICE

(71) Applicant: Kioxia Corporation, Tokyo (JP)

(72) Inventors: Natsuki Fukuda, Yokkaichi Mie (JP); Ryota Narasaki, Yokkaichi Mie (JP); Takashi Kurusu, Yokkaichi Mie (JP); Yuta Kamiya, Nagoya Aichi (JP); Kazuhiro Matsuo, Kuwana Mie (JP); Shinji Mori, Nagoya Aichi (JP); Shoji Honda, Kuwana Mie (JP); Takafumi Ochiai, Kuwana Mie (JP); Hiroyuki Yamashita, Yokkaichi Mie (JP); Junichi Kaneyama, Yokkaichi Mie (JP); Ha Hoang, Kuwana Mie (JP); Yuta Saito, Yokkaichi Mie (JP); Kota Takahashi, Yokkaichi Mie (JP); Tomoki Ishimaru, Yokkaichi Mie (JP); Kenichiro Toratani, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 512 days.

(21) Appl. No.: 17/460,967

(22) Filed: Aug. 30, 2021

(65) Prior Publication Data

US 2022/0310640 A1    Sep. 29, 2022

(30) Foreign Application Priority Data

Mar. 24, 2021  (JP) .................................. 2021-049805

(51) Int. Cl.
*H10B 41/27*  (2023.01)
*H10B 41/10*  (2023.01)
(Continued)

(52) U.S. Cl.
CPC ............. *H10B 41/27* (2023.02); *H10B 41/10* (2023.02); *H10B 43/10* (2023.02); *H10B 43/27* (2023.02)

(58) Field of Classification Search
None
See application file for complete search history.

(56) References Cited

U.S. PATENT DOCUMENTS

| 10,636,803 B2 | 4/2020 | Kato et al. |
| 10,651,186 B2 | 5/2020 | Koyama |

(Continued)

FOREIGN PATENT DOCUMENTS

| JP | 2017-010951 A | 1/2017 |
| JP | 2018-156975 A | 10/2018 |

(Continued)

*Primary Examiner* — Xiaoming Liu
(74) *Attorney, Agent, or Firm* — Foley & Lardner LLP

(57) ABSTRACT

A semiconductor storage device includes a first conductive layer that extends in a first direction; a second conductive layer that extends in the first direction and is arranged with the first conductive layer in a second direction; a first insulating layer that is provided between the first conductive layer and the second conductive layer; a semiconductor layer that extends in the second direction and faces the first conductive layer, the second conductive layer, and the first insulating layer in a third direction; a first charge storage layer that is provided between the first conductive layer and the semiconductor layer; a second charge storage layer that is provided between the second conductive layer and the semiconductor layer; a first high dielectric constant layer that is provided between the first conductive layer and the first charge storage layer; and a second high dielectric constant layer provided between the second conductive layer and the second charge storage layer. At least a portion of the first charge storage layer faces the second charge storage layer without the second high dielectric constant layer being (Continued)

interposed between the portion of the first charge storage layer and the second charge storage layer in the second direction.

11 Claims, 48 Drawing Sheets

(51) Int. Cl.
*H10B 43/10* (2023.01)
*H10B 43/27* (2023.01)

(56) References Cited

U.S. PATENT DOCUMENTS

| | | | |
|---|---|---|---|
| 10,672,788 | B2 | 6/2020 | Maeda et al. |
| 10,763,272 | B2 | 9/2020 | Sakamoto et al. |
| 2015/0200199 | A1 | 7/2015 | Sakamoto et al. |
| 2015/0371709 | A1* | 12/2015 | Kai .................... H01L 29/7883 |
| | | | 365/185.17 |
| 2018/0006050 | A1 | 1/2018 | Watanabe et al. |
| 2020/0075615 | A1 | 3/2020 | Oga et al. |
| 2020/0091165 | A1 | 3/2020 | Yamashita et al. |
| 2020/0091178 | A1 | 3/2020 | Nakao et al. |
| 2020/0091181 | A1 | 3/2020 | Nagashima |
| 2020/0286902 | A1* | 9/2020 | Fukuda ............. H01L 29/40117 |
| 2022/0230876 | A1* | 7/2022 | Su .......................... H01L 28/90 |

FOREIGN PATENT DOCUMENTS

| | | |
|---|---|---|
| JP | 2019-169577 A | 10/2019 |
| JP | 2020-035977 A | 3/2020 |
| JP | 2020-047620 A | 3/2020 |
| JP | 2020-047744 A | 3/2020 |
| JP | 2020-145387 A | 9/2020 |
| TW | 201644038 A | 12/2016 |
| TW | 202013619 A | 4/2020 |

* cited by examiner

SEMICONDUCTOR STORAGE DEVICE

CROSS-REFERENCE TO RELATED APPLICATION

This application is based upon and claims the benefit of priority from Japanese Patent Application No. 2021-049805, filed Mar. 24, 2021, the entire contents of which are incorporated herein by reference.

FIELD

Embodiments described herein relate generally to a semiconductor storage device.

BACKGROUND

A semiconductor storage device including a substrate, a plurality of gate electrodes that are stacked in a direction intersecting the front surface of the substrate, a semiconductor layer that faces the plurality of gate electrodes, and a gate insulating layer provided between the gate electrode and the semiconductor layer is known. The gate insulating layer includes a memory unit that can store data such as an insulating charge storage unit such as silicon nitride ($Si_3N_4$) or a conductive charge storage unit such as a floating gate.

DETAILED DESCRIPTION

Figure 1:
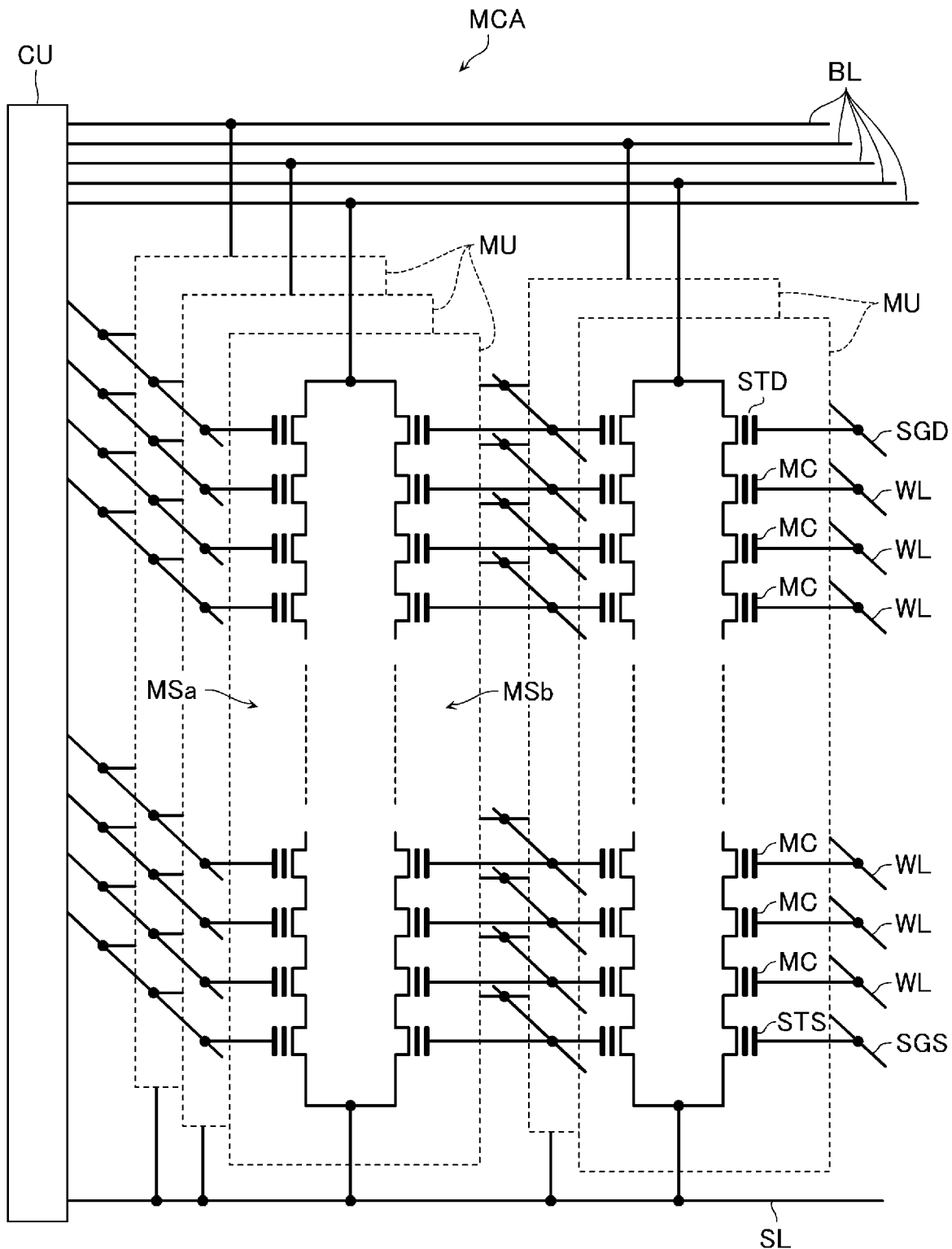
FIG. 1 is a schematic equivalent circuit diagram of a semiconductor storage device according to a first embodiment.

At least one embodiment provides a semiconductor storage device that can be highly integrated.

In general, according to at least one embodiment, a semiconductor storage device includes a first conductive layer that extends in a first direction; a second conductive layer that extends in the first direction and is arranged with the first conductive layer in a second direction intersecting the first direction; a first insulating layer that extends in the first direction and is provided between the first conductive layer and the second conductive layer in the second direction; a semiconductor layer that extends in the second direction and faces the first conductive layer, the second conductive layer, and the first insulating layer in a third direction intersecting the first direction and the second direction; a first charge storage layer that is provided between the first conductive layer and the semiconductor layer; a second charge storage layer that is provided between the second conductive layer and the semiconductor layer; a first high dielectric constant layer that is provided between the first conductive layer and the first charge storage layer; and a second high dielectric constant layer provided between the second conductive layer and the second charge storage layer. At least a portion of the first charge storage layer faces the second charge storage layer without the second high dielectric constant layer being interposed between the portion of the first charge storage layer and the second charge storage layer in the second direction.

Hereinafter, semiconductor storage devices according to embodiments will be described in detail with reference to the drawings. The following embodiments are merely examples, and are not intended to limit the present disclosure. In addition, the following drawings are schematic, and some configurations and the like may be omitted for convenience of explanation. In addition, parts common to the plurality of embodiments are denoted by the same reference numerals, and the description thereof may be omitted.

Further, when the term "semiconductor storage device" is used in the present specification, the term may mean a memory die, or a memory system including a control die such as a memory chip, a memory card, or a solid state drive (SSD). Further, it may mean a configuration including a host computer such as a smartphone, a tablet terminal, and a personal computer.

Further, in the present specification, when it is said that a first configuration is "electrically connected" to a second configuration, the first configuration may be directly connected to the second configuration, or the first configuration may be connected to the second configuration via wiring, a semiconductor member, a transistor, or the like. For example, when three transistors are connected in series, even if the second transistor is in the OFF state, the first transistor is "electrically connected" to the third transistor.

Further, in the present specification, when it is said that the first configuration is "connected between" the second configuration and the third configuration, the term may mean that the first configuration, the second configuration, and the third configuration are connected in series, and the second configuration is connected to the third configuration via the first configuration.

Further, in the present specification, a predetermined direction parallel to the upper surface of the substrate is referred to as an X direction, a direction parallel to the upper surface of the substrate and perpendicular to the X direction is referred to as a Y direction, and a direction perpendicular to the upper surface of the substrate is referred to as a Z direction.

Further, in the present specification, a direction along the predetermined surface is referred to as a first direction, a direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction.

Further, in the present specification, terms such as "upper" and "lower" are based on the substrate. For example, a direction away from the substrate along the Z direction is referred to as upward, and a direction approaching the substrate along the Z direction is referred to as downward. Further, a lower surface or a lower end of a certain configuration means a surface or an end portion on the substrate side of the configuration, and an upper surface or an upper end means a surface or an end portion on the opposite side of the substrate of the configuration. Further, a surface intersecting the X direction or the Y direction is referred to as a side surface or the like.

First Embodiment

[Configuration] FIG. 1 is a schematic equivalent circuit diagram of a semiconductor storage device according to a first embodiment.

The semiconductor storage device according to the present embodiment includes a memory cell array MCA and a control unit CU controls the memory cell array MCA.

The memory cell array MCA includes a plurality of the memory units MU. Each of the plurality of memory units MU includes two electrically independent memory strings MSa and MSb. One ends of the memory strings MSa and MSb are connected respectively to drain-side select transistors STD, and are connected to a common bit line BL, via the drain-side select transistors STD. The other ends of the memory strings MSa and MSb are connected respectively to source-side select transistors STS, and are connected to a common source line SL, via the source-side select transistors STS.

Each of the memory strings MSa and MSb includes the plurality of memory cells MC connected in series. The memory cell MC is a field effect-type transistor including a semiconductor layer, a gate insulating layer, and a gate electrode. The semiconductor layer functions as a channel region. The gate insulating layer includes a charge storage unit that can store data. The threshold voltage of the memory cell MC changes according to a charge amount in the charge storage unit. The gate electrode is a portion of a word line WL.

The select transistor (STD or STS) is a field effect-type transistor including a semiconductor layer, a gate insulating layer, and a gate electrode. The semiconductor layer functions as a channel region. The gate electrode of the drain-side select transistor STD is a portion of a drain-side select gate line SGD. The gate electrode of the source-side select transistor STS is a portion of a source-side select gate line SGS.

The control unit CU generates a voltage required, for example, for a read operation, a write operation, and an erase operation, and supplies the voltage to the bit line BL, the source line SL, the word line WL, and the select gate line (SGD or SGS). The control unit CU may include, for example, a plurality of transistors and wirings provided on the same substrate as the memory cell array MCA, and may include a plurality of transistors and wirings provided on different substrates from the memory cell array MCA.

Figure 2:
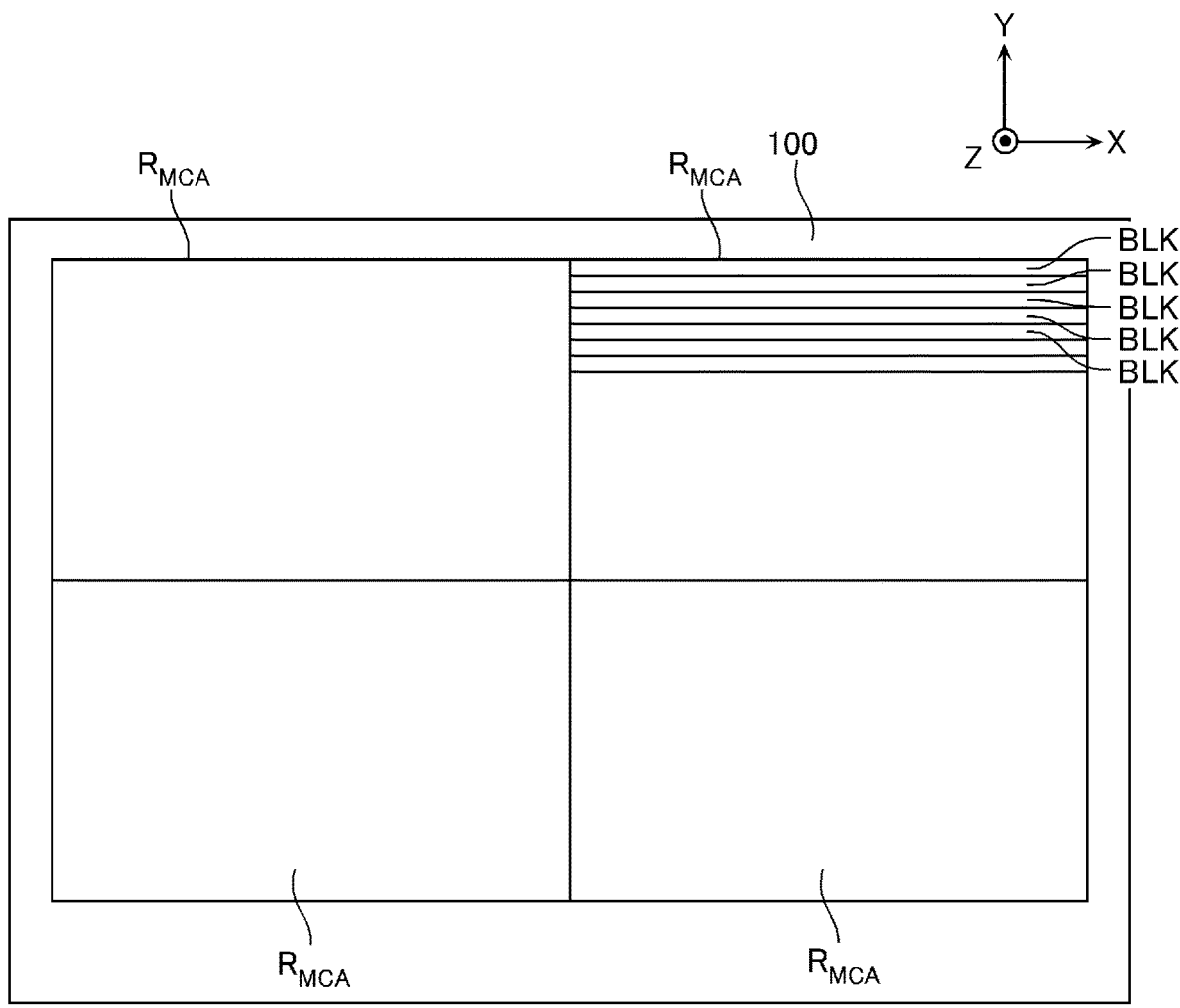
FIG. 2 is a schematic plan view of the semiconductor storage device.

FIG. 2 is a schematic plan view illustrating a configuration example of the semiconductor storage device according to at least one embodiment.

The semiconductor storage device according to at least one embodiment includes a semiconductor substrate 100. In the illustrated example, four memory cell array regions $R_{MCA}$ arranged in the X direction and the Y direction are provided on the semiconductor substrate 100. In each of the memory cell array regions $R_{MCA}$, a plurality of memory blocks BLK arranged in the Y direction are provided. Each of the memory blocks BLK extends in the X direction.

Figure 3:
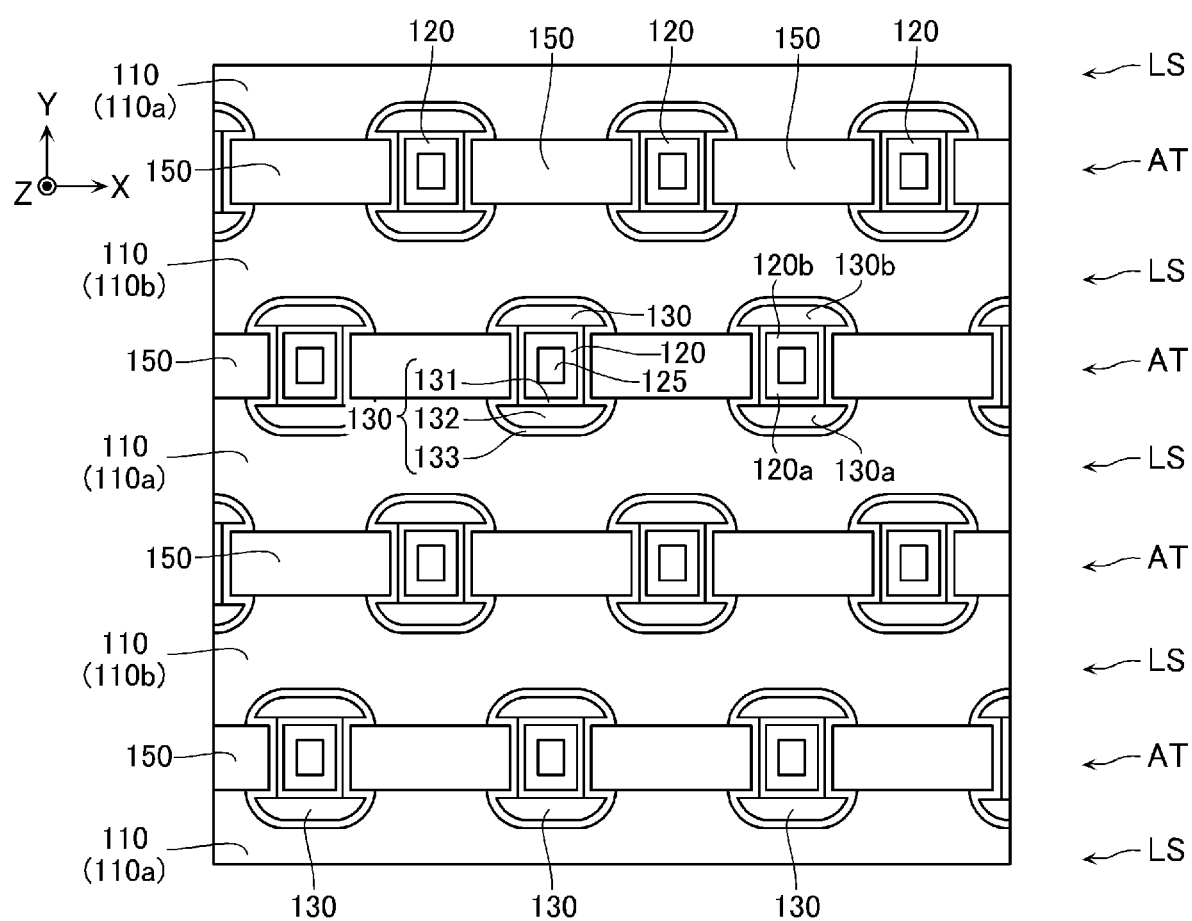
FIG. 3 is a schematic cross-sectional view of the semiconductor storage device.
Figure 4:
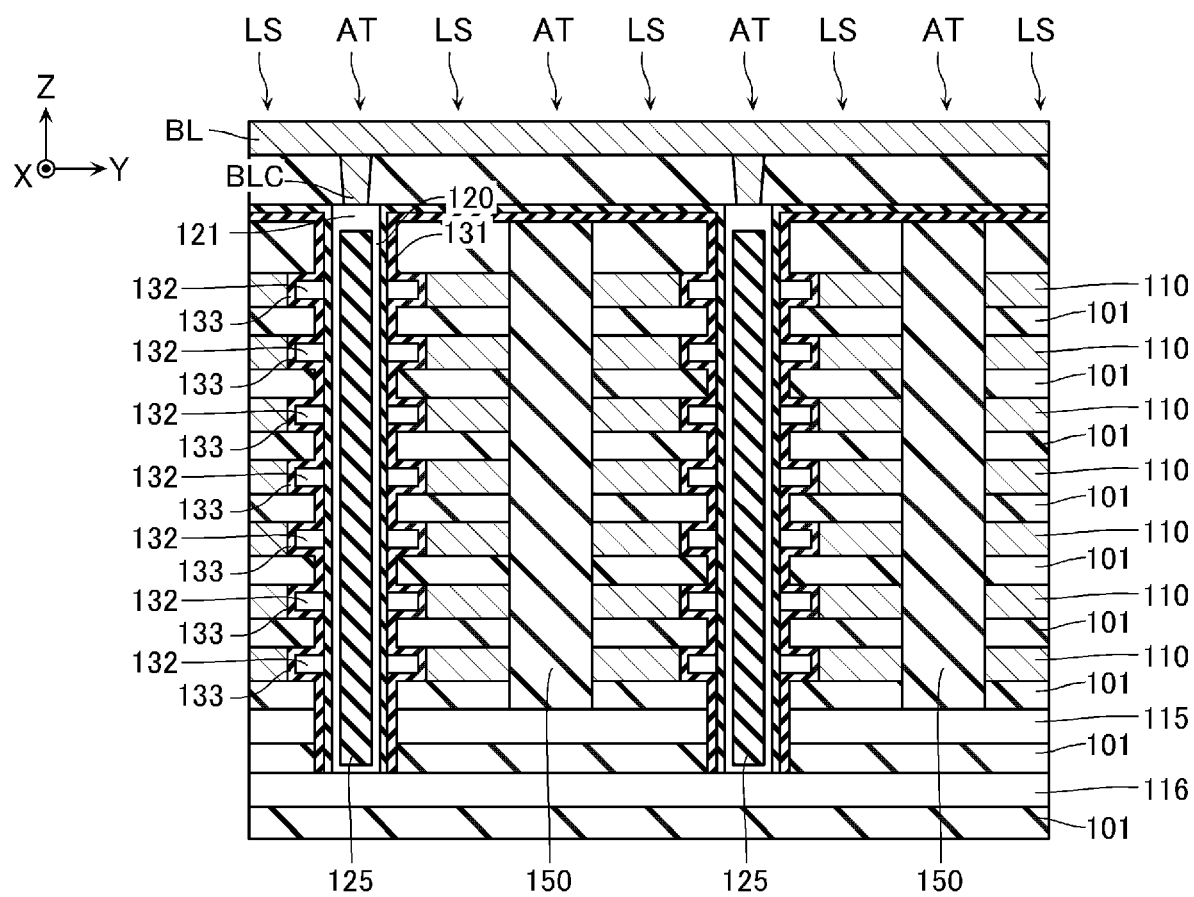
FIG. 4 is a schematic cross-sectional view of the semiconductor storage device.
Figure 5:
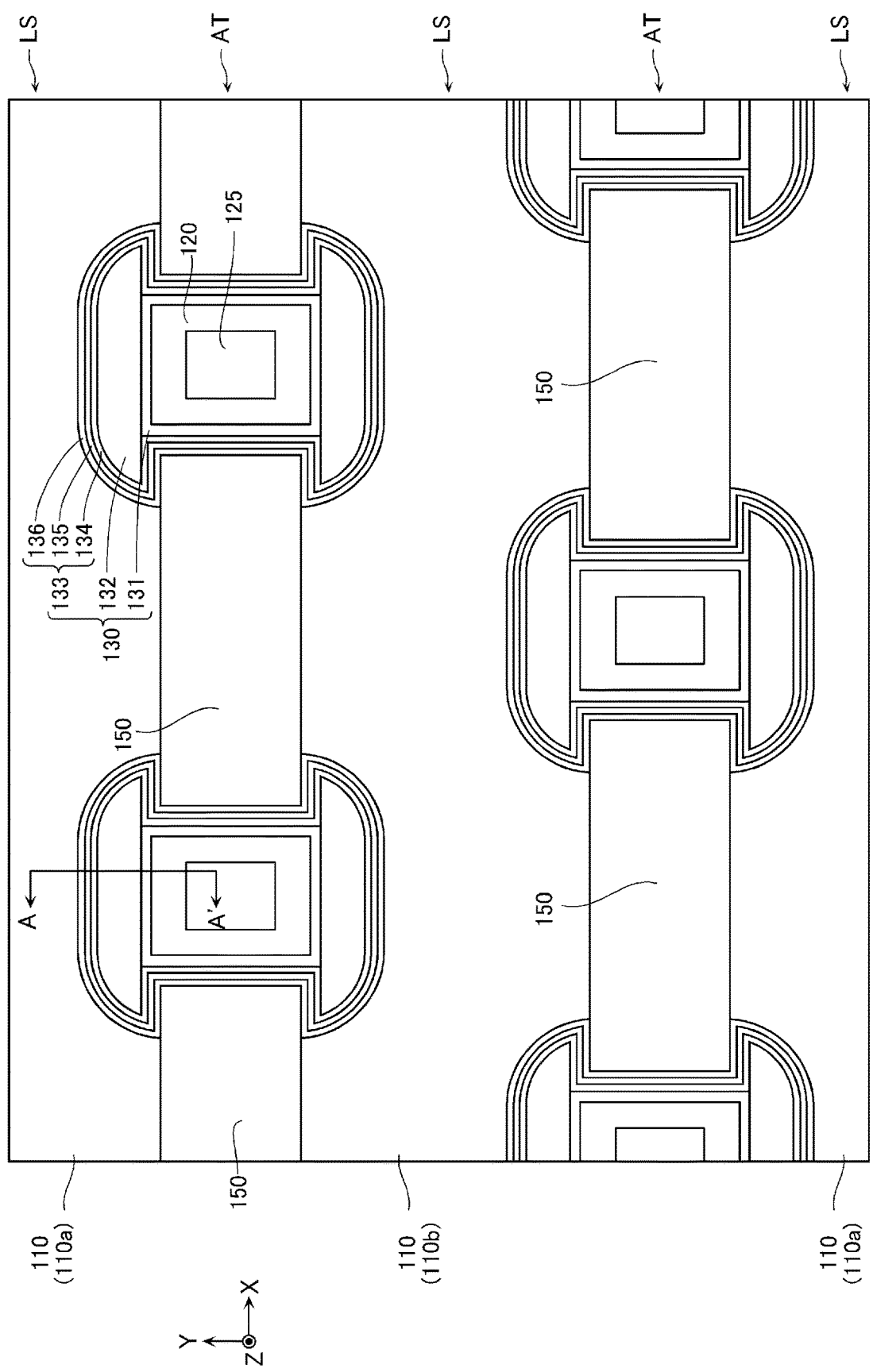
FIG. 5 is a schematic cross-sectional view of the semiconductor storage device.
Figure 6:
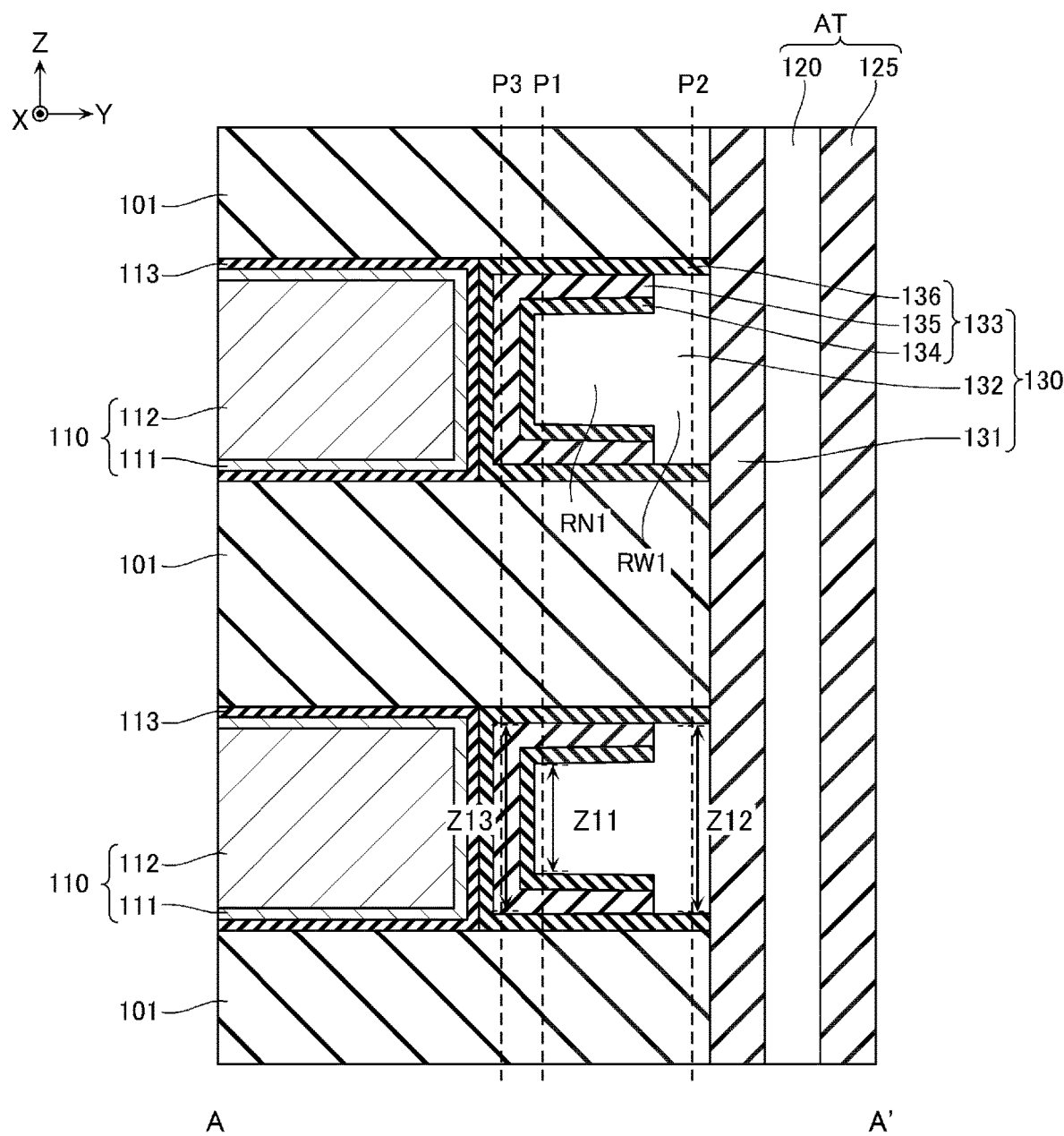
FIG. 6 is a schematic cross-sectional view of the semiconductor storage device.

FIG. 3 is a schematic XY cross-sectional view illustrating a configuration of a portion of the memory cell array regions $R_{MCA}$. FIG. 4 is a schematic YZ cross-sectional view illustrating a configuration of a portion of the memory cell array regions $R_{MCA}$. FIG. 5 is a schematic enlarged diagram illustrating a configuration of a portion of FIG. 3. FIG. 6 is a schematic cross-sectional view of the configuration illustrated in FIG. 5 taken along the line A-A' and viewed in the direction of the arrow.

The semiconductor storage device according to at least one embodiment includes, for example, a plurality of stacked body structures LS and a plurality of trench structures AT in the same manner as in FIGS. 3 and 4. The plurality of stacked body structures LS are arranged in the Y direction on the semiconductor substrate 100. The plurality of trench structures AT are provided between the plurality of stacked body structures LS, respectively.

The stacked body structure LS includes a plurality of conductive layers 110, a semiconductor layer 115, and a semiconductor layer 116. The plurality of conductive layers 110, the semiconductor layer 115, and the semiconductor layer 116 are stacked in the Z direction via insulating layers 101 of silicon oxide ($SiO_2$) or the like, respectively.

The trench structure AT includes a plurality of semiconductor layers 120. The plurality of semiconductor layers 120 extend in the Z direction, and arranged in the X direction via insulating layers 150 of silicon oxide ($SiO_2$) or the like. Gate insulating layers 130 are provided between the conductive layers 110 and the semiconductor layers 120, respectively.

The semiconductor substrate 100 (FIG. 2) is a semiconductor substrate of, for example, single crystal silicon (Si). For example, the semiconductor substrate 100 includes an n-type impurity layer on the upper surface of the semiconductor substrate, and further includes a double-well structure with a p-type impurity layer in an n-type impurity layer. Further, on the front surface of the semiconductor substrate 100, for example, transistors, wirings, and the like that configure at least a portion of the control unit CU (FIG. 1) may be provided.

The conductive layers 110 (FIG. 4) extend in the X direction. The conductive layer 110 is, for example, a stacked film including a barrier conductive layer 111 of titanium nitride (TiN) or the like and a metal film 112 of tungsten (W) or the like, in the same manner as in FIG. 6. The conductive layers 110 function as the word lines WL, and gate electrodes of the memory cells MC (FIG. 1), respectively. A portion of the conductive layers 110 which are provided in the upper portion functions as the drain-side select gate lines SGD and gate electrodes of the drain-side select transistors STD (FIG. 1). Further, in the same manner as in FIG. 6, insulating metal oxide layers 113 of alumina (AlO) or the like may be provided so that a portion of the upper surfaces, the lower surfaces, and the side surfaces of the conductive layers 110 is covered.

The semiconductor layer 115 (FIG. 4) extends in the X direction. The semiconductor layer 115 is a semiconductor layer, for example, including polycrystalline silicon (Si) or the like. The semiconductor layer 115 functions as the source-side select gate lines SGS, and gate electrodes of the source-side select transistors STS (FIG. 1).

The semiconductor layer 116 extends in the X direction. The semiconductor layer 116 is a semiconductor layer, for example, including polycrystalline silicon (Si) or the like. The semiconductor layer 116 functions as a portion of the source line SL.

In the following description, in view of two of the stacked body structures LS adjacent to each other in the Y direction, the plurality of conductive layers 110 in one stacked body structure LS may be referred to as conductive layers 110a (FIG. 3). Meanwhile, the plurality of conductive layers 110 in the other stacked body structure LS may be referred to as conductive layers 110b (FIG. 3). The conductive layers 110a and the conductive layers 110b are electrically independent from each other. Accordingly, different voltages can be supplied to the conductive layers 110a and the conductive layers 110b. The conductive layer 110a functions as a gate electrode of the memory cell MC in a memory string MSa or a gate electrode of the drain-side select transistor STD in the memory string MSa. The conductive layer 110b functions as a gate electrode of the memory cell MC in a memory string MSb and a gate electrode of the drain-side select transistor STD in the memory string MSb.

The semiconductor layer 120 is a semiconductor layer, for example, such as undoped polycrystalline silicon (Si). The semiconductor layer 120 has a substantially bottomed square tubular shape and is provided with an insulating layer 125 of silicon oxide ($SiO_2$) or the like in a central portion thereof. Further, in the following description, among the semiconductor layers 120, regions facing the plurality of conductive layers 110a may be referred to as first regions 120a (FIG. 3), and regions facing the plurality of conductive layers 110b may be referred to as second regions 120b (FIG. 3). The first regions 120a function as channel regions of the plurality of memory cells MC in the memory string MSa (FIG. 1) and channel regions of the drain-side select transistors STD and the source-side select transistors STS. The second regions 120b function as channel regions of the plurality of memory cells MC in the memory string MSb (FIG. 1) and channel regions of the drain-side select transistors STD and the source-side select transistors STS.

For example, as illustrated in FIG. 4, impurity regions 121 including n-type impurities such as phosphorus (P) are provided on the upper ends of the semiconductor layers 120. The impurity regions 121 are connected to the bit lines BL extending in the Y direction via the bit line contacts BLC of tungsten (W) or the like.

In the illustrated example, the lower ends of the semiconductor layers 120 are connected to the semiconductor layer 116. In such a case, the semiconductor layer 116 functions as a portion of the source line SL (FIG. 1). The semiconductor layers 120 are electrically connected to the control unit CU via the semiconductor layer 116. However, such a configuration is merely an example, and specific configurations can be appropriately adjusted. For example, the lower ends of the semiconductor layers 120 may be connected to wirings, semiconductor layers, and the like other than the semiconductor layer 116.

The gate insulating layer 130 includes a tunnel insulating layer 131, a charge storage layer 132, and a block insulating layer 133 provided from the semiconductor layer 120 side to the conductive layer 110 side.

The tunnel insulating layer 131 includes, for example, silicon oxide ($SiO_2$), silicon oxynitride (SiON), or the other insulating layers. For example, as illustrated in FIG. 4, the tunnel insulating layers 131 may extend in the Z direction along the outer peripheral surfaces of the semiconductor layers 120. Further, the tunnel insulating layers 131 may be formed on the side surfaces of the charge storage layers 132 in the Y direction, respectively.

The charge storage layers 132 are floating gates of polycrystalline silicon or the like, for example, that include n-type impurities such as phosphorus (P) or p-type impurities such as boron (B). However, the charge storage layer 132 may be insulating charge storage units including silicon nitride (SiN) or the like.

As illustrated in FIG. 6, the charge storage layer 132 includes a narrow portion RN1 and a wide portion RW1 in the YZ cross section. The wide portion RW1 is provided at a position closer to the semiconductor layer 120 than the narrow portion RN1. The narrow portion RN1 includes a facing surface that faces the conductive layer 110. The wide portion RW1 includes a facing surface that faces the semiconductor layer 120. As illustrated in FIG. 6, positions provided between the two facing surfaces in the Y direction are illustrated as a first position P1 and a second position P2. The first position P1 includes a portion of the narrow portion RN1. The second position P2 includes a portion of the wide portion RW1. In addition, the width of the narrow portion RN1 at the first position P1 in the Z direction is illustrated as a first width Z11. In addition, the width of the wide portion RW1 at the second position P2 in the Z direction is illustrated as a second width Z12. The first width Z11 is smaller than the second width Z12. That is, in the cross section illustrated in FIG. 6, the area of the wide portion RW1 facing the semiconductor layer 120 is larger than the area of the narrow portion RN1 facing the semiconductor layer 120.

For example, as illustrated in FIGS. 5 and 6, the block insulating layer 133 includes an insulating layer 134, a high dielectric constant layer 135, and an insulating layer 136.

For example, the insulating layer 134 is a stacked film including silicon oxide ($SiO_2$) or the like, or titanium nitride (TiN) and silicon oxide ($SiO_2$). As illustrated in FIG. 5, the insulating layer 134 covers a portion of the outer peripheral surface of the charge storage layer 132 in the XY cross section. In addition, as illustrated in FIG. 6, the upper surface and the lower surface of the narrow portion RN1 in the YZ cross section and the side surface of the narrow portion RN1 on the conductive layer 110 side are covered with the insulating layer 134. The end surface of the insulating layer 134 on the semiconductor layer 120 side in the Y direction is in contact with the wide portion RW1.

The high dielectric constant layer 135 includes an insulation material, for example, with a relatively high relative dielectric constant described below. As illustrated in FIG. 5, the high dielectric constant layer 135 covers a portion of the outer peripheral surface of the charge storage layer 132 via the insulating layer 134, in the XY cross section. In addition, as illustrated in FIG. 6, in the YZ cross section, the upper surface and the lower surface of the insulating layer 134 and the side surface of the insulating layer 134 on the conductive layers 110 side are covered with the high dielectric constant layer 135. The end surface of the high dielectric constant layer 135 on the semiconductor layer 120 side in the Y direction is in contact with the wide portion RW1. That is, the end surfaces of the high dielectric constant layer 135 and the insulating layer 134 on the semiconductor layer 120 side in the Y direction are provided at positions to the same extents in the Y direction. In addition, FIG. 6 illustrates a position including a portion of the high dielectric constant layer 135 in the Y direction as a third position P3. In addition, the width of the high dielectric constant layer 135 in the Z direction at the third position P3 is illustrated as a third width Z13. The second width Z12 is the third width Z13 or wider.

For example, the material of the high dielectric constant layer 135 preferably includes hafnium silicate (HfSiO), hafnium oxide (HfO), zirconium oxide (ZrO), yttrium oxide (YO), lanthanum oxide (LaO), and aluminum oxide (AlO). In addition, the high dielectric constant layer 135 may include at least one element selected from the group consisting of carbon (C), nitrogen (N), fluorine (F), aluminum (Al), chlorine (Cl), and silicon (Si). In addition, the high dielectric constant layer 135 may be configured with a material other than the materials described above. In this case, the relative dielectric constant of the material in the high dielectric constant layer 135 is preferably higher than the relative dielectric constant of silicon nitride (SiN).

For example, the insulating layer 136 includes an insulating layer such as silicon oxide ($SiO_2$). As illustrated in FIG. 5, in the XY cross section, the insulating layer 136 covers a portion of the outer peripheral surface of the charge storage layer 132 via the high dielectric constant layer 135. As illustrated in FIG. 6, in the YZ cross section, the high dielectric constant layer 135, the upper surface and the lower surface of the wide portion RW1, and the side surface of the high dielectric constant layer 135 on the conductive layer 110 side are covered with the insulating layer 136. The insulating layer 136 and the wide portion RW1 may be in direct contact with each other in the Z direction.

In addition, as illustrated in FIG. 6, in view of two of the charge storage layers 132 adjacent to each other in the Z direction, the wide portion RW1 of one charge storage layer 132 and the wide portion RW1 of the other charge storage layer 132 face each other without any one of the high dielectric constant layer 135 arranged in the Z direction interposed therebetween. That is, the high dielectric constant layer 135 is not provided between the wide portions RW1 of the two charge storage layers 132.

[Manufacturing Method]

Subsequently, with reference to FIGS. 7 to 33, a method of manufacturing the semiconductor storage device according to the present embodiment is described. FIGS. 7, 9, 11, 13, 15, 17, 19, 21, and 23 are schematic XY cross-sectional views illustrating the manufacturing method, and correspond to portions illustrated in FIG. 3. FIGS. 8, 10, 12, 14, 16, 18, 20, 22, and 24 are schematic YZ cross-sectional views illustrating the manufacturing method, and correspond to portions illustrated in FIG. 4. FIGS. 25 to 33 are schematic cross-sectional views illustrating the manufacturing method, and correspond to portions illustrated in FIG. 6.

Figure 7:
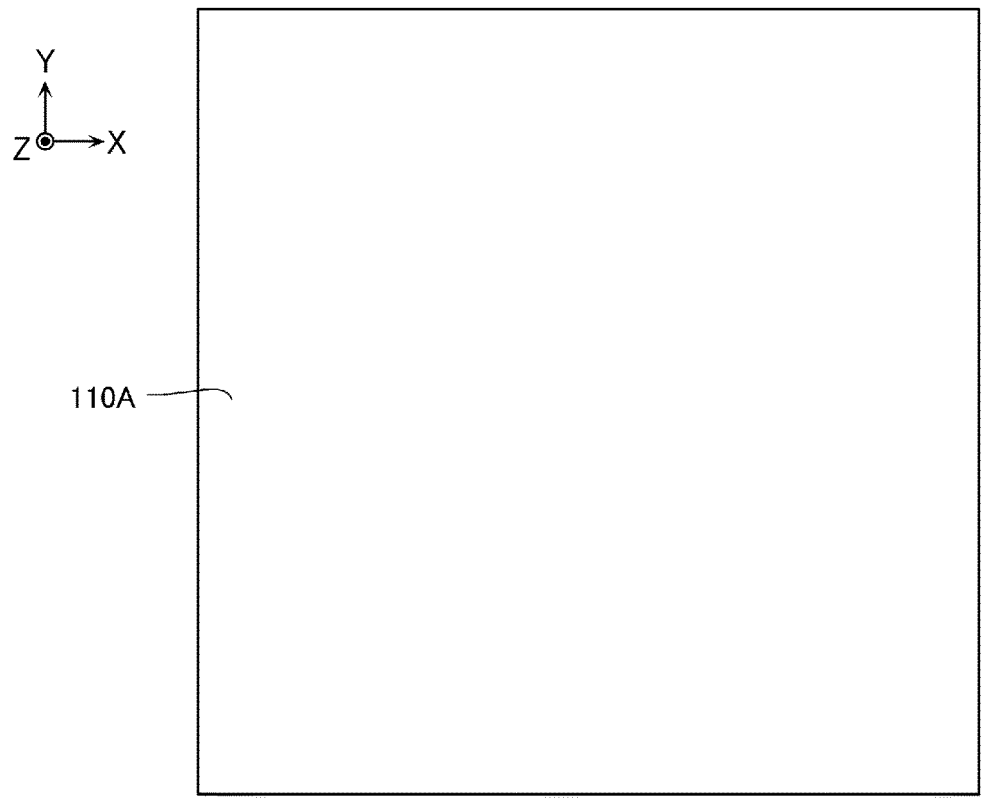
FIG. 7 is a schematic cross-sectional view illustrating a method of manufacturing the semiconductor storage device.
Figure 8:
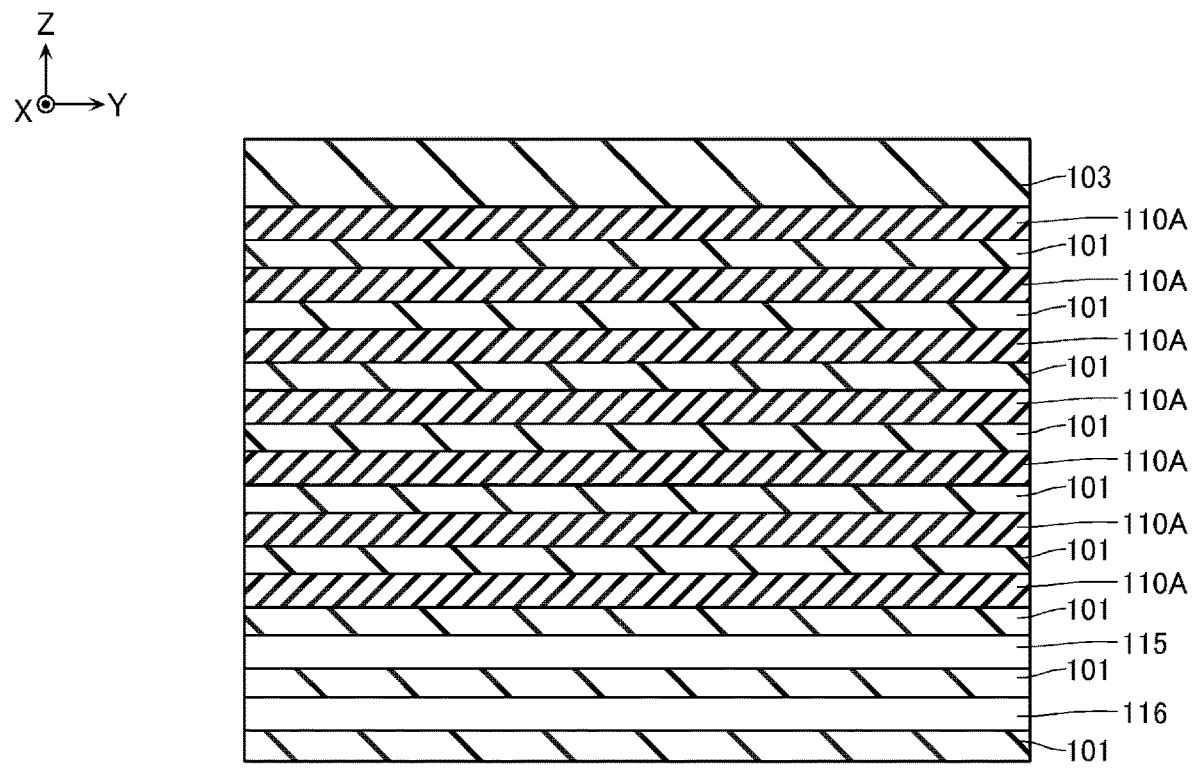
FIG. 8 is a schematic cross-sectional view illustrating the manufacturing method.

As illustrated in FIGS. 7 and 8, in the manufacturing method, the plurality of insulating layers 101, the semiconductor layer 116, the semiconductor layer 115, and sacrifice layers 110A are alternately stacked on the semiconductor substrate 100 (not illustrated). An insulating layer 103 is formed thereon. The sacrifice layer 110A is, for example, made of silicon nitride (SiN). The insulating layer 103 is, for example, made of silicon oxide ($SiO_2$). The process is performed, for example, by a method such as chemical vapor deposition (CVD).

Figure 9:
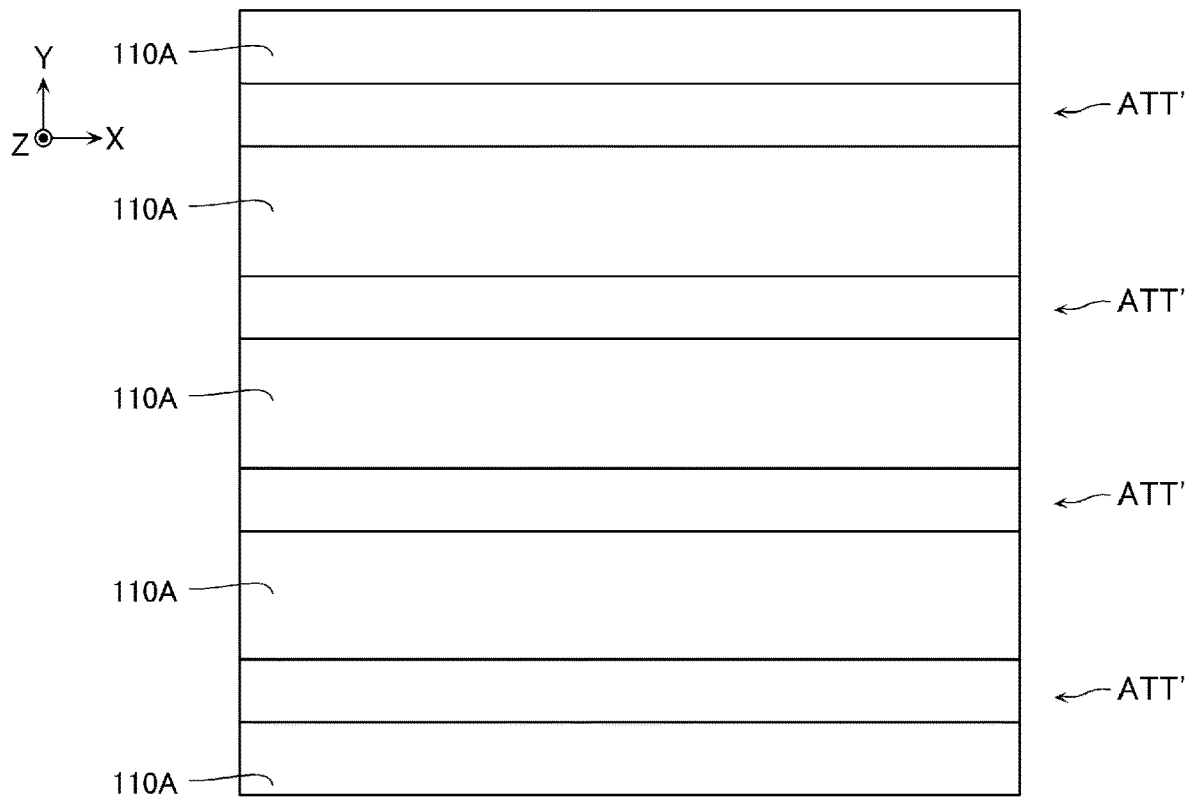
FIG. 9 is a schematic cross-sectional view illustrating the manufacturing method.
Figure 10:
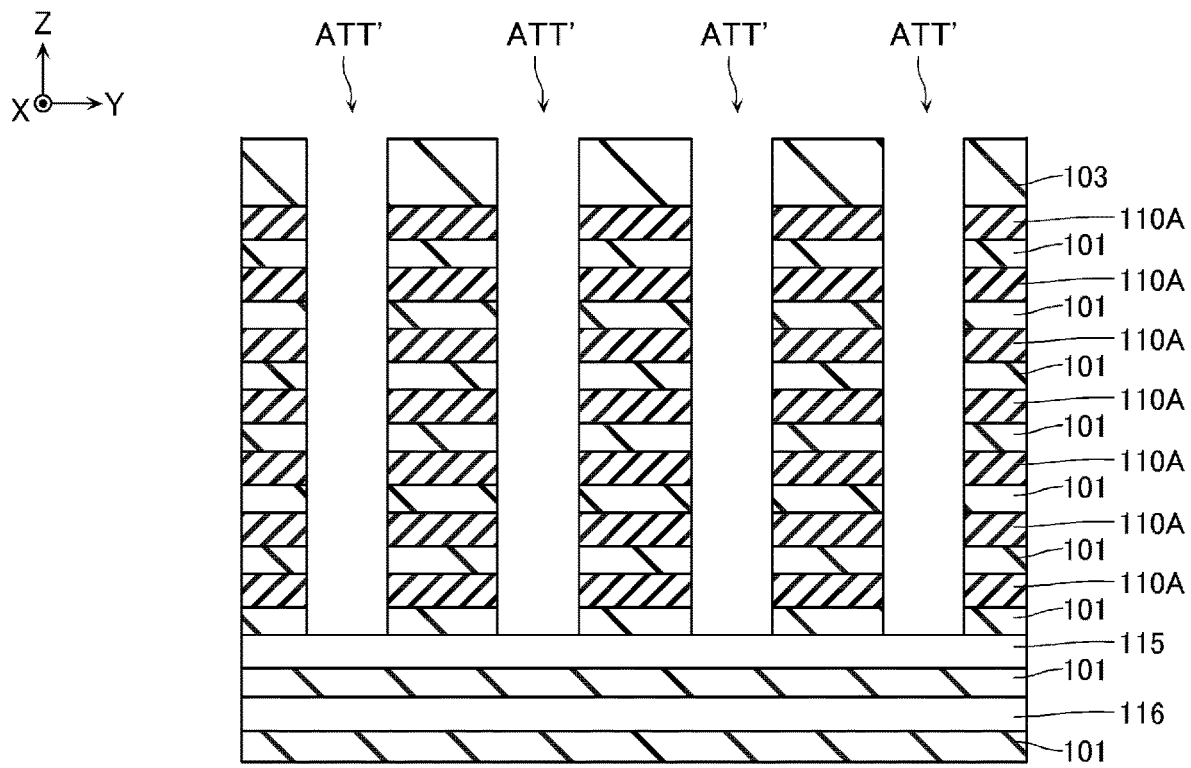
FIG. 10 is a schematic cross-sectional view illustrating the manufacturing method.

Subsequently, as illustrated in FIGS. 9 and 10, trenches ATT' are formed in the stacked structure including the insulating layers 103, the insulating layers 101, and the sacrifice layers 110A. In the process, for example, insulating layers with openings in portions corresponding to the trenches ATT' are formed on the upper surface of the structure illustrated in FIG. 8, and reactive ion etching (RIE) or the like is performed using these as masks. As illustrated in FIG. 9, the trenches ATT' extend in the X direction. In addition, as illustrated in FIG. 10, the trenches ATT' extend in the Z direction and penetrate the insulating layers 103, the plurality of insulating layers 101, and the plurality of sacrifice layers 110A to divide these configurations in the Y direction.

Figure 11:
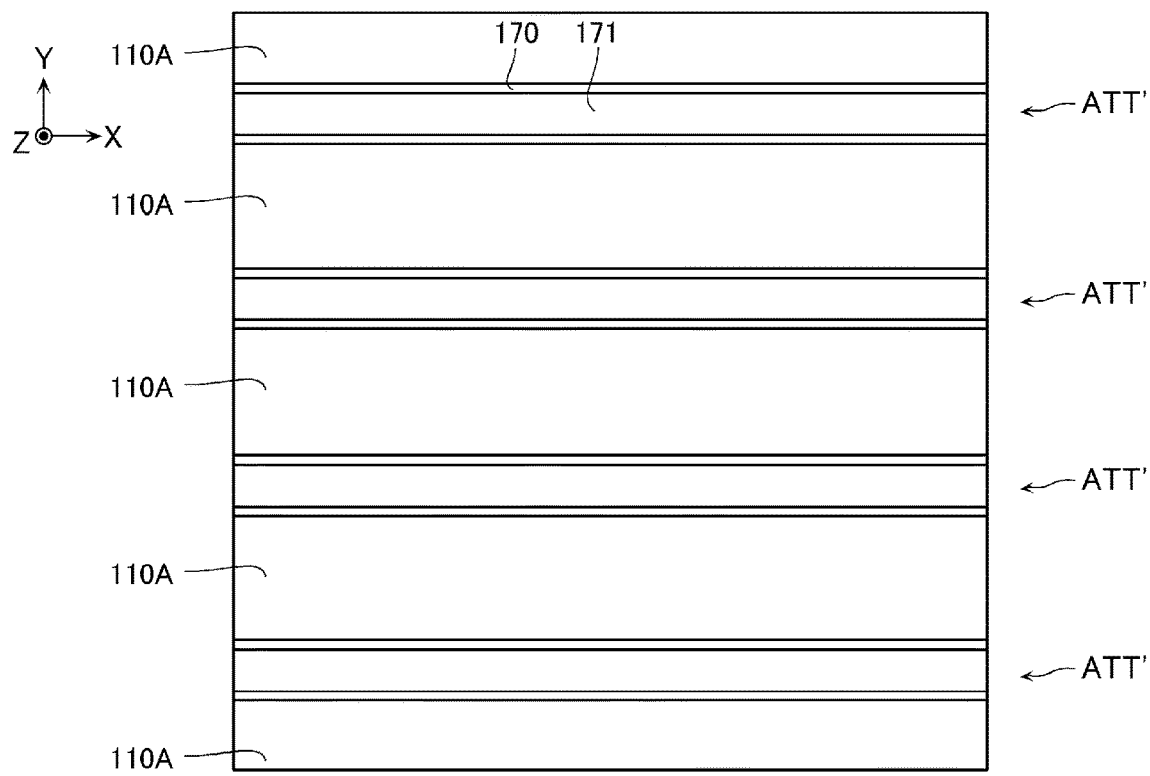
FIG. 11 is a schematic cross-sectional view illustrating the manufacturing method.
Figure 12:
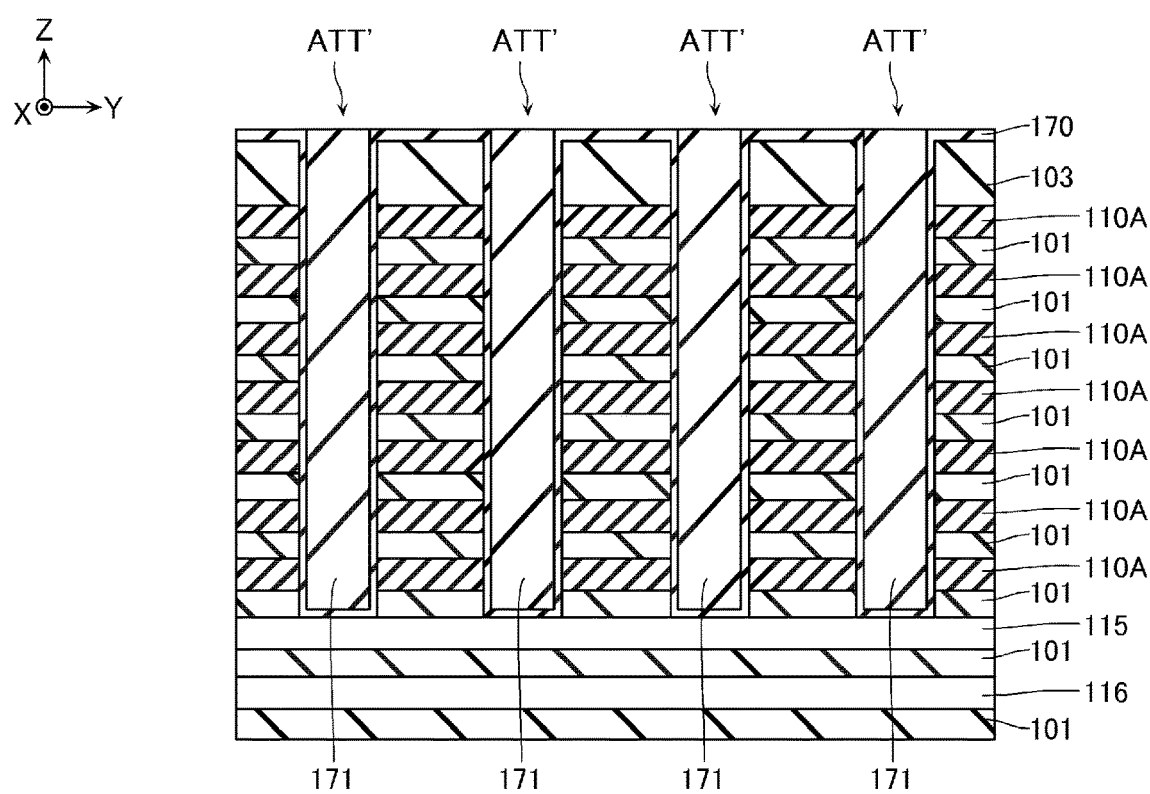
FIG. 12 is a schematic cross-sectional view illustrating the manufacturing method.

Subsequently, as illustrated in FIGS. 11 and 12, insulating layers 170 are formed on the upper surface of the insulating layers 103, and the bottom surface and the side surface of the trenches ATT'. The insulating layer 170 is, for example, made of silicon oxide ($SiO_2$). The process is performed, for example, by a method such as CVD. Carbon films 171 in which the trenches ATT' are embedded are formed on the upper surfaces of the insulating layers 170. The carbon films 171 are formed, for example, by spin coating of a coating type carbon material. Further, the upper portion of the carbon films 171 are removed to the same positions as the upper surfaces of the insulating layers 170. The carbon films 171 are removed, for example, by RIE.

Figure 13:
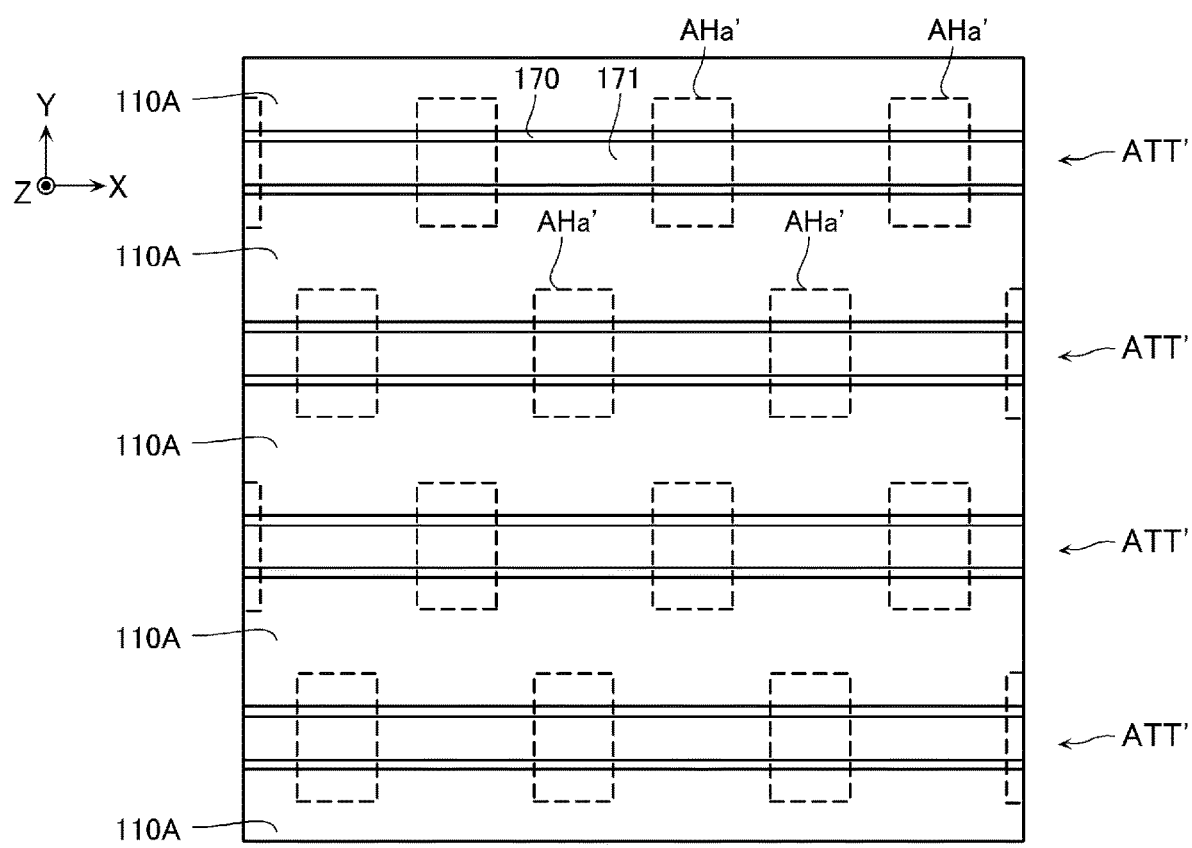
FIG. 13 is a schematic cross-sectional view illustrating the manufacturing method.
Figure 14:
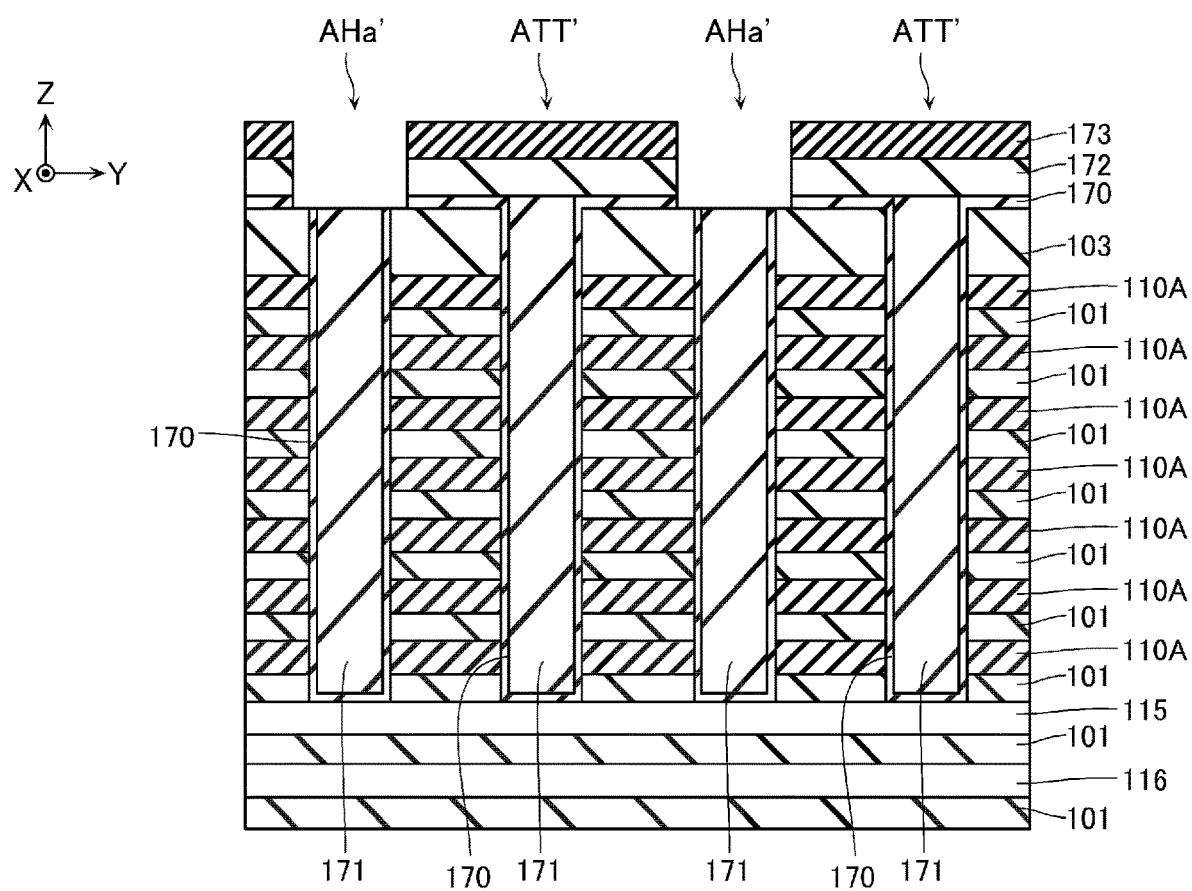
FIG. 14 is a schematic cross-sectional view illustrating the manufacturing method.

Subsequently, as illustrated in FIGS. 13 and 14, hard masks 172 and resists 173 are formed on the upper surface in the structure illustrated in FIG. 12. The hard mask 172 is, for example, made of silicon oxide ($SiO_2$). The hard mask 172 is formed, for example, by CVD. The resist 173 is formed, for example, by spin coating with a resist material. By using the resists 173 as masks, openings AHa' are formed. The openings AHa' penetrate the hard masks 172 and the insulating layers 170 and expose the carbon films 171. The openings AHa' are formed, for example, by a method such as photolithography and RIE.

Figure 15:
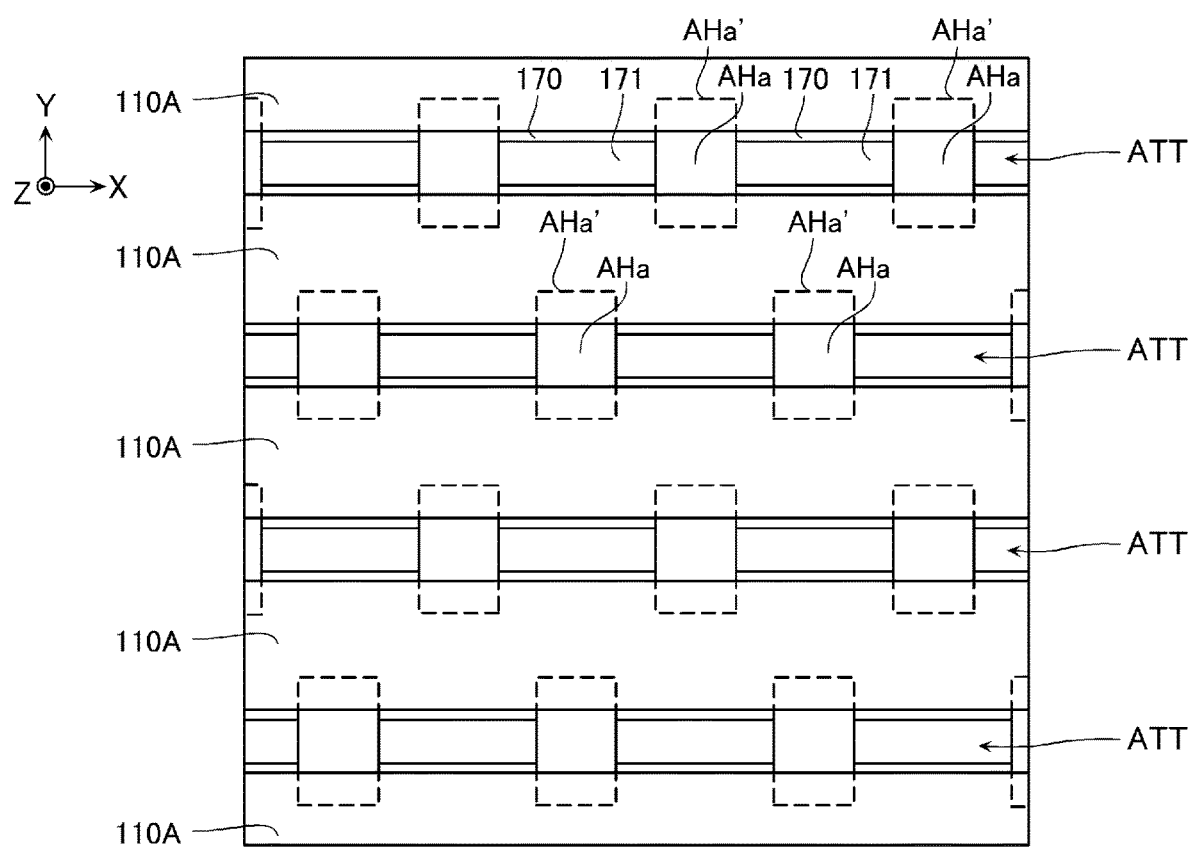
FIG. 15 is a schematic cross-sectional view illustrating the manufacturing method.
Figure 16:
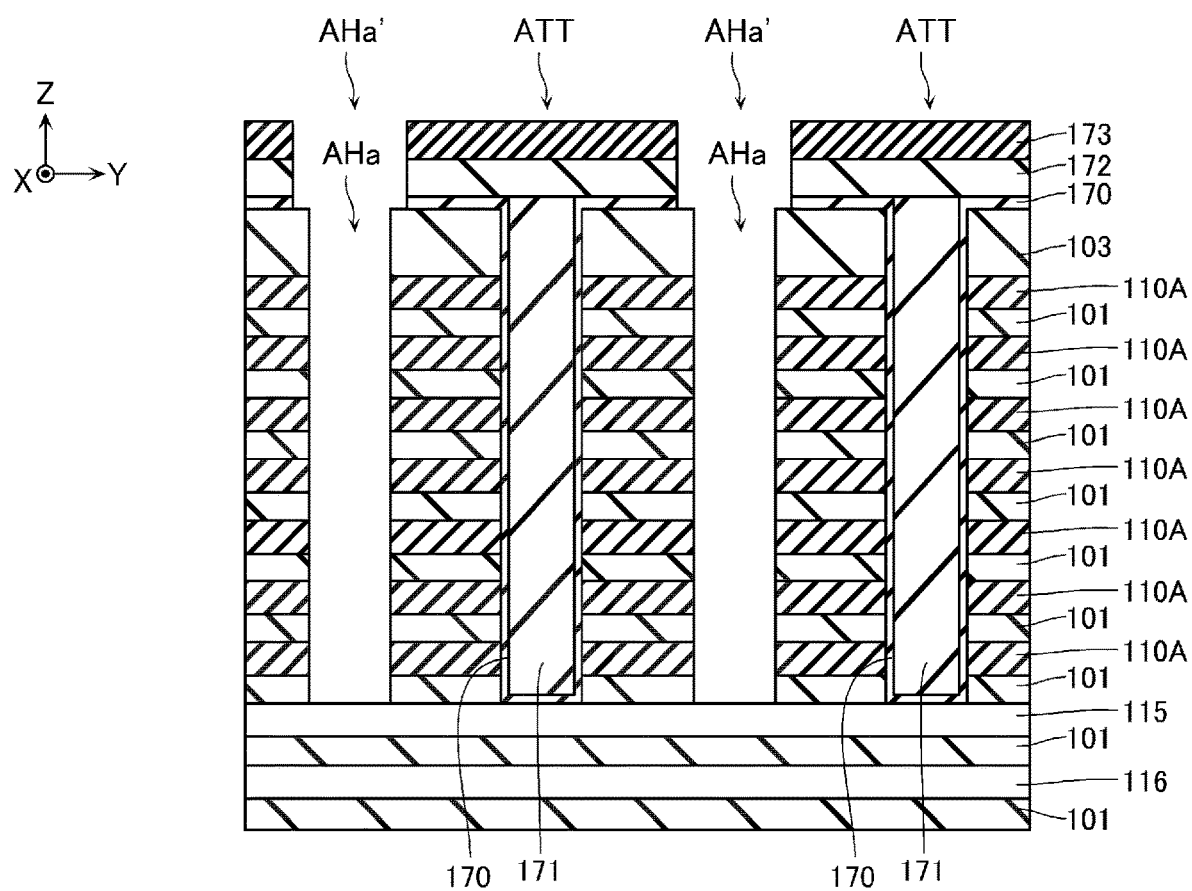
FIG. 16 is a schematic cross-sectional view illustrating the manufacturing method.

Subsequently, as illustrated in FIGS. 15 and 16, portions of the carbon films 171 and the insulating layers 170 which are provided at positions corresponding to the openings AHa' are removed to form openings AHa. The process of removing the carbon films 171 is performed, for example, by ashing. The process of removing the insulating layers 170 is performed, for example, by chemical dry etching. In the following, a plurality of portions of the trenches ATT' divided by the plurality of openings AHa arranged in the X direction are referred to as trenches ATT, respectively.

Figure 17:
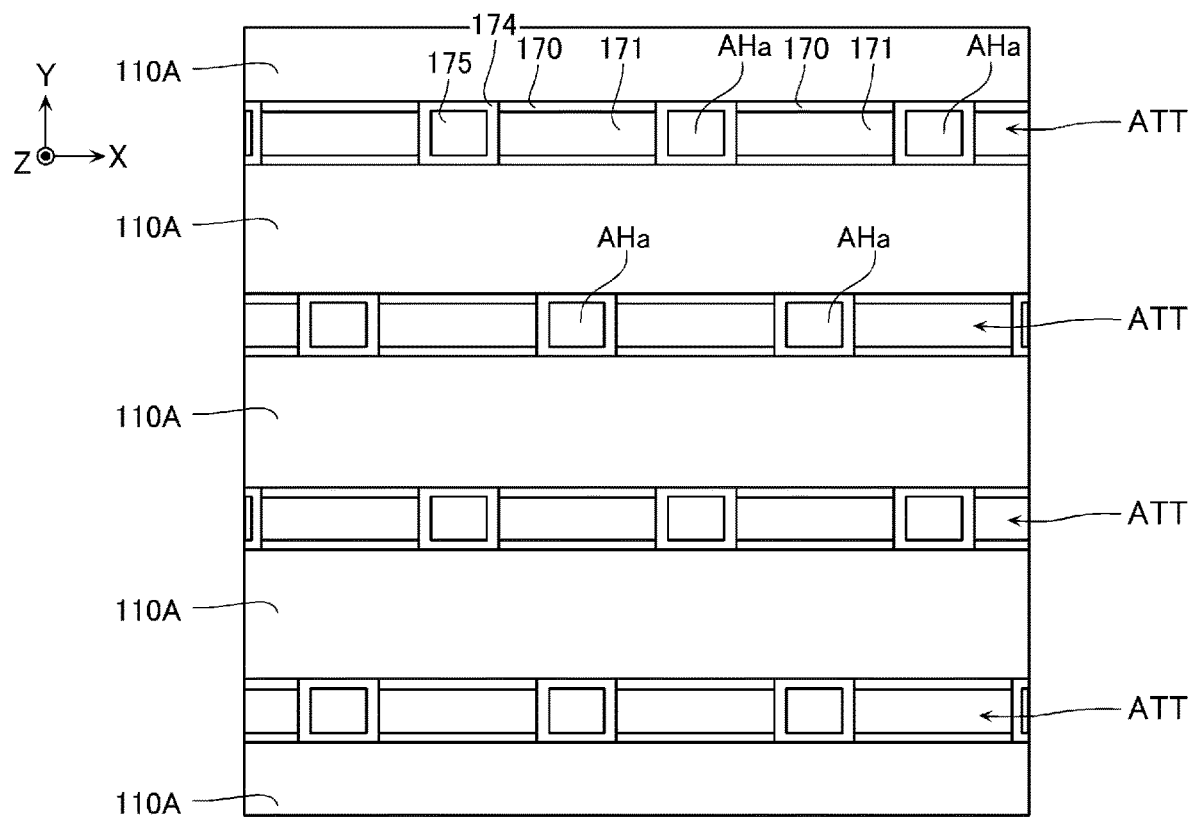
FIG. 17 is a schematic cross-sectional view illustrating the manufacturing method.
Figure 18:
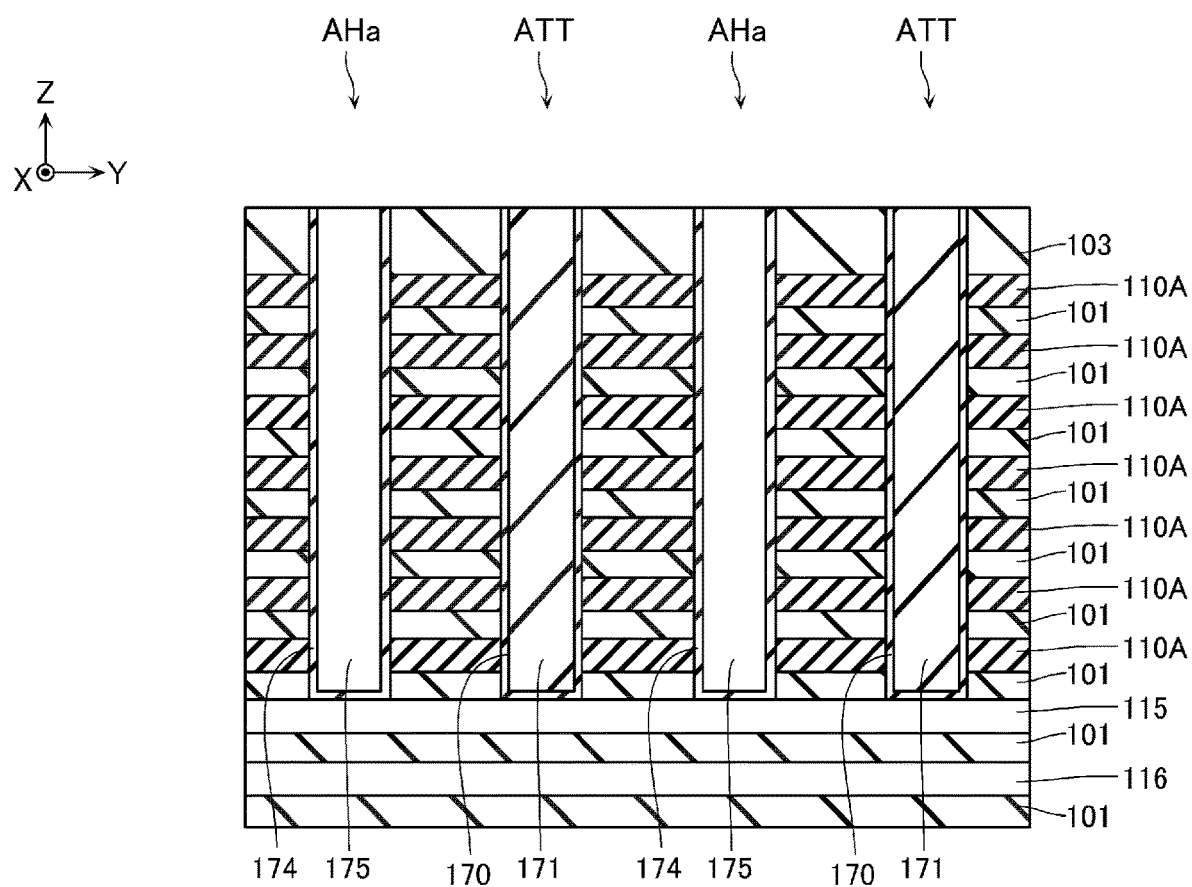
FIG. 18 is a schematic cross-sectional view illustrating the manufacturing method.

Subsequently, as illustrated in FIGS. 17 and 18, the resists 173, the hard masks 172, and the insulating layers 170 are removed from the upper surface of the structure illustrated in FIG. 16. The process is performed, for example, by ashing or RIE.

In addition, insulating layers 174 of silicon oxide ($SiO_2$) or the like are formed on the bottom surfaces and the side surfaces of the openings AHa. In addition, semiconductor layers 175 of amorphous silicon (Si) or the like in which the openings AHa are embedded are formed on the upper surfaces of the insulating layers 174. The insulating layers 174 and the semiconductor layers 175 are formed, for example, by a method such as CVD. In addition, the upper portions of the insulating layers 174 and the semiconductor layers 175 are removed to the same positions as the upper surfaces of the insulating layers 103. The insulating layers 174 and the semiconductor layers 175 are removed, for example, by RIE.

Figure 19:
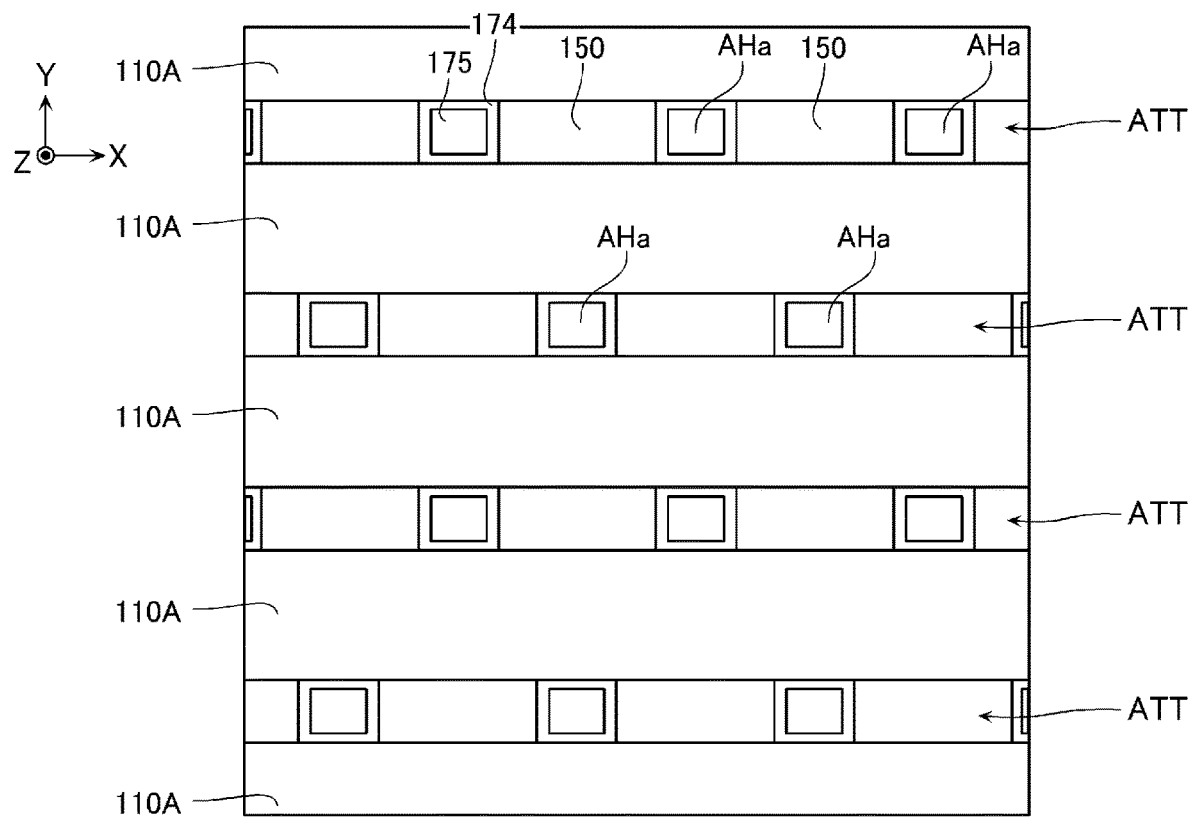
FIG. 19 is a schematic cross-sectional view illustrating the manufacturing method.
Figure 20:
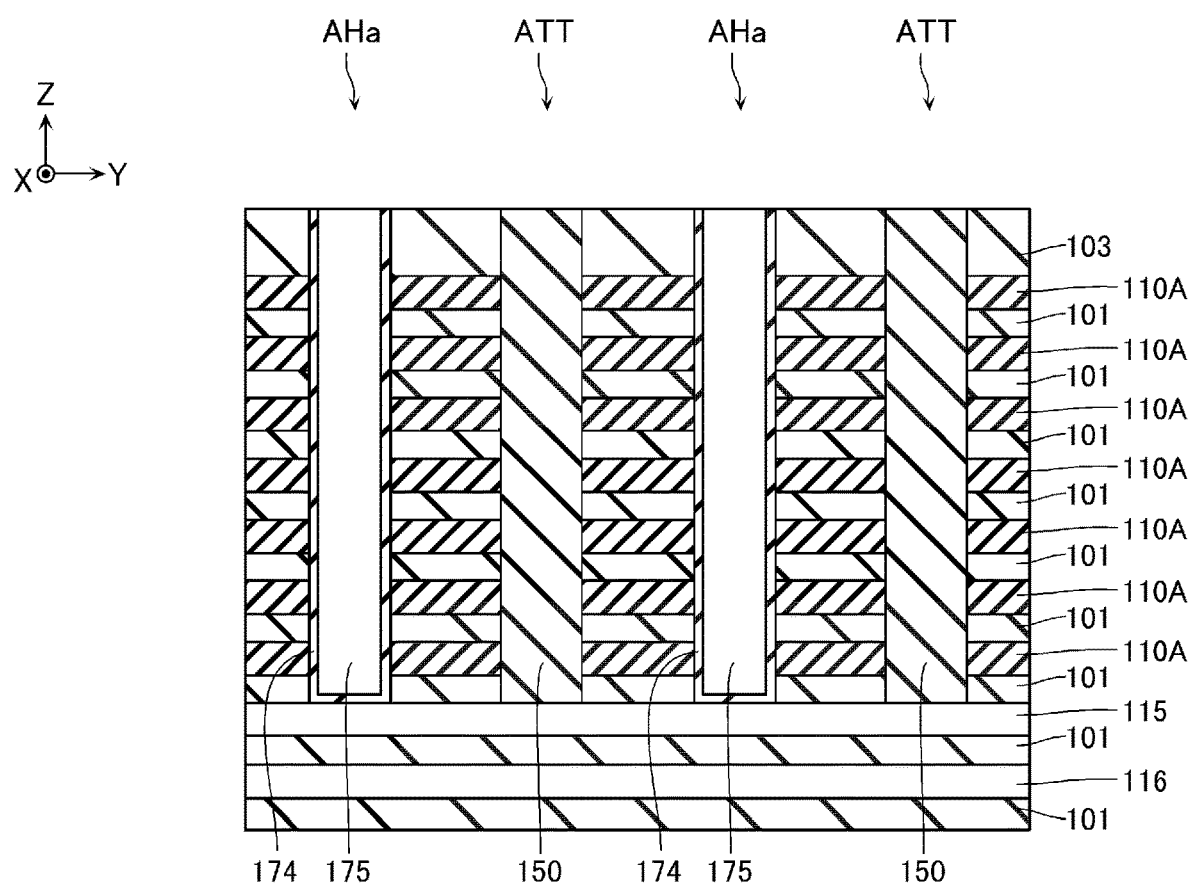
FIG. 20 is a schematic cross-sectional view illustrating the manufacturing method.

Subsequently, as illustrated in FIGS. 19 and 20, the carbon films 171 and the insulating layers 170 are removed from the insides of the trenches ATT. The process is performed, for example, by ashing or RIE. In addition, the insulating layers 150 are formed in the trenches ATT, and the upper surfaces of the insulating layers 150 are removed to the positions of the upper surfaces of the insulating layers 103. The process is performed, for example, by CVD or RIE.

Figure 21:
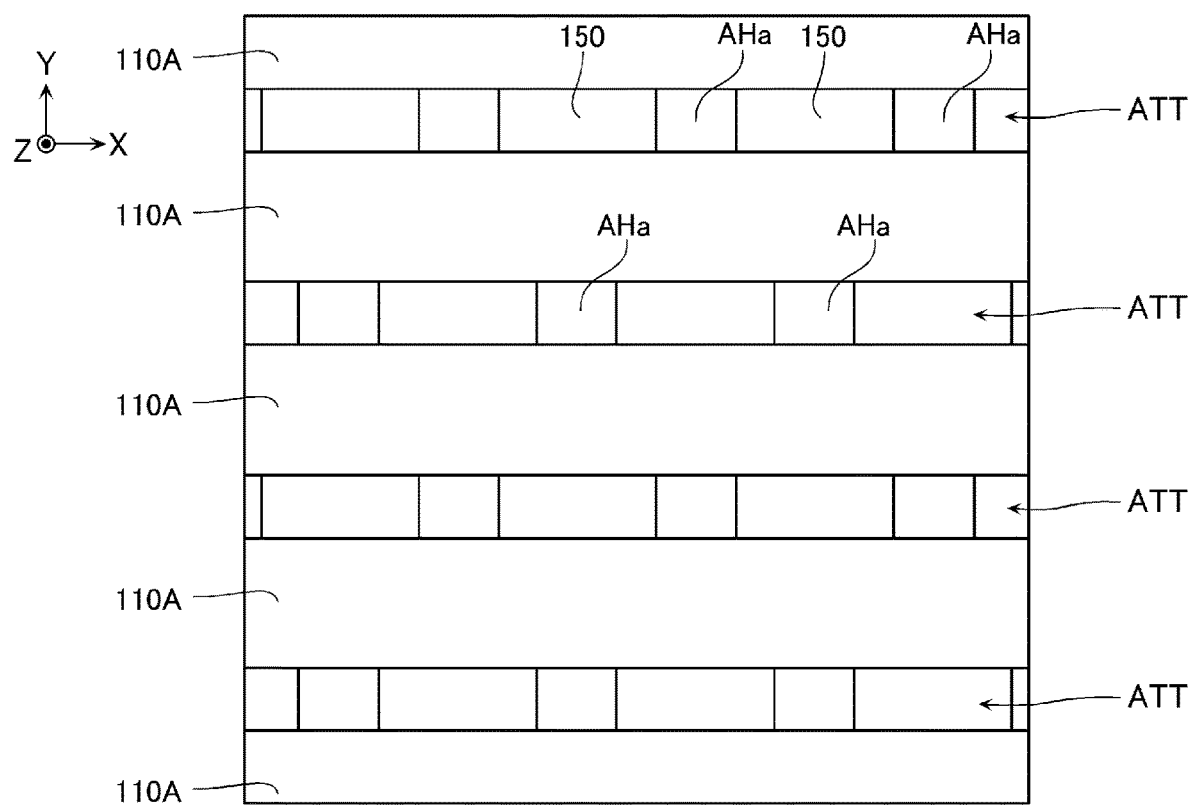
FIG. 21 is a schematic cross-sectional view illustrating the manufacturing method.
Figure 22:
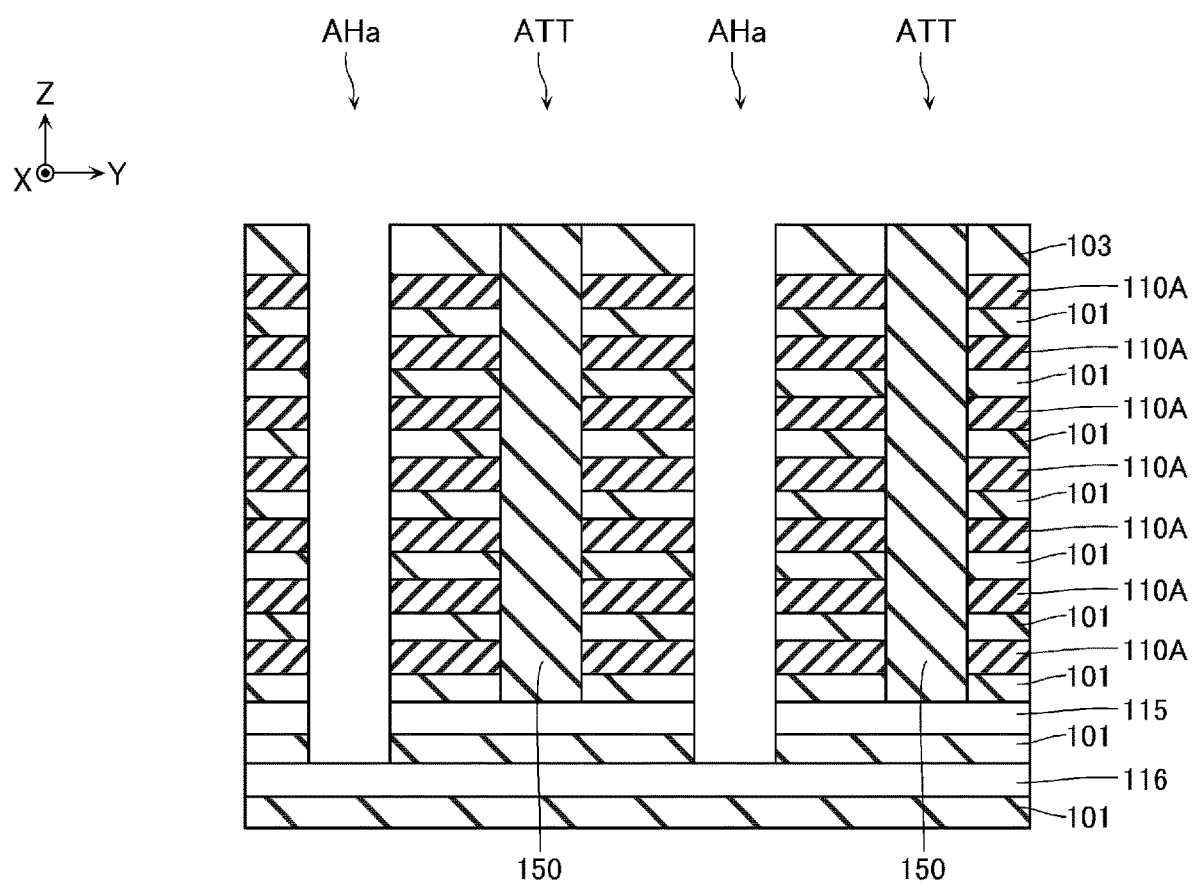
FIG. 22 is a schematic cross-sectional view illustrating the manufacturing method.

Subsequently, as illustrated in FIGS. 21 and 22, the semiconductor layers 175 are removed from the insides of the openings AHa. The process is performed, for example, by wet etching. The insulating layers 174 are removed from the insides of the openings AHa, and further bottom portions of the openings AHa are removed until the positions of the bottom surfaces of the openings AHa are identical to the position of the upper surfaces of the semiconductor layer 116. The process is performed, for example, by RIE.

Figure 23:
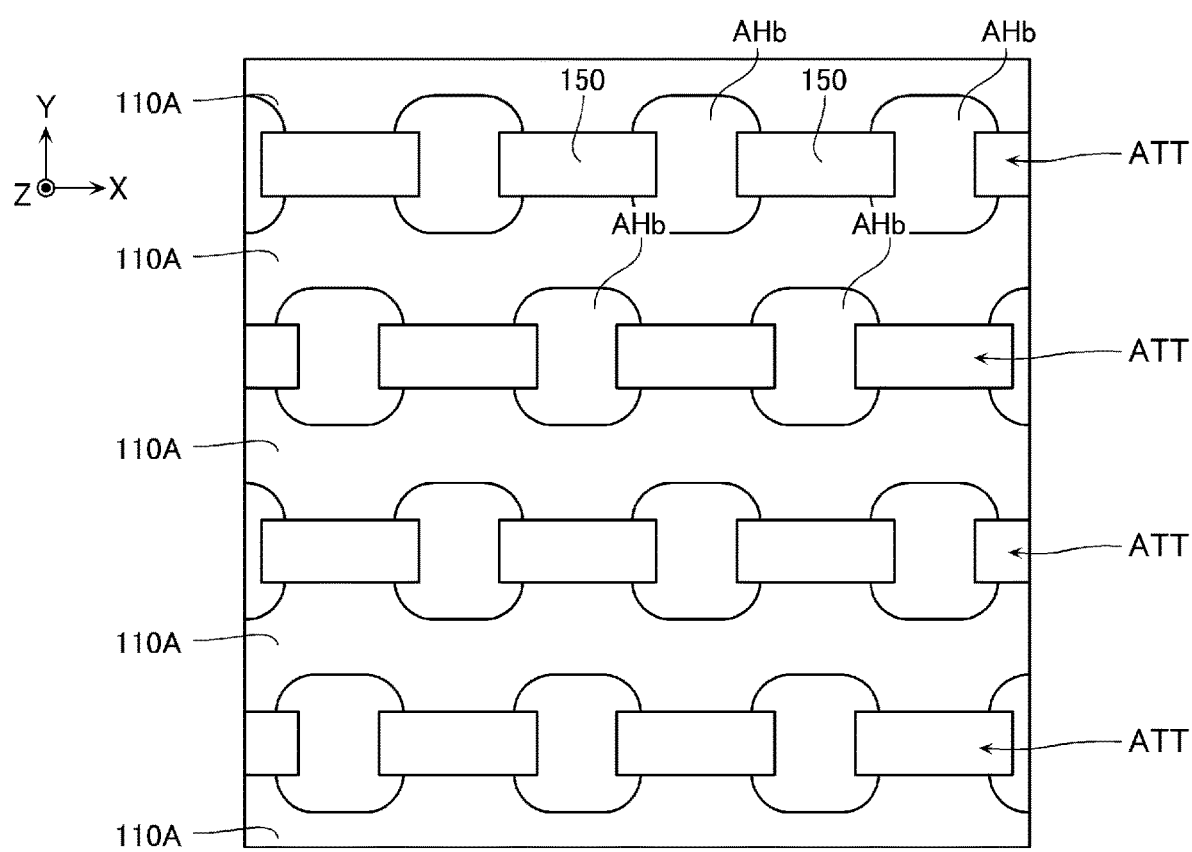
FIG. 23 is a schematic cross-sectional view illustrating the manufacturing method.
Figure 24:
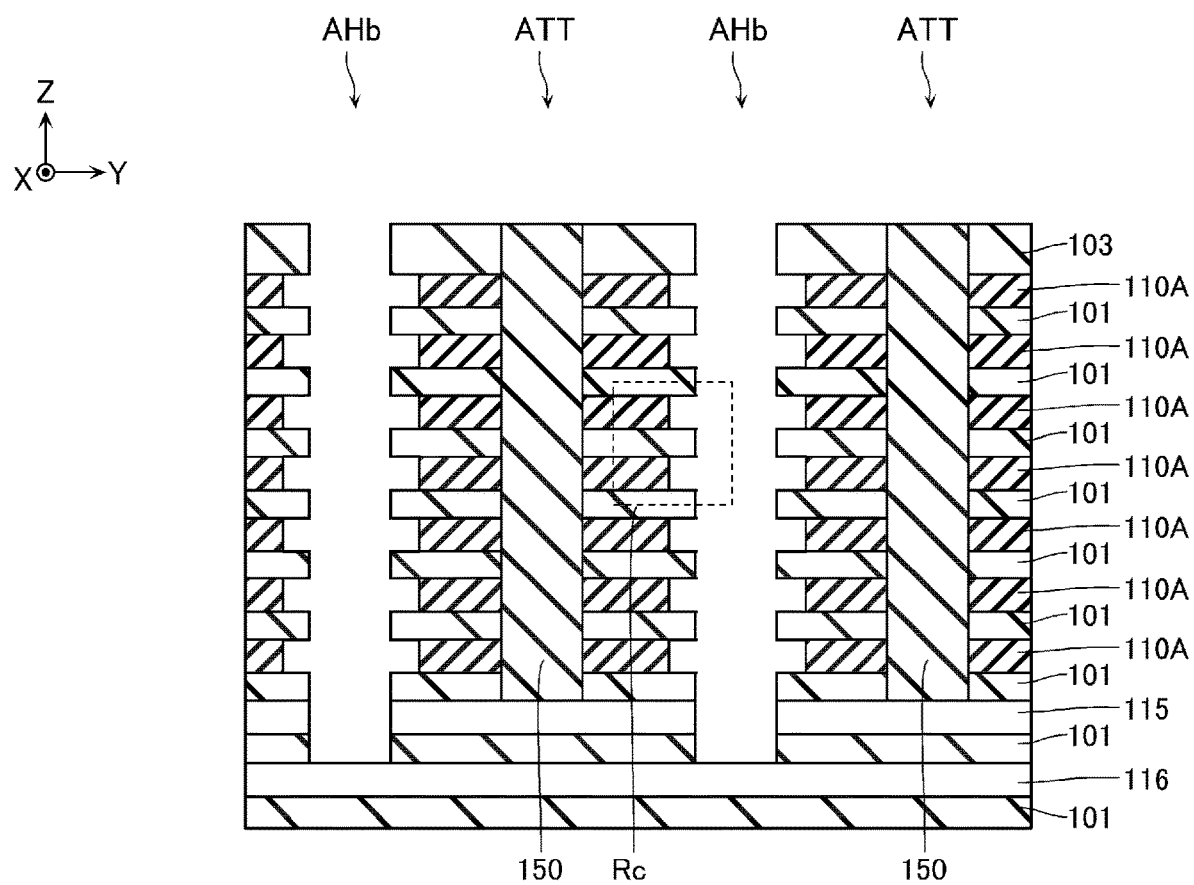
FIG. 24 is a schematic cross-sectional view illustrating the manufacturing method.

Subsequently, as illustrated in FIGS. 23 and 24, portions of the sacrifice layers 110A are removed via the openings AHa, and openings AHb are formed. By the process, portions of the upper surfaces and the lower surfaces of the insulating layers 101 that are positioned near the openings AHa are exposed. The process is performed, for example, by wet etching.

The subsequent processes are described with reference to cross-sectional views illustrated in FIGS. 25 to 33. FIGS. 25 to 33 are schematic diagrams by enlarging the portion corresponding to a region Rc of FIG. 24.

Figure 25:
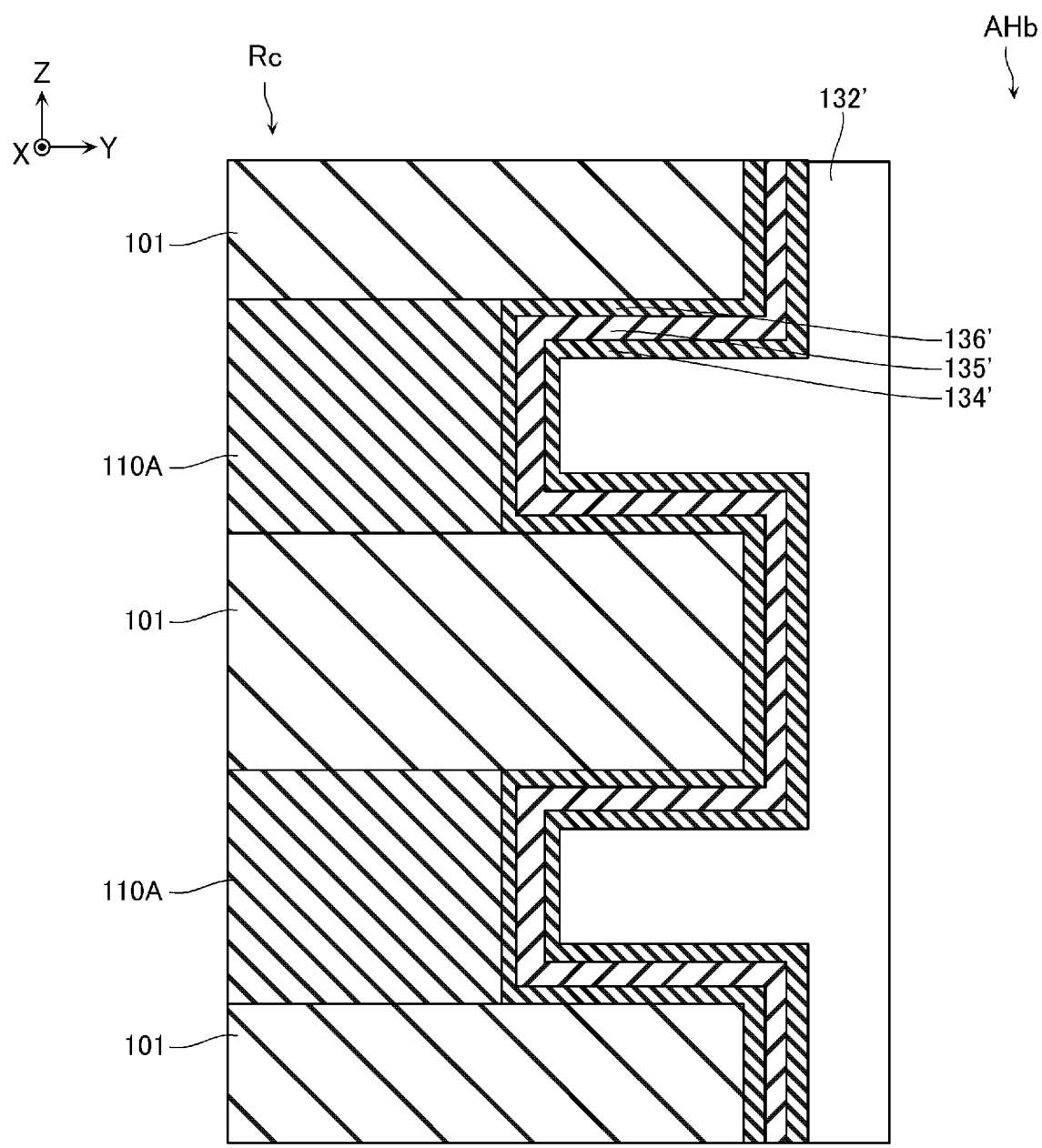
FIG. 25 is a schematic cross-sectional view illustrating the manufacturing method.

Subsequently, as illustrated in FIG. 25, an insulating layer 136', a high dielectric constant layer 135', an insulating layer 134', and semiconductor layers 132' are sequentially formed on the side surface of the opening AHb via the opening AHb. The insulating layer 136' is, for example, silicon oxide ($SiO_2$). The high dielectric constant layer 135' is, for example, an insulating metal oxide layer of hafnium silicate (HfSiO). The insulating layer 134' is, for example, a stacked film including silicon oxide ($SiO_2$) or the like, or titanium nitride (TiN) and silicon oxide ($SiO_2$). The semiconductor layers 132' are, for example, polycrystalline silicon including n-type impurities such as phosphorus (P) or p-type impurities such as boron (B). The process is performed, for example, by CVD.

Figure 26:
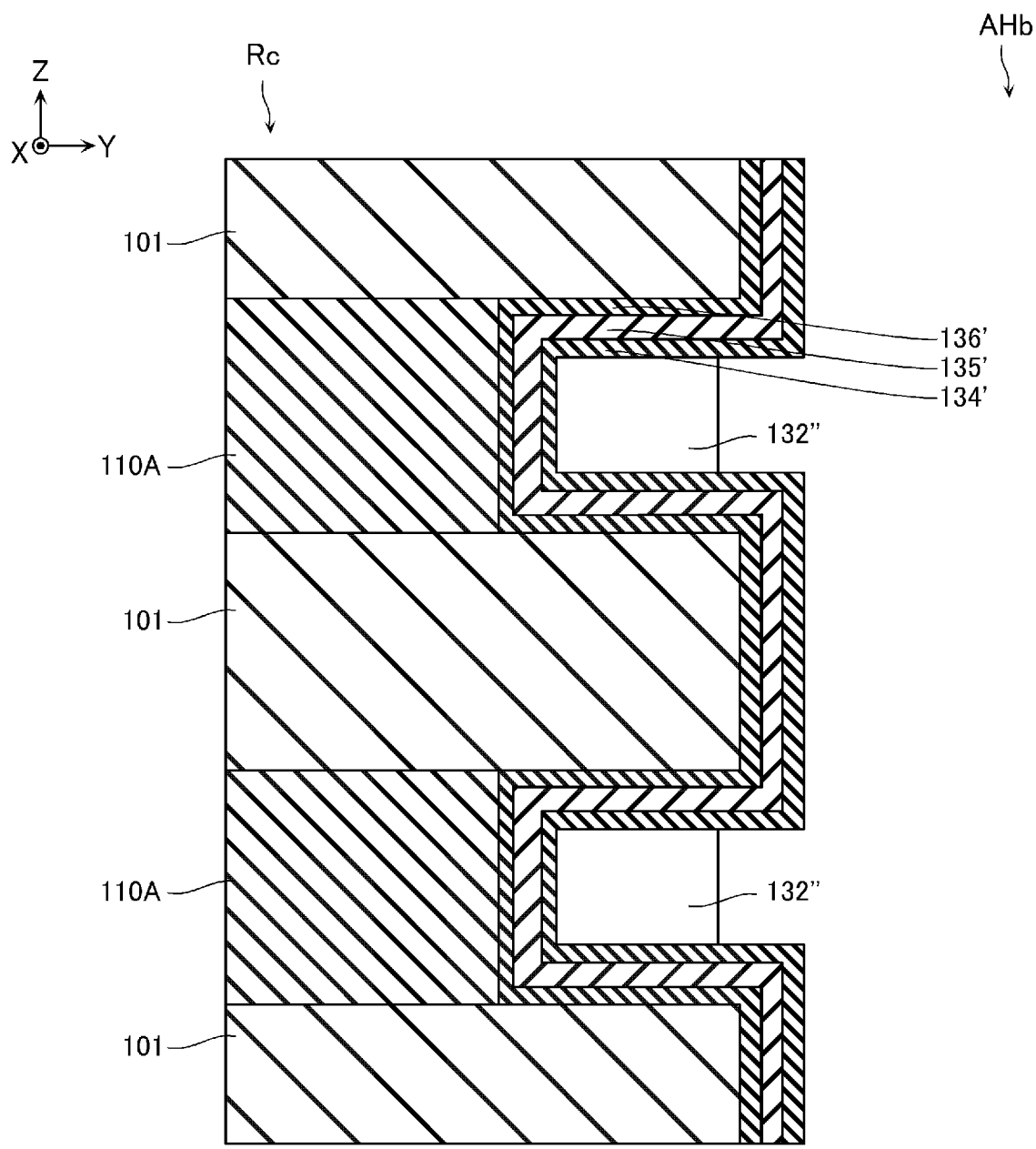
FIG. 26 is a schematic cross-sectional view illustrating the manufacturing method.

Subsequently, as illustrated in FIG. 26, portions of the semiconductor layers 132' are removed, and a plurality of semiconductor layers 132" arranged in the Z direction to correspond to the sacrifice layers 110A are formed. The process is performed, for example, by wet etching.

Figure 27:
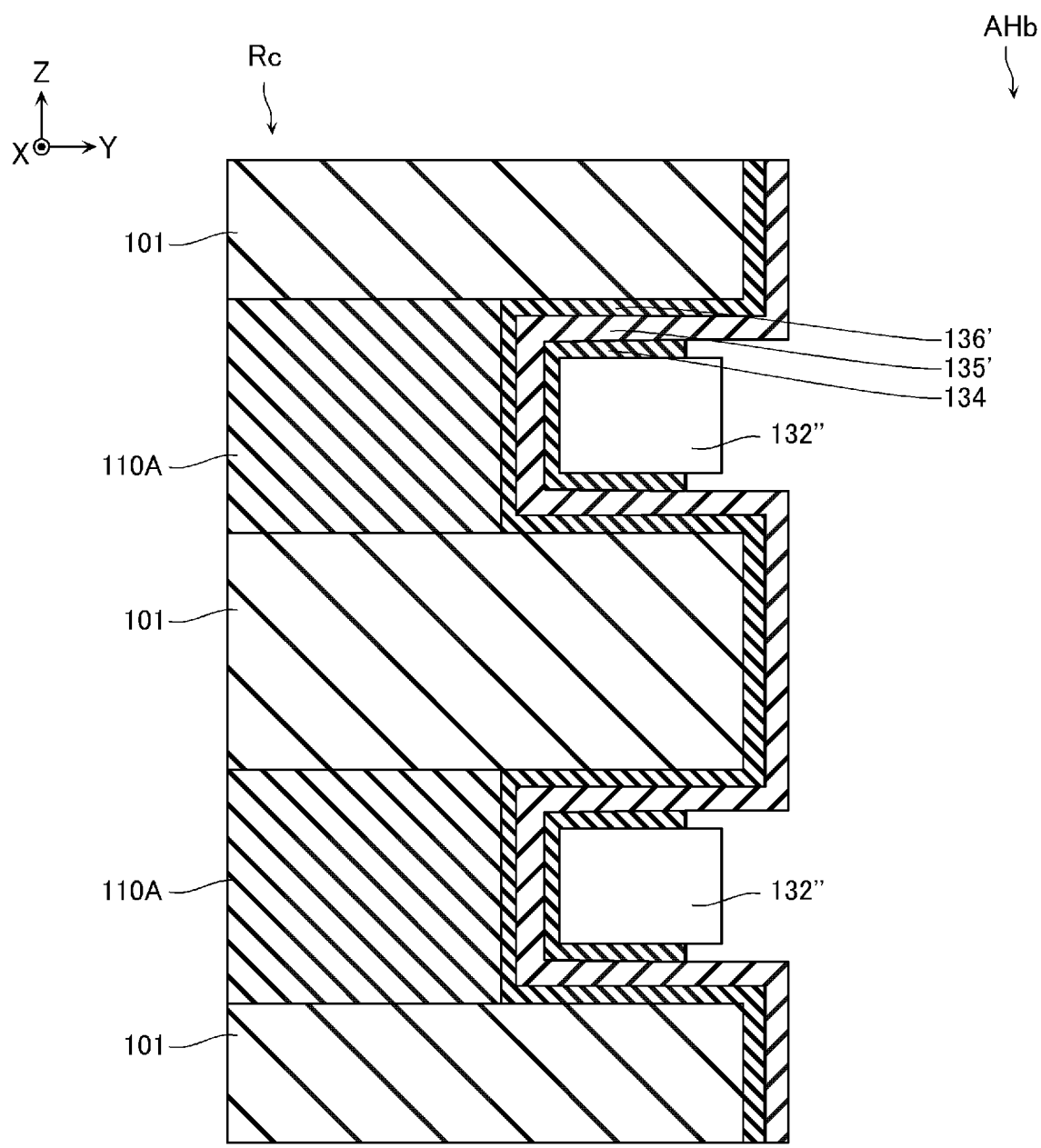
FIG. 27 is a schematic cross-sectional view illustrating the manufacturing method.

Subsequently, as illustrated in FIG. 27, a portion of the insulating layer 134' is removed, and the plurality of the insulating layers 134 arranged in the Z direction to correspond to the sacrifice layers 110A are formed. The end surfaces of the insulating layers 134 on the opening AHb side are closer to the sacrifice layers 110A than the end surfaces of the semiconductor layers 132" on the opening AHb side. The process is performed, for example, by wet etching.

Figure 28:
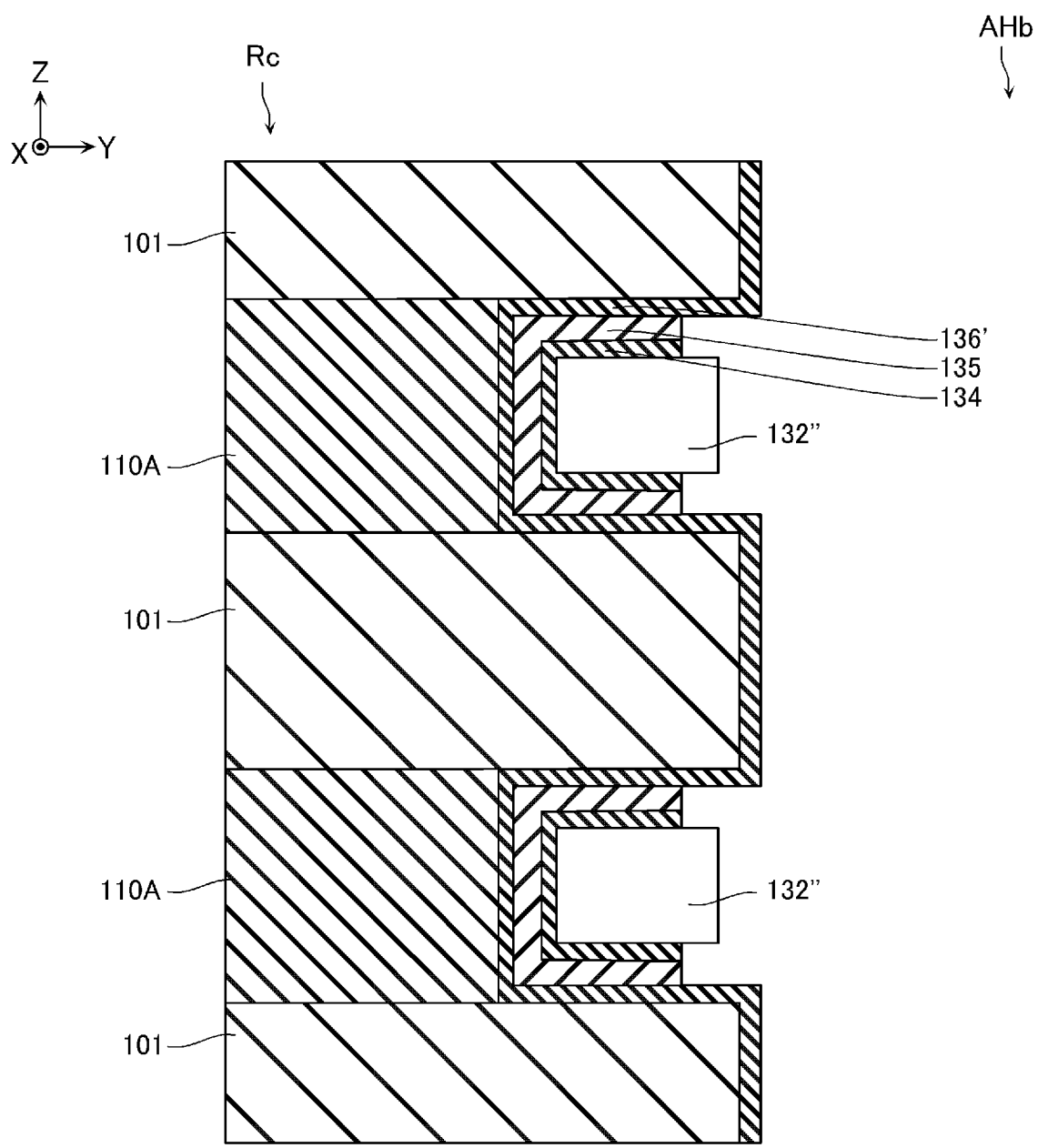
FIG. 28 is a schematic cross-sectional view illustrating the manufacturing method.

Subsequently, as illustrated in FIG. 28, a portion of the high dielectric constant layer 135' is removed, and the plurality of high dielectric constant layers 135 arranged in the Z direction to correspond to the sacrifice layers 110A are formed. The end surfaces of the high dielectric constant layers 135 on the opening AHb side are provided at positions to the same extents as the end surfaces of the insulating layers 134 on the opening AHb side, and are closer to the sacrifice layers 110A than the end surfaces of the semiconductor layers 132" on the opening AHb side. The process is performed, for example, by wet etching.

Figure 29:
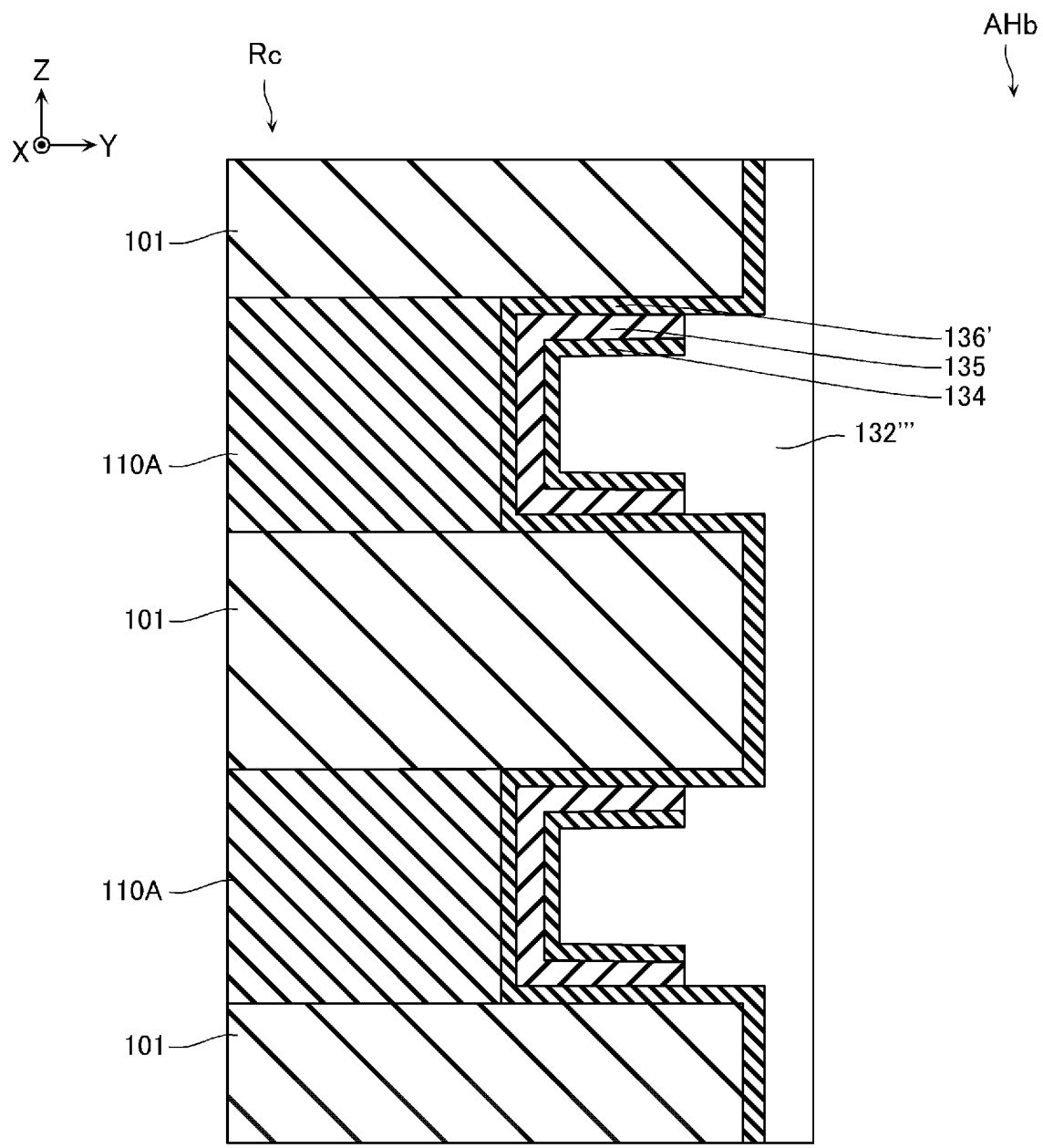
FIG. 29 is a schematic cross-sectional view illustrating the manufacturing method.

Subsequently, as illustrated in FIG. 29, a film of the same material as the semiconductor layers 132", for example, undoped polycrystalline silicon (Si) is formed via the opening AHb, to form a semiconductor layer 132'''. The process is performed, for example, by CVD.

Figure 30:
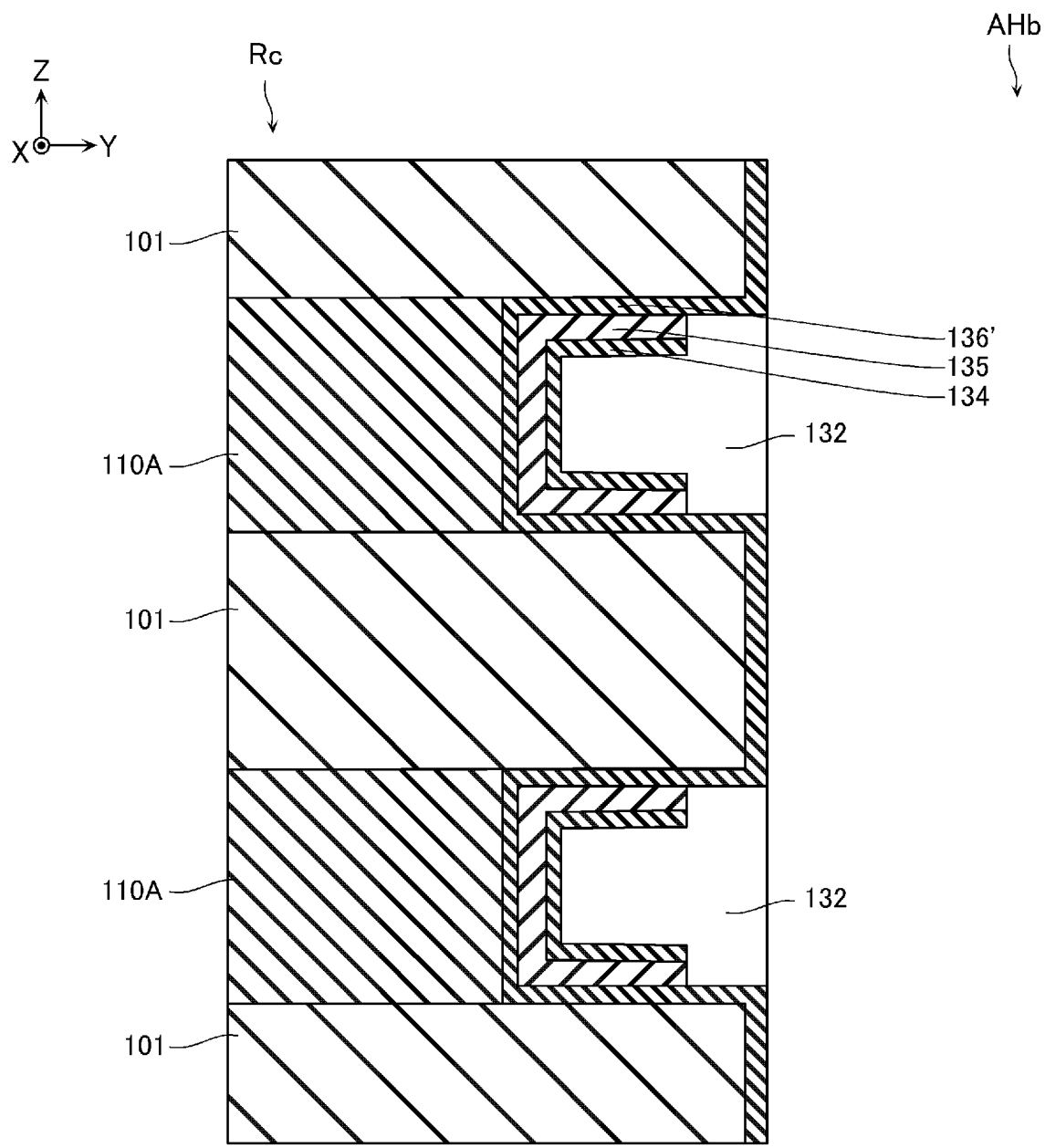
FIG. 30 is a schematic cross-sectional view illustrating the manufacturing method.

Subsequently, as illustrated in FIG. 30, a portion of the semiconductor layer 132''' is removed via the opening AHb, to form the plurality of charge storage layers 132 arranged in the Z direction to correspond to the sacrifice layers 110A. The end surfaces of the charge storage layers 132 on the opening AHb side in the Y direction are provided at positions to the same extent as the surface of the insulating layer 136' on the opening AHb side. In addition, the end surfaces of the charge storage layers 132 on the opening AHb side in the Y direction are farther from the sacrifice layers 110A than the end surfaces of the insulating layers 134 and the high dielectric constant layers 135 on the opening AHb side. The process is performed, for example, by wet etching.

Figure 31:
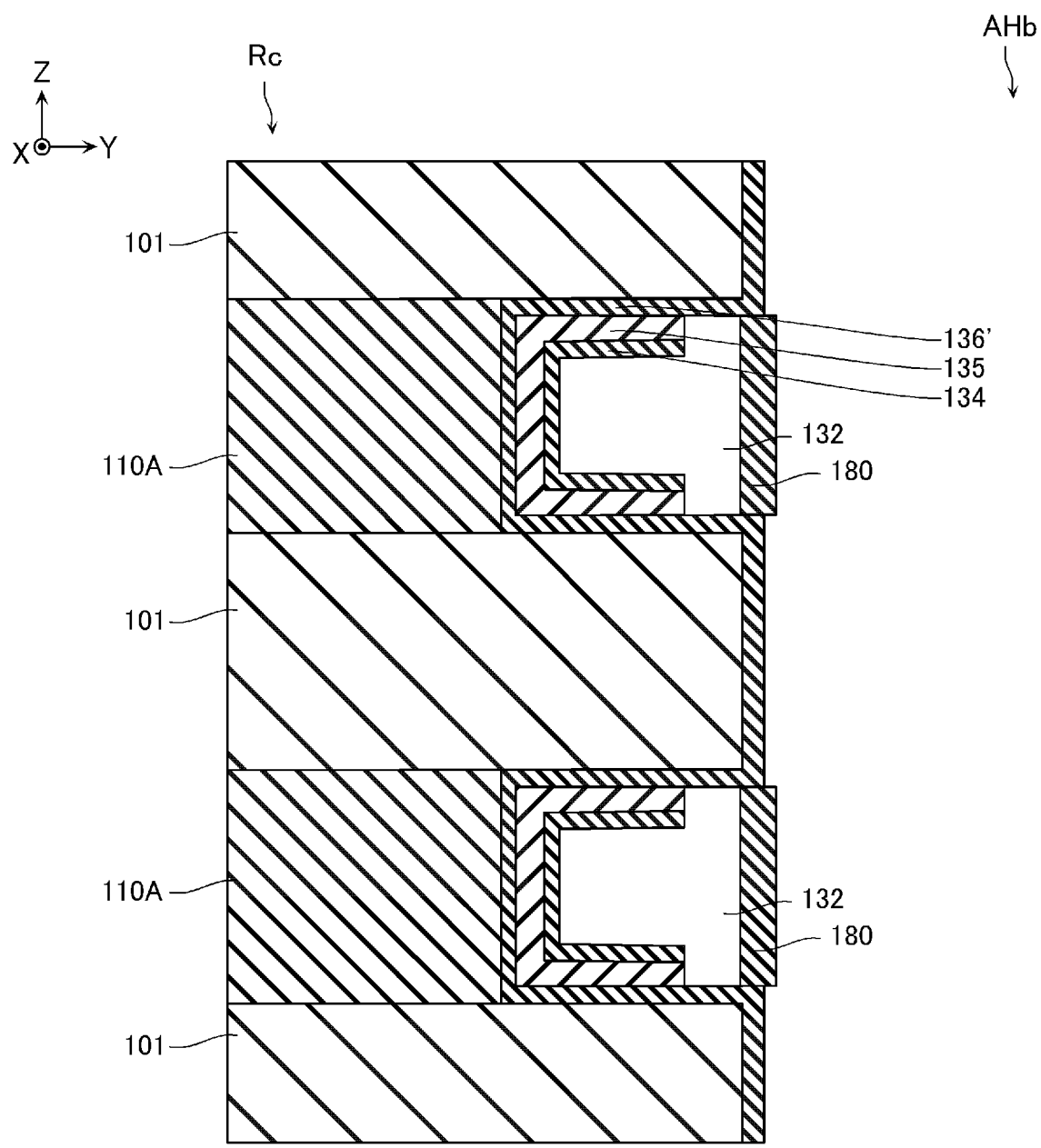
FIG. 31 is a schematic cross-sectional view illustrating the manufacturing method.

Subsequently, as illustrated in FIG. 31, an oxidization process is performed on portions of the charge storage layers 132 which are exposed to the opening AHb via the opening AHb, to form insulating layers 180 of silicon oxide ($SiO_2$) or the like. The process is performed, for example, by a thermal oxidization process.

Figure 32:
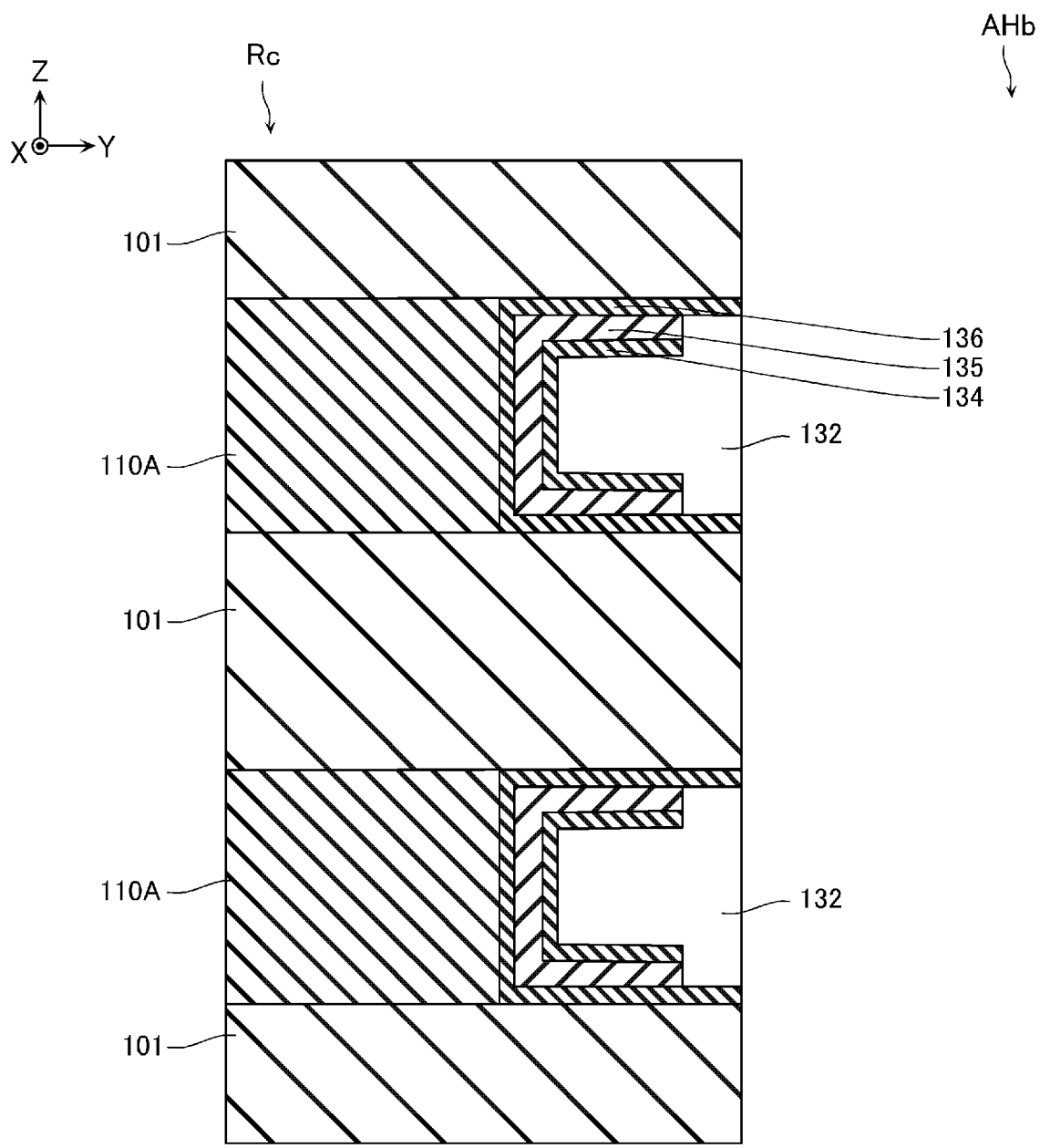
FIG. 32 is a schematic cross-sectional view illustrating the manufacturing method.

Subsequently, as illustrated in FIG. 32, portions of the insulating layers 180 and the insulating layer 136' are removed via the opening AHb, the insulating layers 136 arranged in the Z direction to correspond to the sacrifice layers 110A are formed, and the end surfaces of the charge storage layers 132 in the Y direction are exposed. The process is performed, for example, by wet etching.

Figure 33:
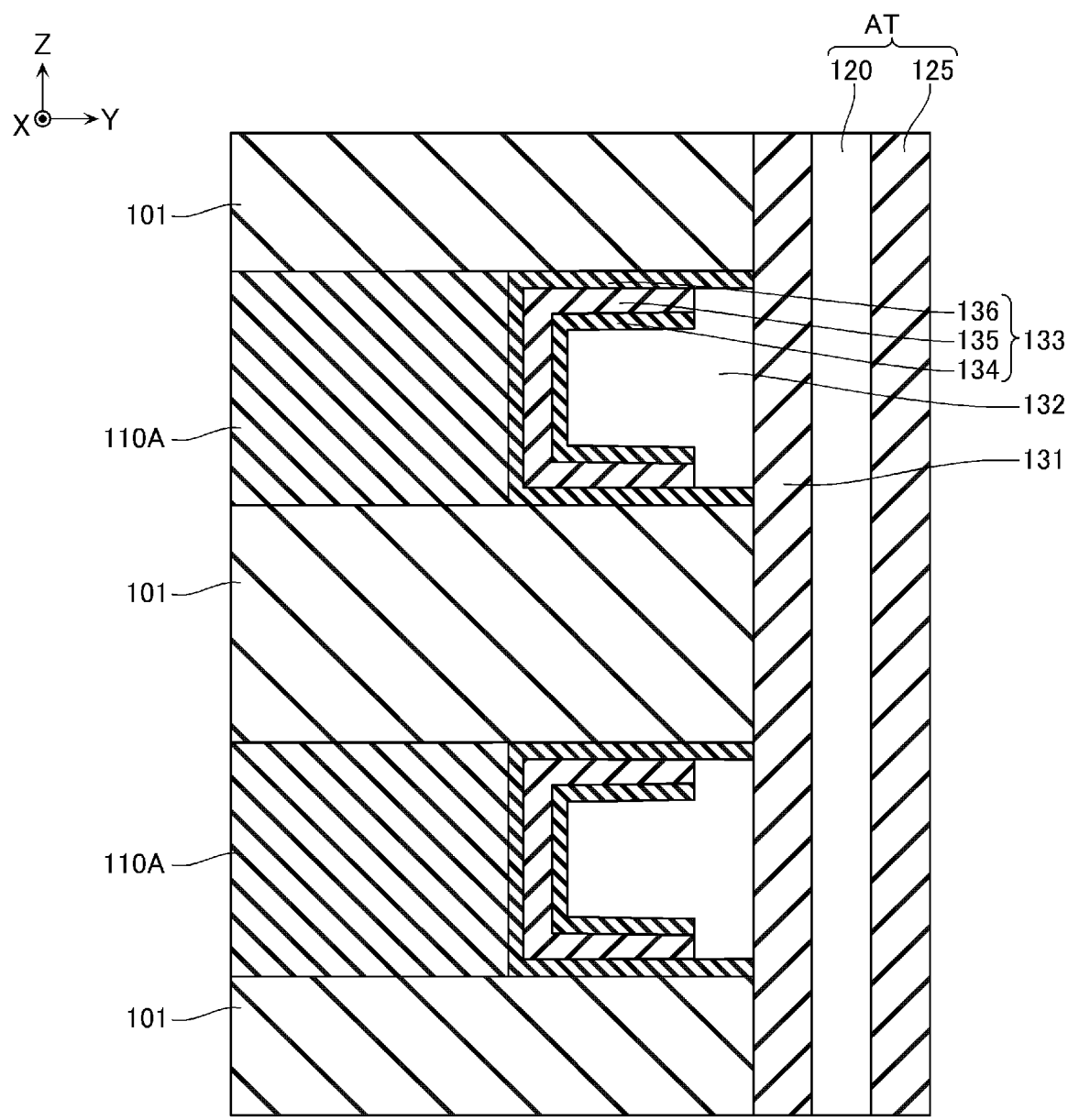
FIG. 33 is a schematic cross-sectional view illustrating the manufacturing method.

Subsequently, as illustrated in FIG. 33, the tunnel insulating layers 131 are formed on the inner peripheral surface of the opening AHb. The process is performed, for example, by CVD or an oxidization process. When the tunnel insulating layers 131 are formed by the method such as CVD, the tunnel insulating layers 131 extend in the Z direction along the inner peripheral surface of the opening AHb. When the tunnel insulating layer 131 is formed by the method of the oxidization process or the like, the tunnel insulating layers 131 are respectively formed on the side surfaces of the charge storage layers 132 in the Y direction.

Subsequently, portions of the tunnel insulating layers 131 with which the bottom surfaces of the openings AHb are covered are removed. The process is performed, for example, by RIE.

Subsequently, as illustrated in FIG. 33, the semiconductor layer 120 and the insulating layer 125 are formed in the opening AHb. The process is performed, for example, by CVD.

Subsequently, the plurality of sacrifice layers 110A are removed via openings (not illustrated). The process is performed, for example, by wet etching.

Subsequently, as illustrated in FIG. 6, the metal oxide layers 113 and the barrier conductive layers 111 are formed on the upper surface and the lower surface of the insulating layers 101 and the side surfaces of the insulating layers 136 in the Y direction via openings (not illustrated). In addition, the conductive layers 110 are formed to fill cavities formed by removing the plurality of sacrifice layers 110A. The process is performed, for example, by CVD.

Thereafter, by forming the bit line contacts BLC and the bit lines BL, or the like, the semiconductor storage device according to the first embodiment is manufactured.

Comparative Example

Figure 34:
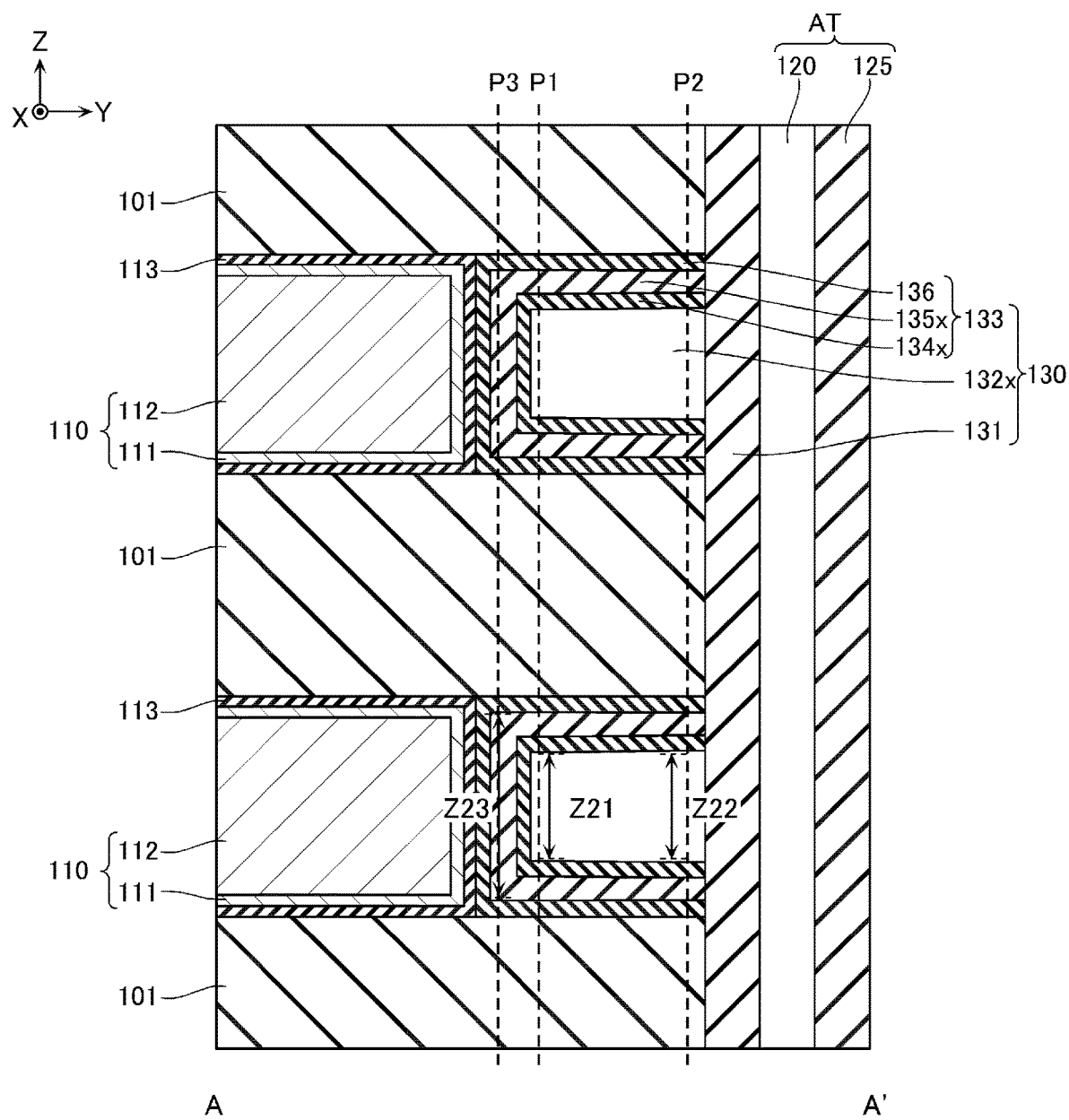
FIG. 34 is a schematic cross-sectional view of a semiconductor storage device according to a comparative example.

FIG. 34 is a schematic cross-sectional view of the semiconductor storage device according to a comparative example. FIG. 34 is a schematic cross-sectional view illustrating a configuration of a portion of the semiconductor storage device according to the comparative example which corresponds to FIG. 6.

The semiconductor storage device according to the comparative example is different from the first embodiment, and includes charge storage layers 132$x$, insulating layers 134$x$, and high dielectric constant layers 135$x$ instead of the charge storage layers 132, the insulating layers 134, and the high dielectric constant layers 135.

The charge storage layer 132$x$ does not include the wide portion RW1 and the narrow portion RN1 that are described with reference to FIG. 6. The charge storage layer 132$x$ includes a facing surface that faces the conductive layer 110. In addition, the charge storage layer 132$x$ includes a facing surface that faces the semiconductor layer 120. In addition, FIG. 34 illustrates positions provided between the two facing surfaces in the Y direction as the first position P1 and the second position P2. In addition, the width of the charge storage layer 132$x$ at the first position P1 in the Z direction is illustrated as a first width Z21. In addition, the width of the charge storage layer 132$x$ at the second position P2 in the Z direction is illustrated as a second width Z22. Here, the width of the charge storage layer 132$x$ in the Z direction is substantially constant. For example, the first width Z21 is large to the same extent as the second width Z22. The area of the charge storage layer 132$x$ facing the semiconductor layer 120 is the same extent as the area of the charge storage layer 132$x$ facing the semiconductor layer 120.

The insulating layer 134$x$ is different from the insulating layer 134 according to the first embodiment, and the end surface of the insulating layer 134$x$ on the semiconductor layer 120 side in the Y direction is in contact with the tunnel insulating layer 131.

The high dielectric constant layer 135$x$ is different from the high dielectric constant layer 135 according to the first embodiment, and the end surface of the high dielectric constant layer 135$x$ on the semiconductor layer 120 side in the Y direction is in contact with the tunnel insulating layer 131. In addition, FIG. 34 illustrates a position including a portion of the high dielectric constant layer 135$x$ in the Y direction as the third position P3. In addition, the width of the high dielectric constant layer 135$x$ at the third position P3 in the Z direction is illustrated as a third width Z23. The third width Z23 is larger than the second width Z22.

As illustrated in FIG. 34, in view of two of the charge storage layers 132$x$ adjacent to each other in the Z direction, one charge storage layer 132$x$ and the other charge storage layer 132$x$ do not include portions that face each other without any of the high dielectric constant layer 135$x$ arranged in the Z direction interposed therebetween.

[Effect of First Embodiment]

With the high integration of the semiconductor storage device, the number of layers of the stacked structure consisting of the conductive layer 110 and the insulating layer 101 is increasing. With such an increase in the number of layers, the thinning of each layer progresses, and the area of the charge storage layer 132 facing the semiconductor layer 120 may become smaller. As a result, a capacitance between the semiconductor layer 120 and the charge storage layer 132 may decrease. If the capacitance between the semiconductor layer 120 and the charge storage layer 132 decreases, charges are not effectively stored in the charge storage layer 132 in the write operation, and charges cannot be effectively extracted from the charge storage layer 132 in the erase operation, and the reliability and the speed of the memory operation may be deteriorated.

Here, in the comparative example described with reference to FIG. 34, the insulating layers 134x and the high dielectric constant layers 135x are provided between the upper surface and the lower surface of the charge storage layer 132x and the insulating layer 101. In such a configuration, the area of the charge storage layer 132x facing the semiconductor layer 120 may be relatively small. Accordingly, the capacitance between the semiconductor layer 120 and the charge storage layer 132 may become small.

Therefore, in the first embodiment, as described with reference to FIG. 6, the wide portion RW1 and the narrow portion RN1 are provided in the charge storage layer 132. In such a configuration, the area of the charge storage layer 132 facing the semiconductor layer 120 can be relatively large. Accordingly, the capacitance between the semiconductor layer 120 and the charge storage layer 132 can be increased.

[Modification of First Embodiment]

Figure 35:
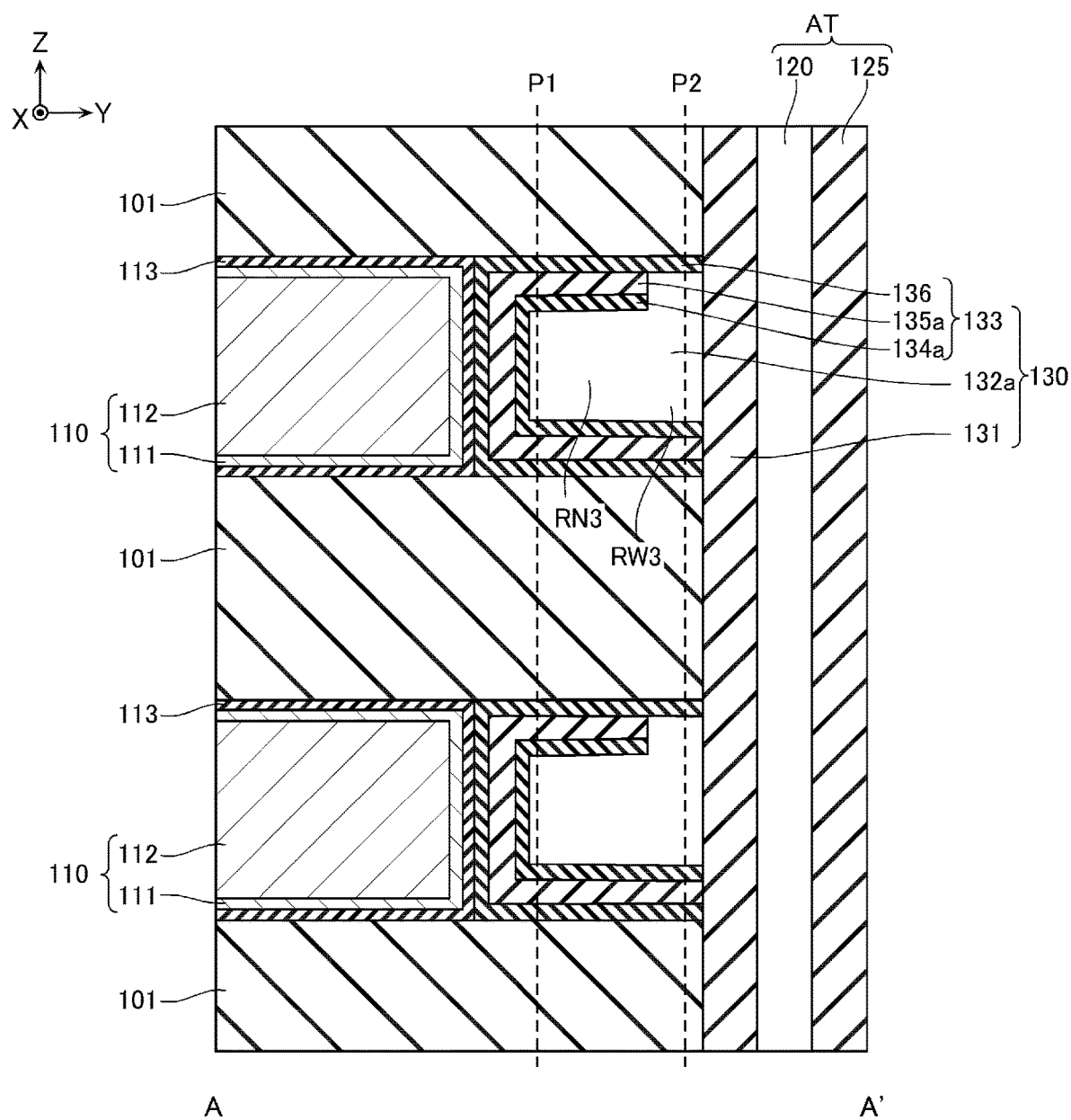
FIG. 35 is a schematic cross-sectional view of a semiconductor storage device according to a modification.

FIG. 35 is a schematic cross-sectional view of the semiconductor storage device according to a modification of the first embodiment. FIG. 35 is a schematic cross-sectional view of the configuration illustrated in FIG. 5 taken along the line A-A' and viewed in the direction of the arrow.

The semiconductor storage device according to the present modification is basically configured in the same manner as the first embodiment. However, the semiconductor storage device according to the present modification is different from the first embodiment, and includes charge storage layers 132a, insulating layers 134a, and high dielectric constant layers 135a, instead of the charge storage layers 132, the insulating layers 134, and the high dielectric constant layers 135.

The charge storage layer 132a is basically configured in the same manner as the charge storage layer 132 according to the first embodiment. However, the charge storage layer 132a includes a wide portion RW3 and a narrow portion RN3 instead of the wide portion RW1 and the narrow portion RN1 in the charge storage layer 132. The wide portion RW3 and the narrow portion RN3 are basically configured in the same manner as the wide portion RW1 and the narrow portion RN1.

The insulating layer 134a is basically configured in the same manner as the insulating layer 134 according to the first embodiment. However, unlike the first embodiment, the end surfaces of the insulating layer 134a on the semiconductor layer 120 side in the Y direction are different from each other at end positions on the upper side and the lower side. That is, in the YZ cross section, the upper surface and the lower surface of the narrow portion RN3, the cross section thereof on the conductive layer 110 side, and the lower surface of the wide portion RW3 are covered with the insulating layer 134a. The end surface of the insulating layer 134a on the upper side is provided at a position closer to the conductive layer 110 than the end surface of the charge storage layer 132a on the semiconductor layer 120 side in the Y direction. The end surface of the insulating layer 134a on the lower side is provided at a position to the same extent as the end surface of the charge storage layer 132a on the semiconductor layer 120 side in the Y direction.

The high dielectric constant layer 135a is basically configured in the same manner as the high dielectric constant layer 135 according to the first embodiment. However, unlike the first embodiment, the end surfaces of the high dielectric constant layer 135a on the semiconductor layer 120 side in the Y direction are different from each other at end positions on the upper side and the lower side. That is, in the YZ cross section, the upper surface and the lower surface of the narrow portion RN3, the cross section thereof on the conductive layer 110 side, and the lower surface of the wide portion RW3 are covered with the high dielectric constant layer 135a via the insulating layer 134a. The end surface of the high dielectric constant layer 135a on the upper side is provided at a position closer to the conductive layer 110 than the end surface of the charge storage layer 132a on the semiconductor layer 120 side in the Y direction. The end surface of the high dielectric constant layer 135a on the lower side is provided at the position to the same extent as the end surface of the charge storage layer 132a on the semiconductor layer 120 side.

In addition, as illustrated in FIG. 35, in view of two of the charge storage layers 132a adjacent to each other in the Z direction, the wide portion RW3 of one charge storage layer 132a and the wide portion RW3 of the other charge storage layer 132a face each other via only the high dielectric constant layer 135a corresponding to one charge storage layer 132a, and face each other without the high dielectric constant layer 135a corresponding to the other charge storage layer 132a interposed therebetween. That is, one high dielectric constant layer 135a may be provided between the wide portions RW1 of two charge storage layers 132a.

Second Embodiment

Figure 36:
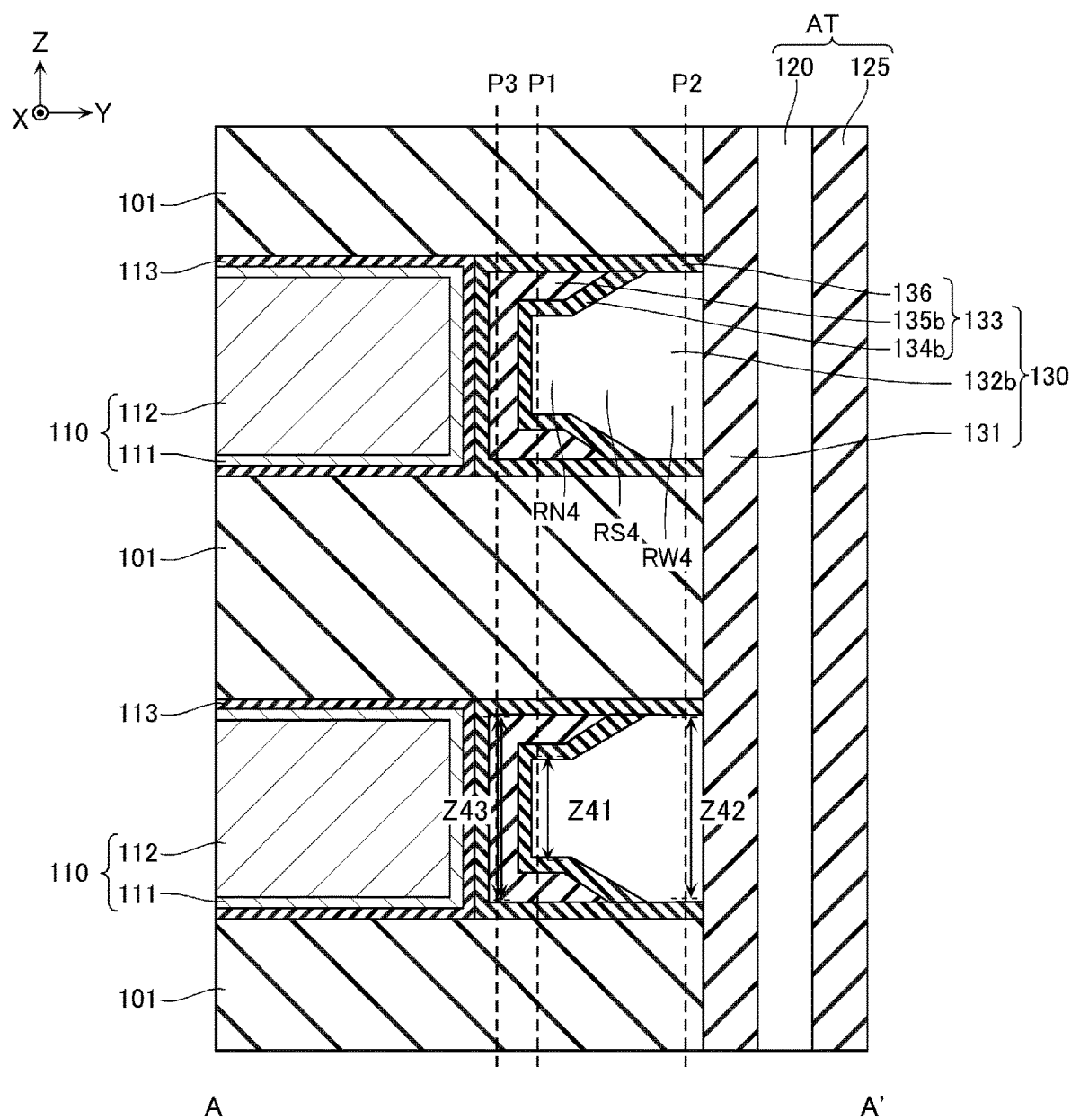
FIG. 36 is a schematic cross-sectional view of a semiconductor storage device according to a second embodiment.

[Configuration] Subsequently, a semiconductor storage device according to a second embodiment with reference to FIG. 36 is described. FIG. 36 is a schematic cross-sectional view of the semiconductor storage device according to the second embodiment. FIG. 36 is a schematic cross-sectional view illustrating a configuration of a portion of the semiconductor storage device according to the second embodiment which corresponds to FIG. 6.

The semiconductor storage device according to the second embodiment is basically configured in the same manner as the semiconductor storage device according to the first embodiment. However, the semiconductor storage device according to the second embodiment is different from the first embodiment, and includes charge storage layers 132b, insulating layers 134b, and high dielectric constant layers 135b instead of the charge storage layers 132, the insulating layers 134, and the high dielectric constant layers 135.

The charge storage layers 132b are basically configured in the same manner as the charge storage layers 132 according to the first embodiment. However, the charge storage layer 132b includes a wide portion RW4, an inclined portion RS4, and a narrow portion RN4 sequentially from the semiconductor layer 120 side to the conductive layers 110 side instead of the wide portion RW1 and the narrow portion RN1 in the charge storage layer 132.

The wide portion RW4 and the narrow portion RN4 are provided in almost the same manner as the wide portion RW1 and the narrow portion RN1 of the charge storage layer 132. For example, in FIG. 36, position provided between the facing surface of the narrow portion RN4 to the conductive layer 110 and the facing surface of the wide portion RW4 to the semiconductor layer 120 in the Y direction is illustrated as the first position P1 and the second position P2. The first position P1 includes a portion of the narrow portion RN4. The second position P2 includes a portion of the wide portion RW4. In addition, the width of the narrow portion RN4 at the first position P1 in the Z direction is illustrated as a first width Z41. In addition, the width of a wide portion RW2 at the second position P2 in the Z direction is illustrated as a second width Z42. The first width Z41 is smaller than the second width Z42. That is, the area of the wide portion RW4 facing the semiconductor layer 120 is wider than the area of the narrow portion RN4 facing the semiconductor layer 120. The inclined portion RS4 is provided as a region in which the thickness in the Z direction increases as it goes closer to the semiconductor layer 120 side. The thickness of the inclined portion RS4 in the Z direction increases from the first width Z41 to the second width Z42.

The insulating layer 134b is basically configured in the same manner as the insulating layer 134 according to the first embodiment. However, as illustrated in FIG. 36, the upper surface and the lower surface of the narrow portion RN4, the upper surface and the lower surface of the inclined portion RS4, and the side surface of the narrow portion RN4 on the conductive layer 110 side in the Y direction are covered with the insulating layer 134b. The end surfaces of the insulating layer 134b on the semiconductor layer 120 side in the Y direction are in contact with the insulating layer 136.

The high dielectric constant layer 135b is basically configured in the same manner as the high dielectric constant layer 135 according to the first embodiment. However, as illustrated in FIG. 36, in the YZ cross section, the upper surface and the lower surface of the narrow portion RN4, the side surface thereof on the conductive layer 110 side, and the upper surface and the lower surface of the inclined portion RS4 are covered with the high dielectric constant layer 135b via the insulating layer 134b. In addition, FIG. 36 illustrates a position including a portion of the high dielectric constant layer 135b in the Y direction as the third position P3. In addition, the width of the high dielectric constant layer 135 at the third position P3 in the Z direction is illustrated as a third width Z43. The second width Z42 is the third width Z43 or wider.

As illustrated in FIG. 36, in view of two of the charge storage layers 132 adjacent to each other in the Z direction, the wide portion RW4 of one the charge storage layer 132b and the wide portion RW4 of the other charge storage layer 132b face each other without the high dielectric constant layer 135b arranged in the Z direction interposed therebetween. That is, the high dielectric constant layer 135b is not provided between the wide portions RW4 of the two charge storage layers 132b.

[Manufacturing Method]

Subsequently, a method of manufacturing the semiconductor storage device according to the second embodiment is described with reference to FIGS. 37 to 43. FIGS. 37 to 43 are schematic cross-sectional views illustrating the manufacturing method, and correspond to the portion illustrated in FIG. 36.

When the semiconductor storage device according to the second embodiment is manufactured, the processes described with reference to FIGS. 7 to 24 are performed.

Figure 37:
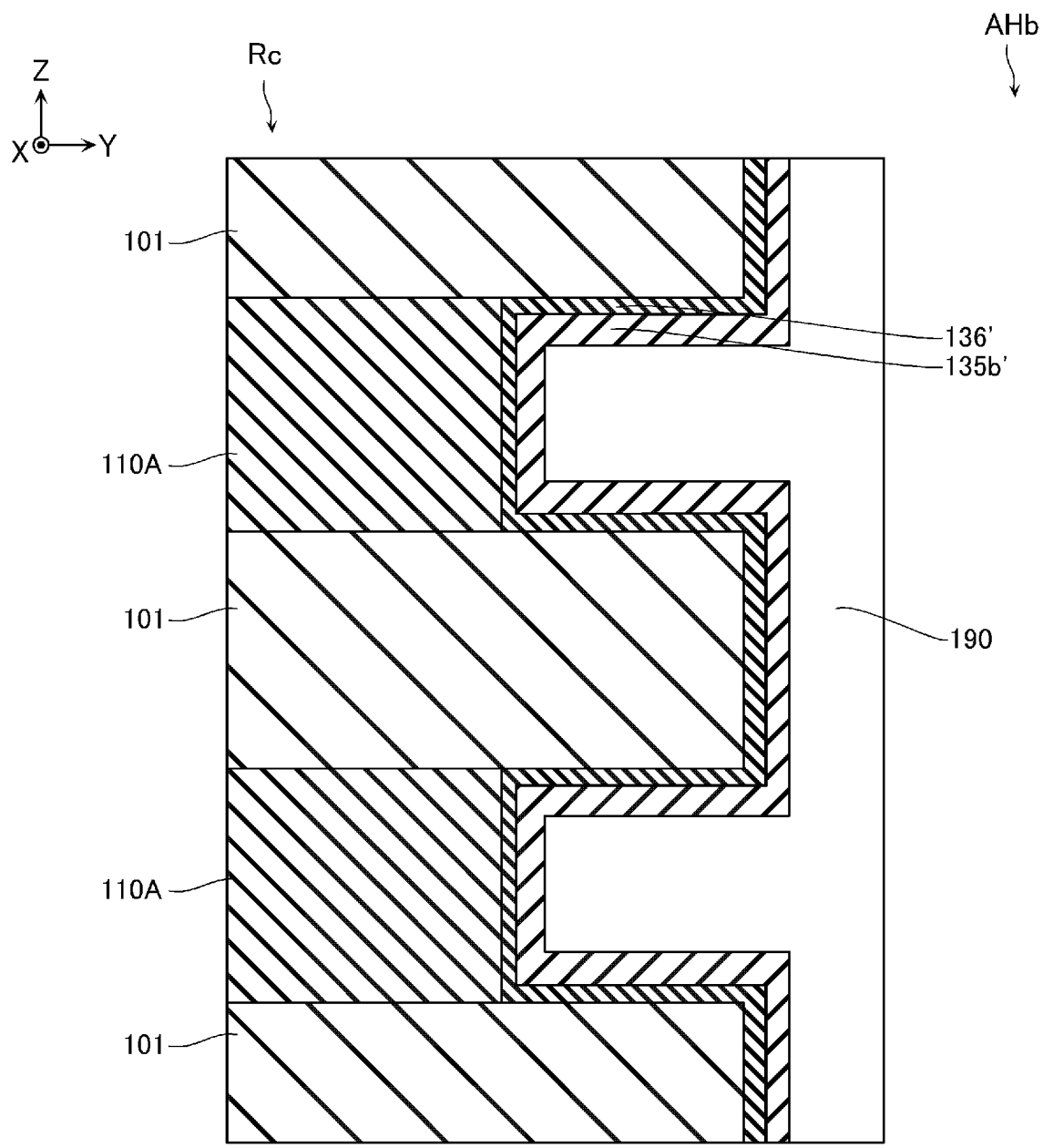
FIG. 37 is a schematic cross-sectional view illustrating a method of manufacturing the semiconductor storage device.

Subsequently, as illustrated in FIG. 37, the insulating layer 136', a high dielectric constant layer 135b', and a semiconductor layer 190 are sequentially formed on the side surface of the opening AHb via the opening AHb. The high dielectric constant layers 135b' include the same material as the high dielectric constant layer 135'. The semiconductor layer 190 is amorphous silicon (Si) and the like. The process is performed, for example, by CVD.

Figure 38:
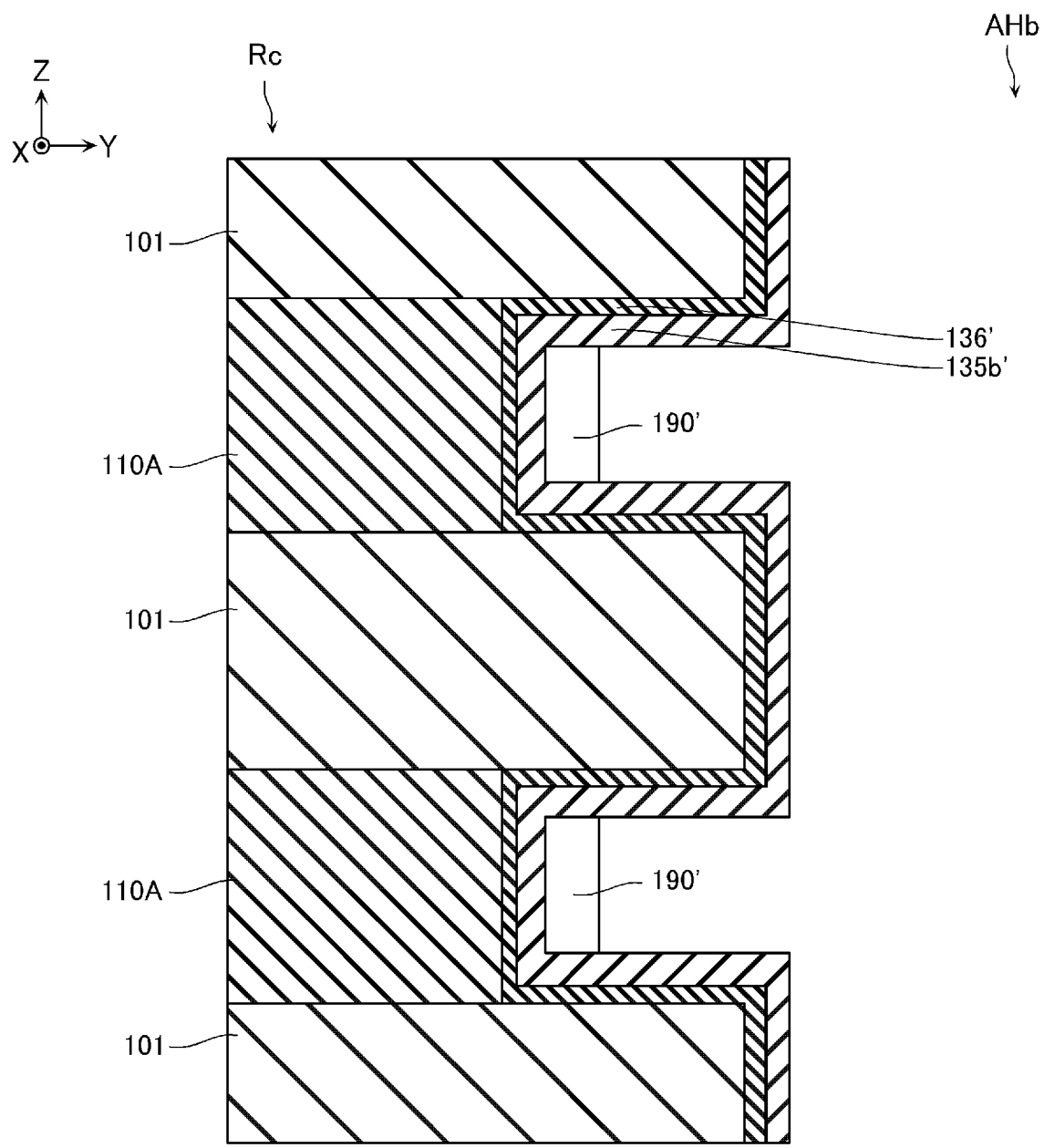
FIG. 38 is a schematic cross-sectional view illustrating the manufacturing method.

Subsequently, as illustrated in FIG. 38, a portion of the semiconductor layer 190 is removed, and a plurality of semiconductor layers 190' arranged in the Z direction to correspond to the sacrifice layers 110A are formed. The process is performed, for example, by wet etching.

Figure 39:
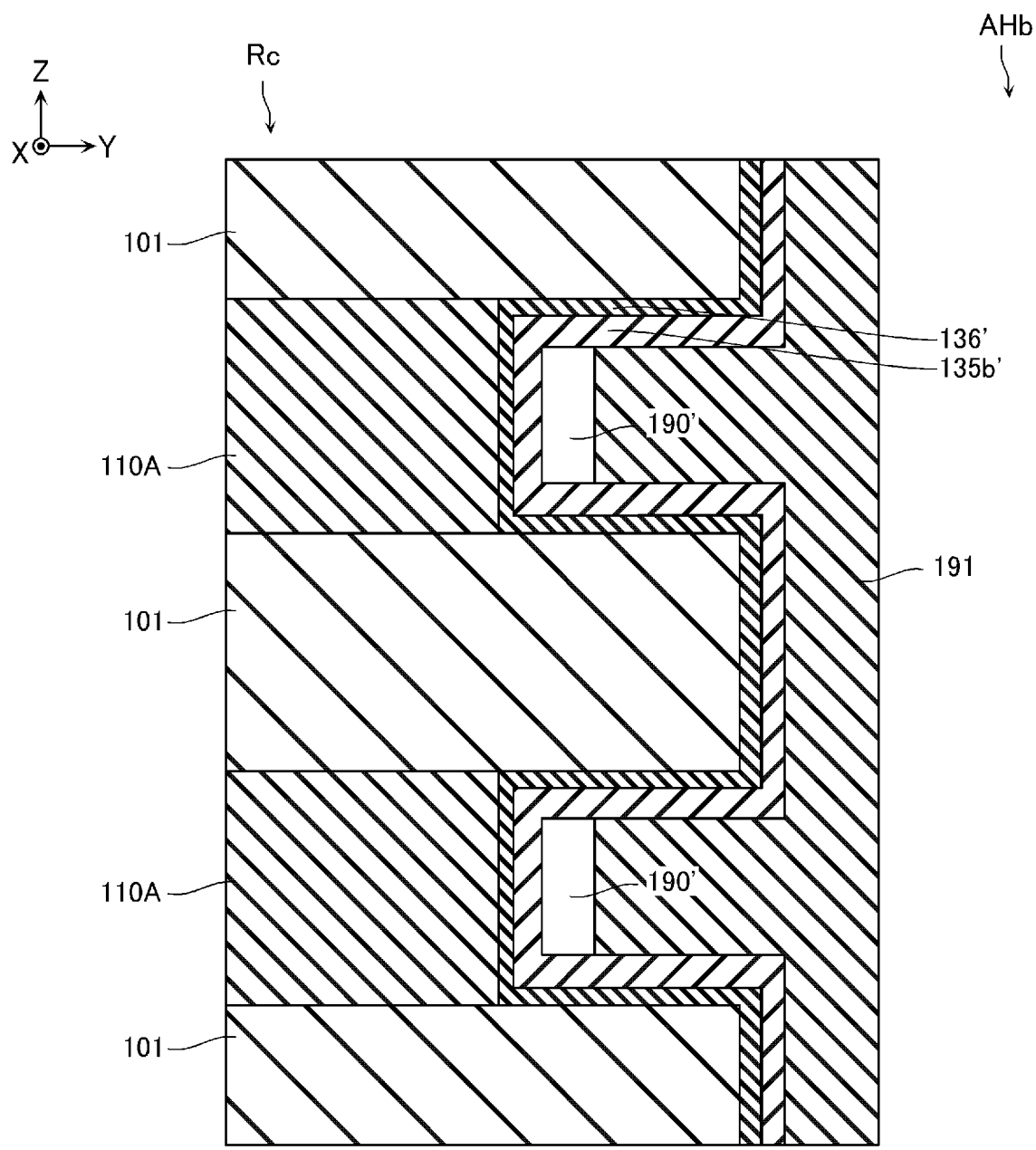
FIG. 39 is a schematic cross-sectional view illustrating the manufacturing method.

Subsequently, as illustrated in FIG. 39, an insulating layer 191 is formed on the side surface of the opening AHb via the opening AHb. The insulating layer 191 is, for example, made of silicon nitride (SiN). The process is performed, for example, by CVD.

Figure 40:
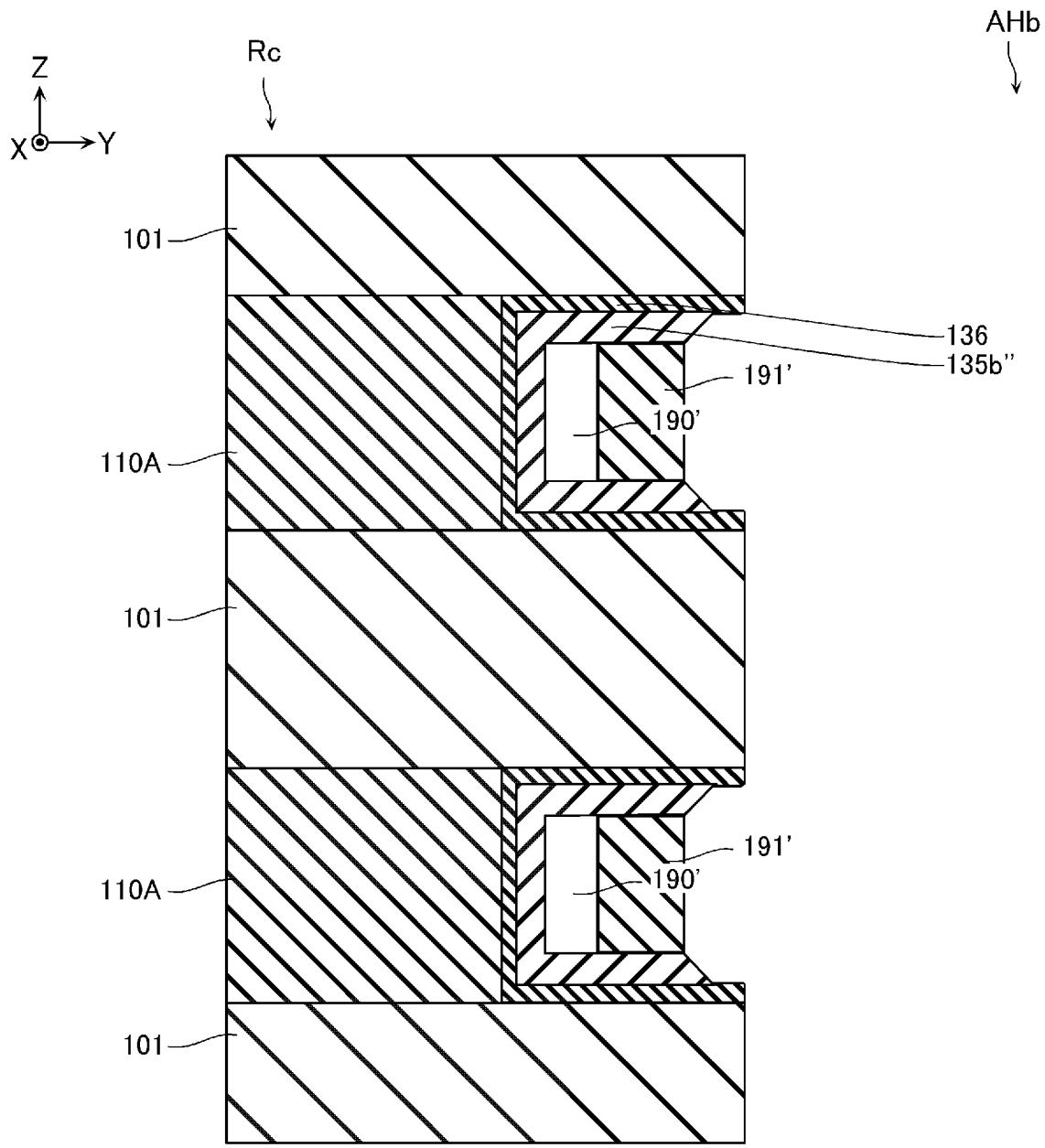
FIG. 40 is a schematic cross-sectional view illustrating the manufacturing method.

Subsequently, as illustrated in FIG. 40, portions of the insulating layers 191, the high dielectric constant layers 135b', and the insulating layers 136' on the opening AHb side are partially removed via the opening AHb. Accordingly, a plurality of insulating layer 191', a plurality of high dielectric constant layers 135b'', and the plurality of insulating layers 136 arranged in the Z direction to correspond to the sacrifice layers 110A are formed. The process is performed, for example, by wet etching. Further, the wet etching is performed by using a chemical solution on the insulating layer 191 at a high speed and on the high dielectric constant layer 135b' at a low speed. Due to the difference in etching speeds, a portion of the insulating layer 191 is quickly etched, and thus an inclined surface is formed in the high dielectric constant layer 135b.

Figure 41:
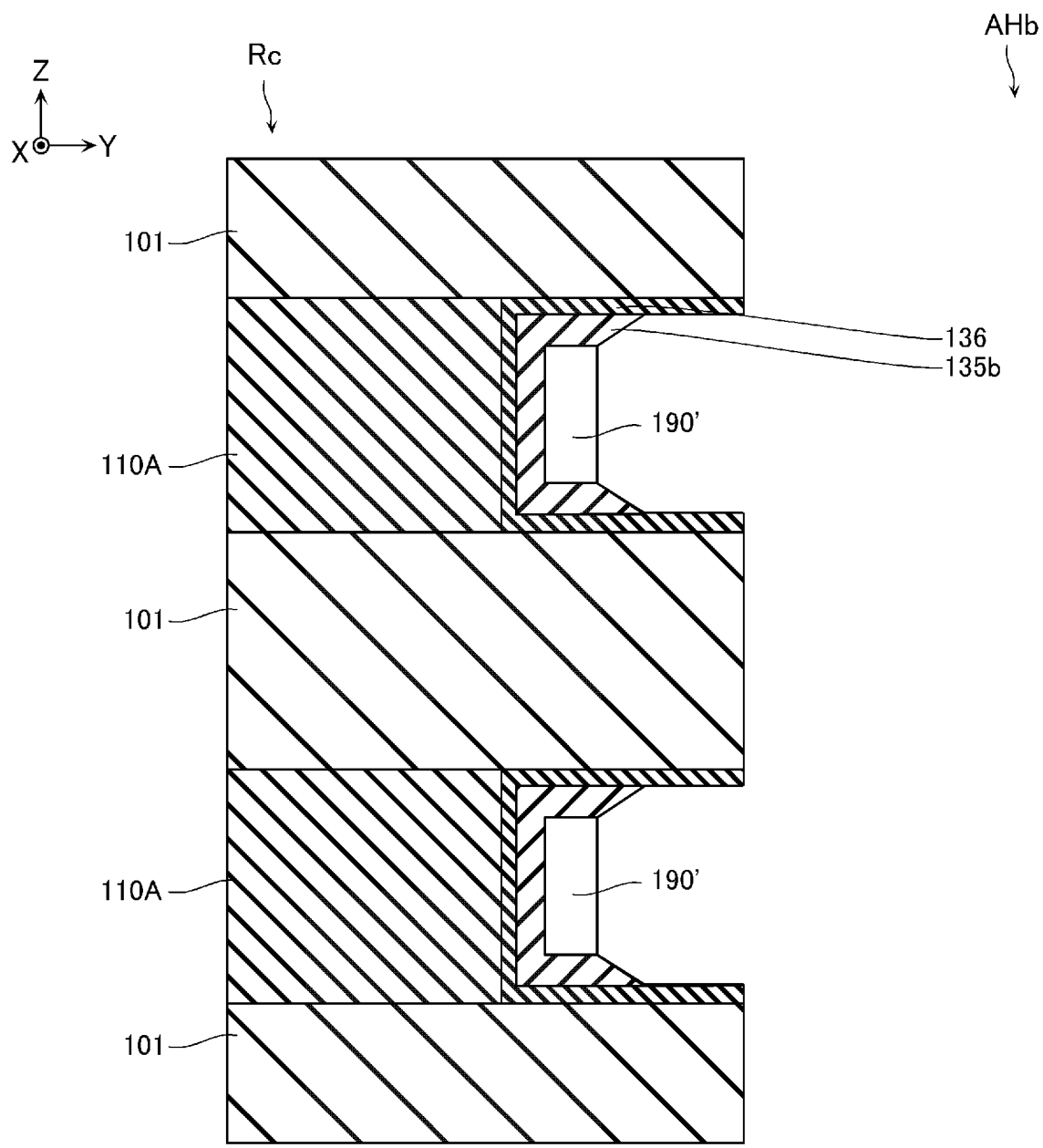
FIG. 41 is a schematic cross-sectional view illustrating the manufacturing method.

Subsequently, the same wet etching as the process illustrated in FIG. 40 is further performed, the high dielectric constant layer 135b with an inclined surface is formed as illustrated in FIG. 41.

Figure 42:
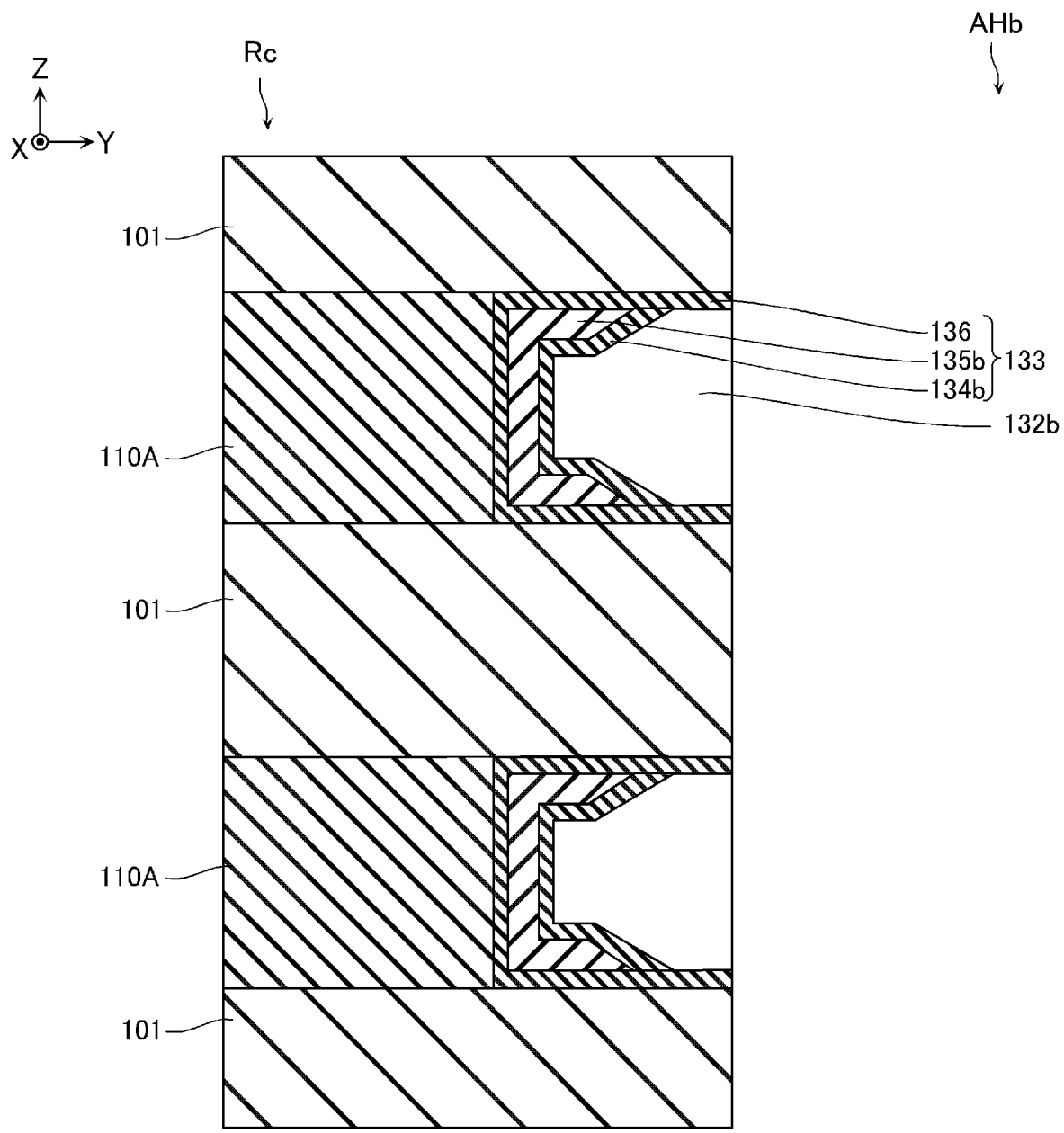
FIG. 42 is a schematic cross-sectional view illustrating the manufacturing method.

Subsequently, as illustrated in FIG. 42, the semiconductor layers 190' are removed via the opening AHb, the insulating layers 134b are formed, and the charge storage layers 132b are formed. The process is performed, for example, by wet etching and CVD.

Figure 43:
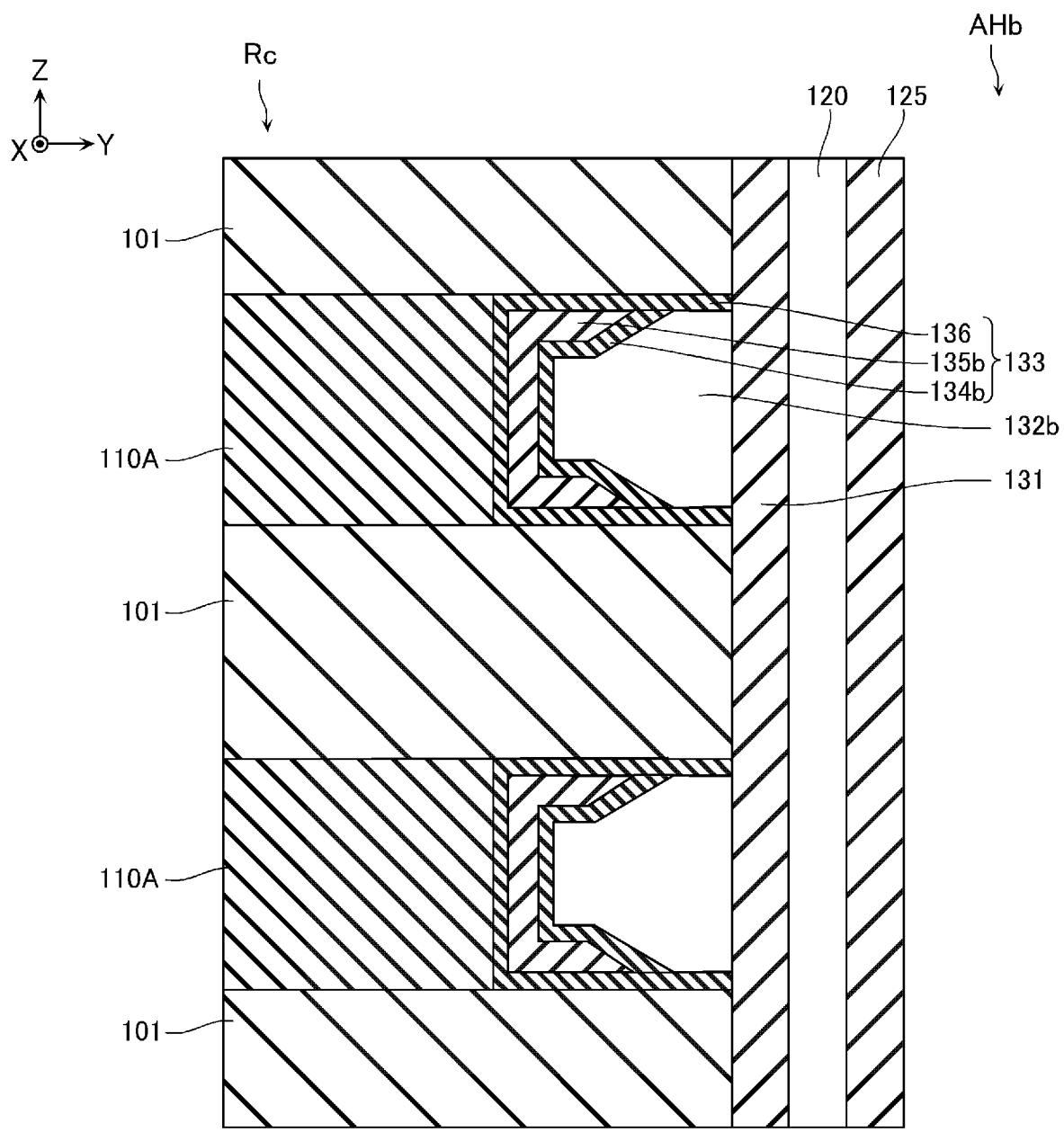
FIG. 43 is a schematic cross-sectional view illustrating the manufacturing method.

Subsequently, as illustrated in FIG. 43, in the same manner as the process described with reference to FIG. 33, the tunnel insulating layer 131, the semiconductor layer 120, and the insulating layer 125 are formed. In addition, the plurality of sacrifice layers 110A are removed via openings (not illustrated), and the metal oxide layers 113, the barrier conductive layers 111, and the conductive layers 110 are formed. Thereafter, the bit line contacts BLC, the bit lines BL, and the like are formed, to manufacture the semiconductor storage device according to the second embodiment.

Third Embodiment

Figure 44:
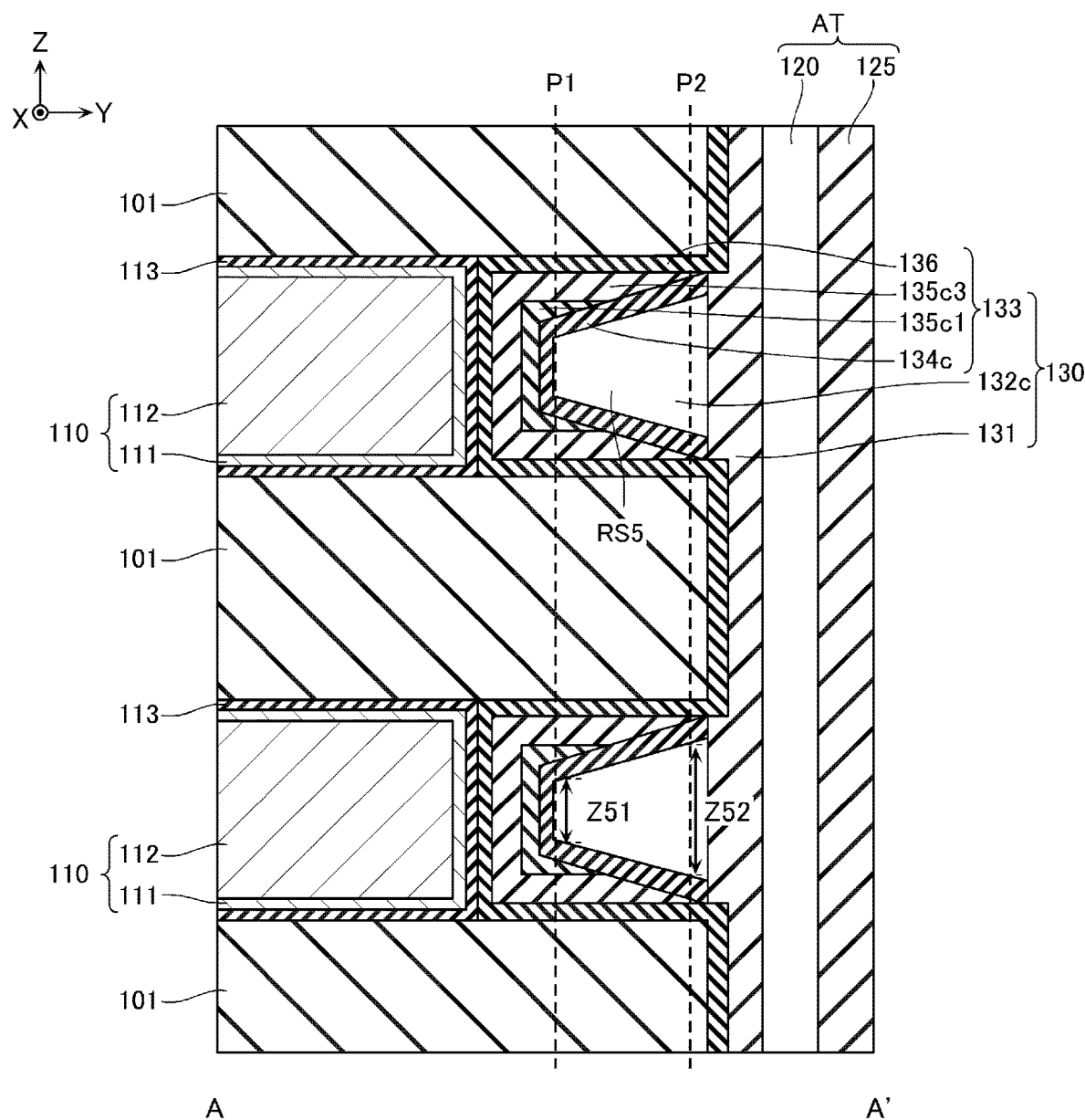
FIG. 44 is a schematic cross-sectional view of a semiconductor storage device according to a third embodiment.

[Configuration] Subsequently, a semiconductor storage device according to a third embodiment is described with reference to FIG. 44. FIG. 44 is a schematic cross-sectional view of the semiconductor storage device according to the third embodiment. FIG. 44 is a schematic cross-sectional view illustrating a configuration of a portion of the semiconductor storage device according to the third embodiment which corresponds to FIG. 6.

The semiconductor storage device according to the third embodiment is basically configured in the same manner as the semiconductor storage device according to the first embodiment. However, the semiconductor storage device according to the third embodiment is different from the first embodiment, and includes charge storage layers 132c and insulating layers 134c instead of the charge storage layers 132 and the insulating layers 134, and includes high dielectric constant layers 135c1 and high dielectric constant layers 135c3 instead of the high dielectric constant layers 135.

The charge storage layer 132c is basically configured in the same manner as the charge storage layer 132 according to the first embodiment. However, the charge storage layer 132c includes an inclined portion RS5 instead of the wide portion RW1 and the narrow portion RN1 in the charge storage layer 132.

The inclined portion RS5 is provided as a region in which the thickness in the Z direction increases as it goes closer to the semiconductor layers 120 side. In addition, the inclined portion RS5 includes a facing surface that faces the conductive layer 110 and a facing surface that faces the semiconductor layer 120. FIG. 44 illustrates positions provided between two facing surfaces in the Y direction as the first position P1 and the second position P2. The first position P1 and the second position P2 include a portion of the inclined portion RS5. In addition, the second position P2 is provided between the first position P1 and the semiconductor layers 120. In addition, FIG. 44 illustrates a width of the inclined portion RS5 at the first position P1 in the Z direction as a first width Z51. In addition, the width of the inclined portion RS5 at the second position P2 in the Z direction is illustrated as a second width Z52. The first width Z51 is smaller than the second width Z52.

The insulating layer 134c is basically configured in the same manner as the insulating layer 134 according to the first embodiment. However, the upper surface and the lower surface of the inclined portion RS5 and the side surface thereof on the conductive layer 110 side are covered with the insulating layer 134c as illustrated in FIG. 44.

The high dielectric constant layer 135c1 is basically configured in the same manner as the high dielectric constant layer 135 according to the first embodiment. However, unlike the first embodiment, a portion of the upper surface and a portion of the lower surface of the inclined portion RS5, and a side surface thereof on the conductive layer 110 side are covered with the high dielectric constant layer 135c1 via the insulating layer 134c. The high dielectric constant layers 135c1 are provided between the charge storage layer 132c and the high dielectric constant layer 135c3.

The high dielectric constant layer 135c3 is basically configured in the same manner as the high dielectric constant layer 135 according to the first embodiment. However, unlike the first embodiment, the upper surface and the lower surface of the high dielectric constant layer 135c1, the side surface thereof on the conductive layer 110 side, and a portion of the upper surface and a portion of the lower surface of the insulating layer 134c are covered with the high dielectric constant layer 135c3.

The high dielectric constant layers 135c1 and the high dielectric constant layers 135c3 may also include the same material as the material in the high dielectric constant layer 135 exemplified in the first embodiment. However, the relative dielectric constant of the material in the high dielectric constant layer 135c1 is lower than the relative dielectric constant of the material in the high dielectric constant layer 135c3. In order to provide such a difference in the relative dielectric constant, as described below, a combination of materials such as the composition ratio of the material, the film density, and the impurity concentration, is appropriately selected between the high dielectric constant layers 135c1 and the high dielectric constant layers 135c3.

Examples of adjusting the relative dielectric constants of the high dielectric constant layer 135c1 and the high dielectric constant layer 135c3 by the composition ratios of the materials are provided. For example, when the material of the high dielectric constant layers 135c1 and 135c3 is hafnium silicate (HfSiO), it is known that the relative dielectric constant decreases as the Si composition ratio in hafnium silicate (HfSiO) increases. Accordingly, the ratio of silicon (Si) to hafnium (Hf) in the high dielectric constant layer 135c1 may be made high, and the ratio of silicon (Si) to hafnium (Hf) in the high dielectric constant layer 135c3 may be made low. In such a case, the relative dielectric constant of the high dielectric constant layer 135c1 is lower than the relative dielectric constant of the high dielectric constant layer 135c3. Further, the composition ratio of Si to Hf may be a ratio selected from 1% to 50% inclusive.

Examples of adjusting the relative dielectric constants of the high dielectric constant layer 135c1 and the high dielectric constant layer 135c3 by the impurity concentration of a material are provided. For example, when the material is hafnium silicate (HfSiO), it is known that the relative dielectric constant decreases as the impurity concentration in hafnium silicate (HfSiO) increases. Accordingly, the impurity concentration in hafnium silicate (HfSiO) in the high dielectric constant layer 135c1 may be made high, and the impurity concentration in hafnium silicate (HfSiO) in the high dielectric constant layer 135c3 may be made low. In such a case, the relative dielectric constant of the high dielectric constant layer 135c1 is lower than the relative dielectric constant of the high dielectric constant layer 135c3. Further, for example, the impurity may be at least one element selected from the group consisting of carbon (C), nitrogen (N), fluorine (F), aluminum (Al), chlorine (Cl), and silicon (Si).

Examples of adjusting the relative dielectric constants of the high dielectric constant layers 135c1 and the high dielectric constant layer 135c3 by the film density are provided. For example, when the material is hafnium oxide (HfO), the proportion of an amorphous portion in hafnium oxide (HfO) increases, and the proportion of a crystallized portion is made low, so that the film density of hafnium oxide (HfO) can be decreased, and the relative dielectric constant can be decreased. The film density of the material of hafnium oxide (HfO) in the high dielectric constant layer 135c1 may be made low, and the film density of hafnium oxide (HfO) in the high dielectric constant layer 135c3 may be made higher. In such a case, the relative dielectric constant of the high dielectric constant layer 135c1 is lower than the relative dielectric constant of the high dielectric constant layer 135c1. Further, the material of which the film density changes according to the ratio of an amorphous portion to a crystallized portion is not limited to hafnium oxide (HfO), and further may be zirconium oxide (ZrO).

Examples of adjusting the relative dielectric constants of the high dielectric constant layer 135c1 and the high dielectric constant layer 135c3 by materials are provided. For example, it is known that hafnium oxide (HfO) indicates the relative dielectric constant lower than that of zirconium oxide (ZrO). Accordingly, the high dielectric constant layer 135c1 may include hafnium oxide (HfO), and the high dielectric constant layer 135c3 may include zirconium oxide (ZrO). In such a case, the relative dielectric constant of the high dielectric constant layer 135c1 is lower than the relative dielectric constant of the high dielectric constant layer 135c3. Further, the material in the high dielectric constant layers 135c1 and the high dielectric constant layers 135c3 may be a mixed crystal of hafnium oxide (HfO) and zirconium oxide (ZrO). In such a case, the high dielectric constant layer 135c1 may include more hafnium oxide (HfO), and the high dielectric constant layer 135c3 may include more zirconium oxide (ZrO). Further, as a combination of materials in the high dielectric constant layer 135c1 and the high dielectric constant layer 135c3, in addition to the above, hafnium oxide (HfO) and lanthanum oxide (LaO), zirconium oxide (ZrO) and lanthanum oxide (LaO), or the like may be used. In such a case, materials may be appropriately selected so that the high dielectric constant layer 135c1 has a lower relative dielectric constant than the high dielectric constant layer 135c3.

[Manufacturing Method]

Subsequently, with reference to FIGS. 45 to 51, a method of manufacturing the semiconductor storage device according to the third embodiment is described. FIGS. 45 to 51 are schematic cross-sectional views illustrating the manufacturing method and correspond to the portion illustrated in FIG. 44.

When the semiconductor storage device according to the third embodiment is manufactured, processes described with reference to FIGS. 7 to 24 are performed.

Figure 45:
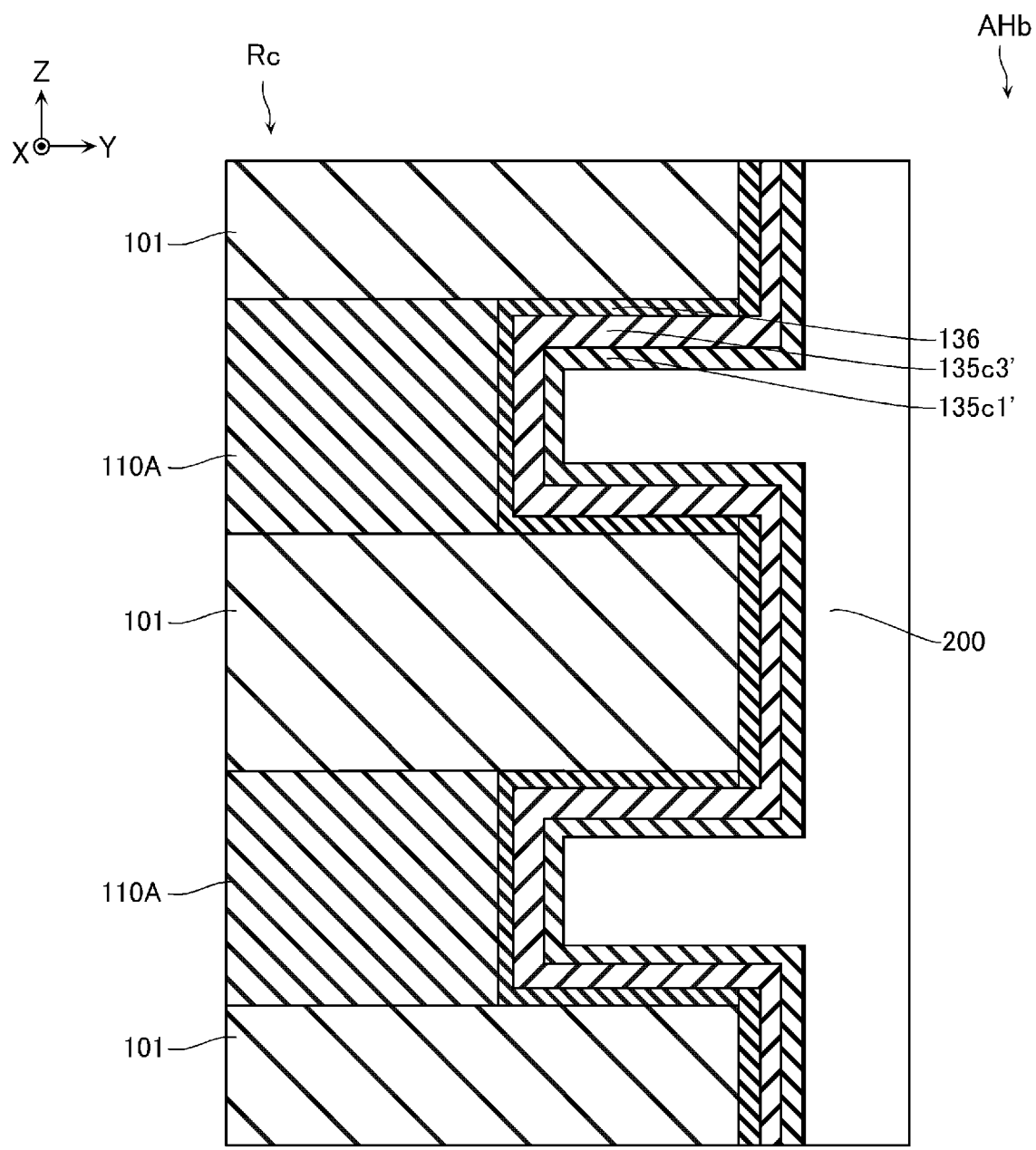
FIG. 45 is a schematic cross-sectional view illustrating a method of manufacturing the semiconductor storage device.

Subsequently, as illustrated in FIG. 45, the insulating layers 136, a high dielectric constant layer 135c3', a high dielectric constant layer 135c1', and a semiconductor layer 200 are sequentially formed on the side surface of the opening AHb via the opening AHb. The high dielectric constant layer 135c3' and the high dielectric constant layer 135c1' include the same materials as the high dielectric constant layer 135c3 and the high dielectric constant layer 135c1. The semiconductor layer 200 is, for example, amorphous silicon (Si). The process is performed, for example, by CVD.

Figure 46:
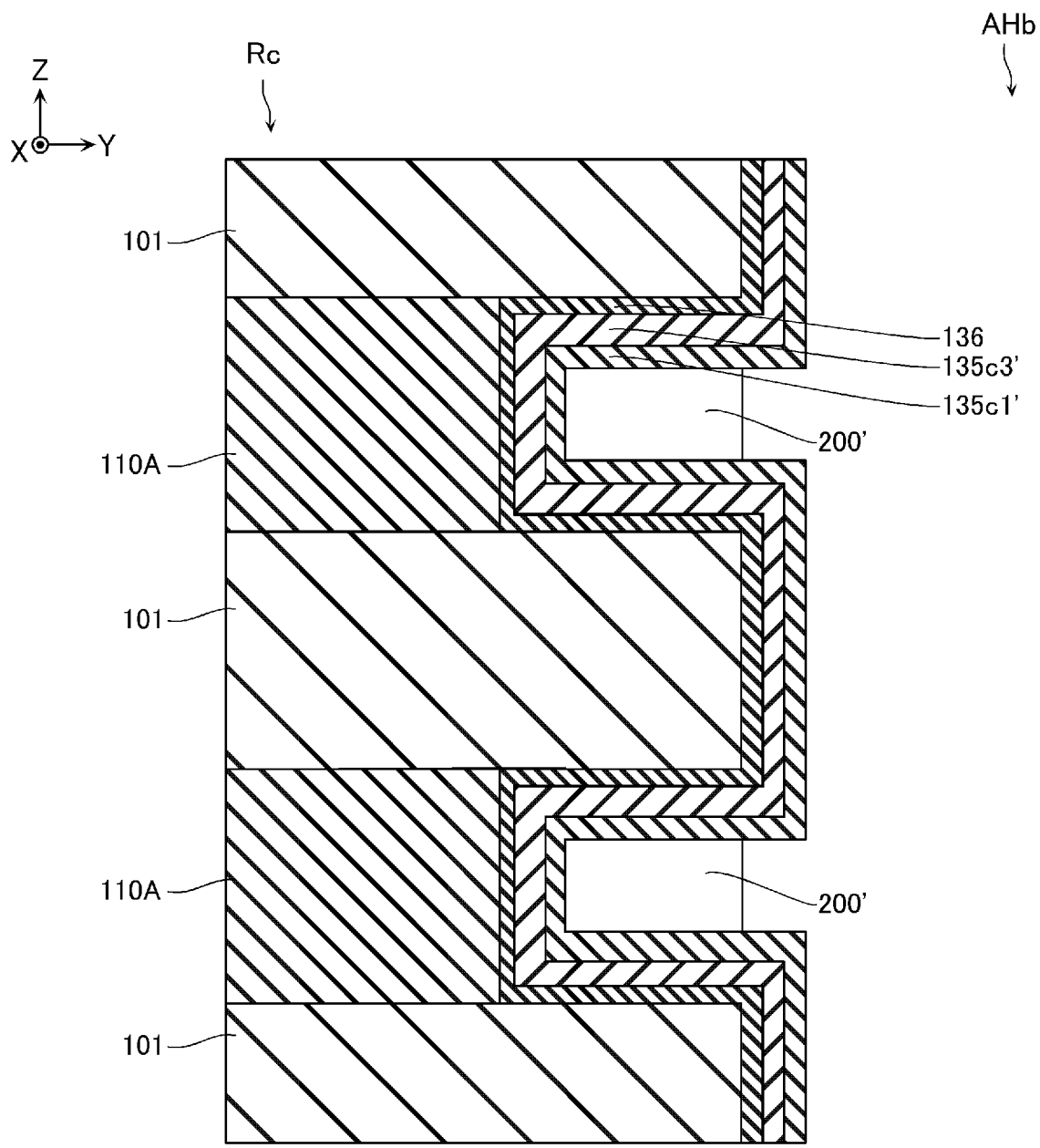
FIG. 46 is a schematic cross-sectional view illustrating the manufacturing method.

Subsequently, as illustrated in FIG. 46, portions of the semiconductor layer 200 are removed, and a plurality of semiconductor layers 200' arranged in the Z direction to correspond to the sacrifice layers 110A are formed. The process is performed, for example, by wet etching.

Figure 47:
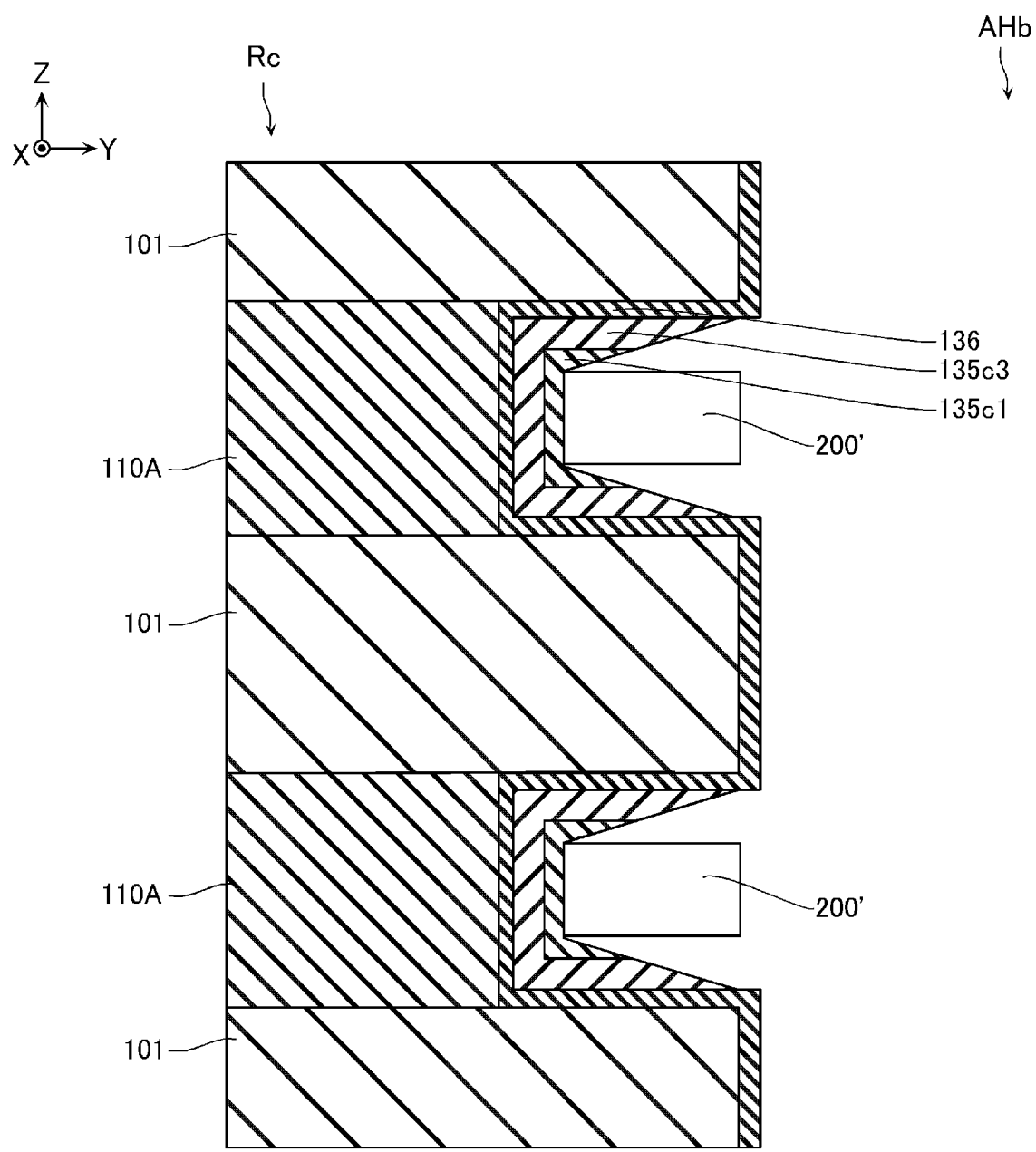
FIG. 47 is a schematic cross-sectional view illustrating the manufacturing method.

Subsequently, as illustrated in FIG. 47, portions of the high dielectric constant layers 135c1' and the high dielectric constant layers 135c3' on the opening AHb side are partially removed via the opening AHb. Accordingly, the plurality of high dielectric constant layers 135c1 and the plurality of high dielectric constant layers 135c3 arranged in the Z direction to correspond to the sacrifice layers 110A are formed. The process is performed, for example, by wet etching.

Further, the wet etching is performed by using a method of etching the high dielectric constant layer 135c1' at a high speed and etching the high dielectric constant layer 135c3' at a low speed which is described below. According to the difference in etching speed, a portion of the high dielectric constant layer 135c1' is removed faster, and thus inclined surfaces are formed in the high dielectric constant layer 135c1 and the high dielectric constant layer 135c3.

The difference in etching speed in the process may be achieved, for example, by forming the high dielectric constant layer 135c1' with a low density film and the high dielectric constant layer 135c3' with a high density film and using a phenomenon in which the etching speed becomes faster as the density becomes lower. In addition, when the high dielectric constant layer 135c1' and the high dielectric constant layer 135c3' include different materials or materials with different composition ratios, a chemical solution with which the high dielectric constant layer 135c1' is etched at a higher speed may be appropriately selected to perform etching.

Figure 48:
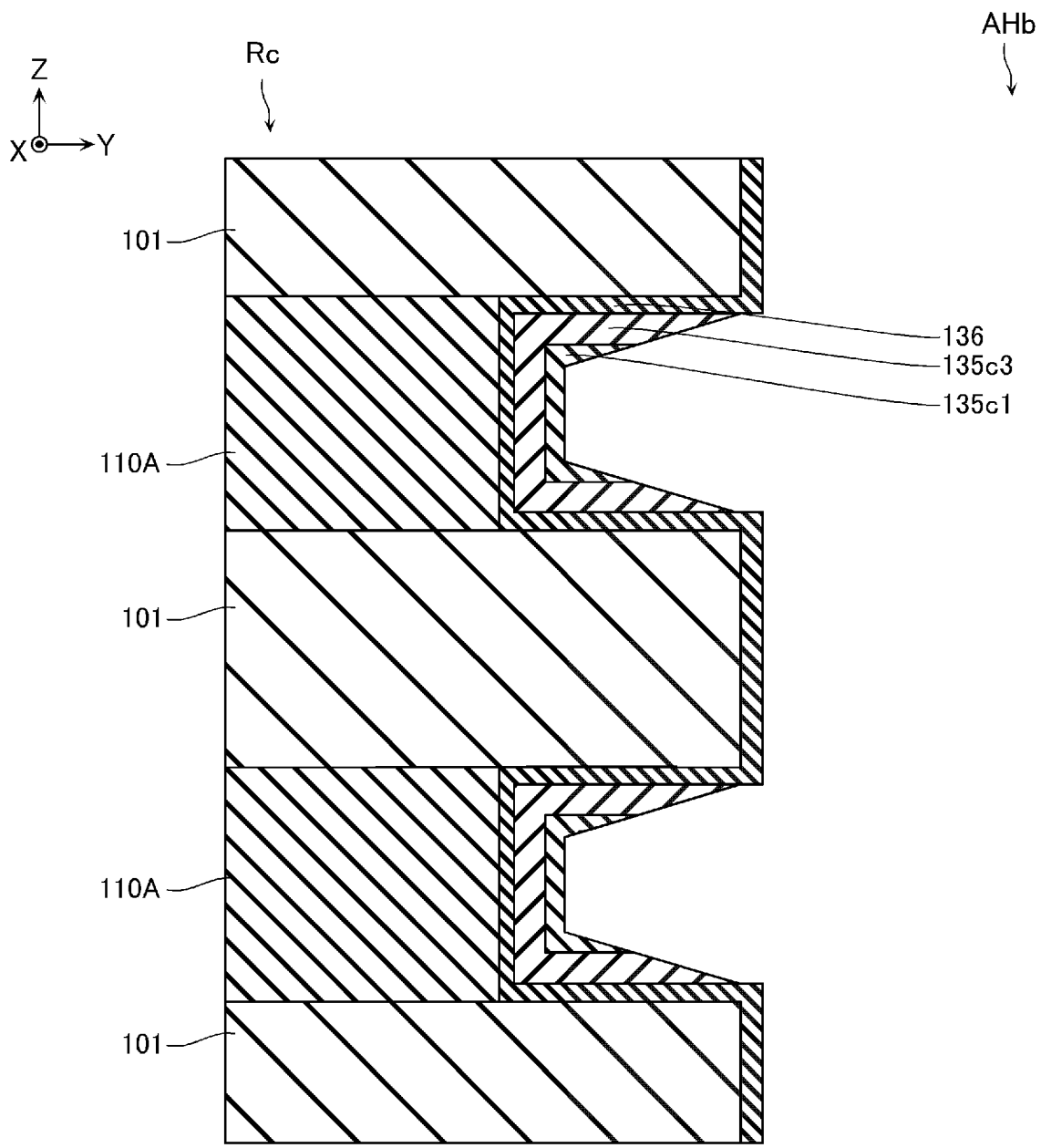
FIG. 48 is a schematic cross-sectional view illustrating the manufacturing method.

Subsequently, as illustrated in FIG. 48, the semiconductor layers 200' are removed via the openings AHb. The process is performed, for example, by wet etching.

Figure 49:
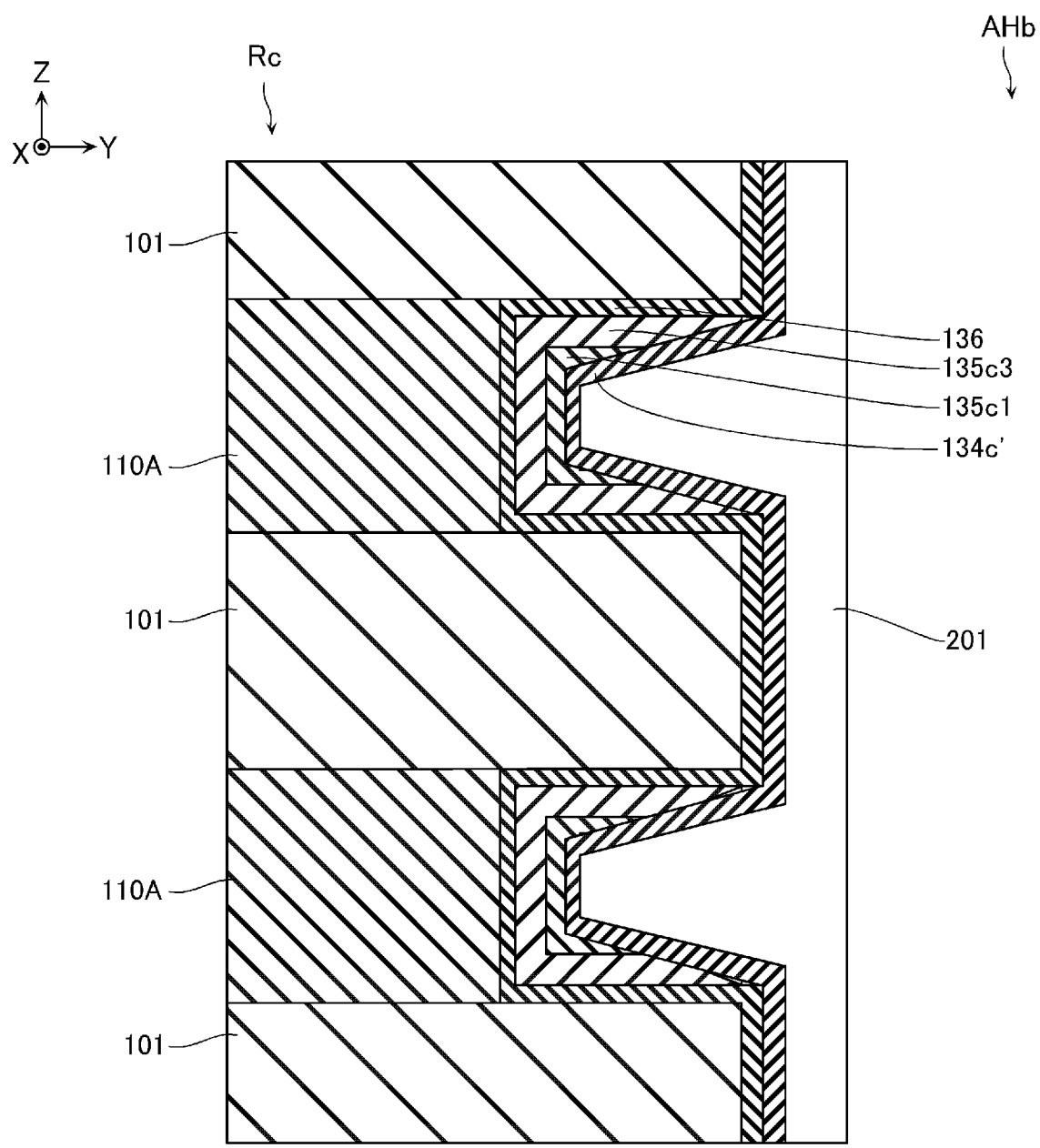
FIG. 49 is a schematic cross-sectional view illustrating the manufacturing method.

Subsequently, as illustrated in FIG. 49, insulating layers 134c' and semiconductor layer 201 are formed via the openings AHb. The semiconductor layer 201 is, for example, amorphous silicon (Si). The process is performed, for example, by CVD.

Figure 50:
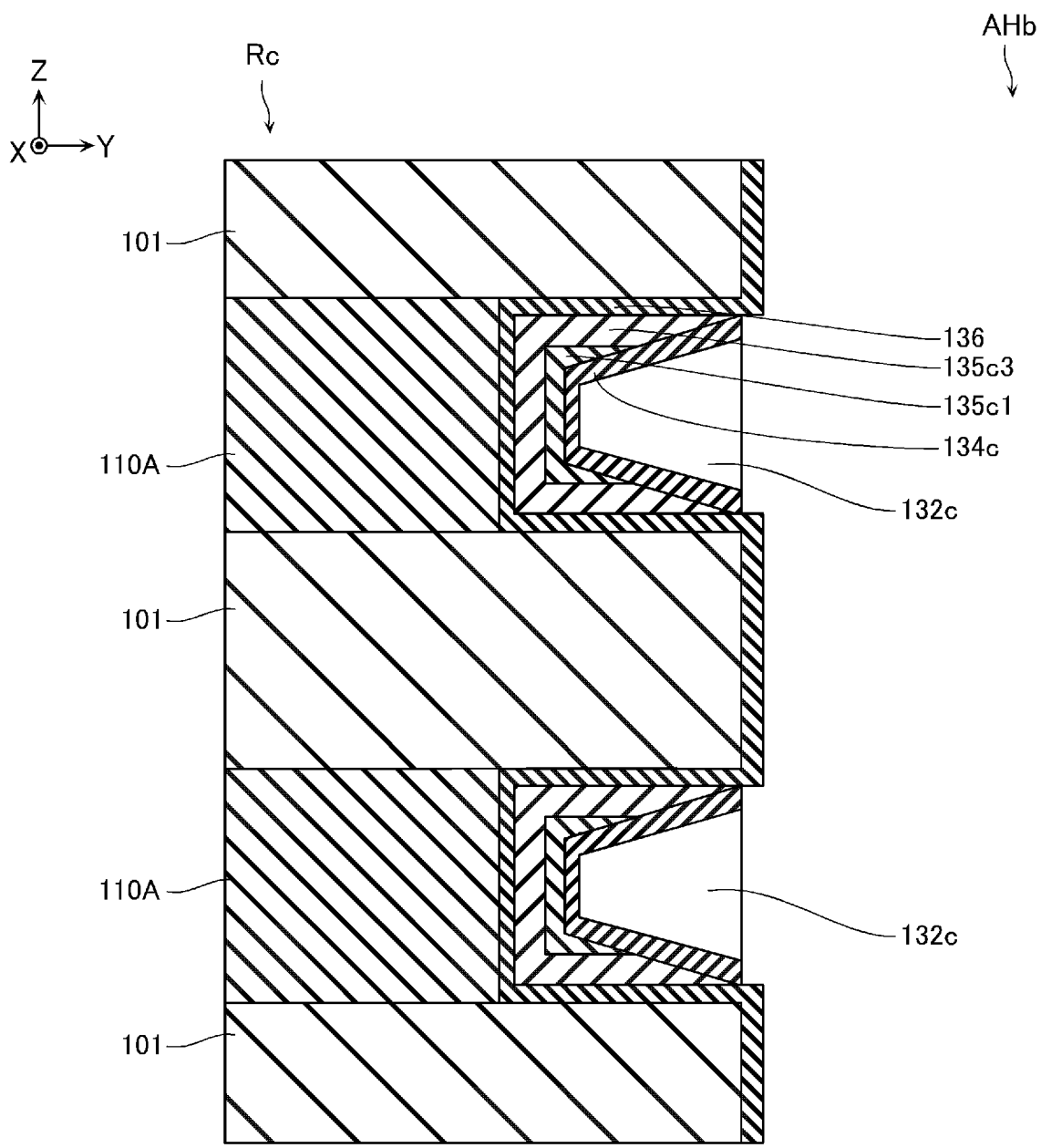
FIG. 50 is a schematic cross-sectional view illustrating the manufacturing method.

Subsequently, as illustrated in FIG. 50, a portion of the insulating layers 134c' and a portion of the semiconductor layer 201 are removed via the openings AHb, and the plurality of insulating layers 134c and the plurality of charge storage layers 132c arranged in the Z direction are formed. The process is performed, for example, by wet etching.

Figure 51:
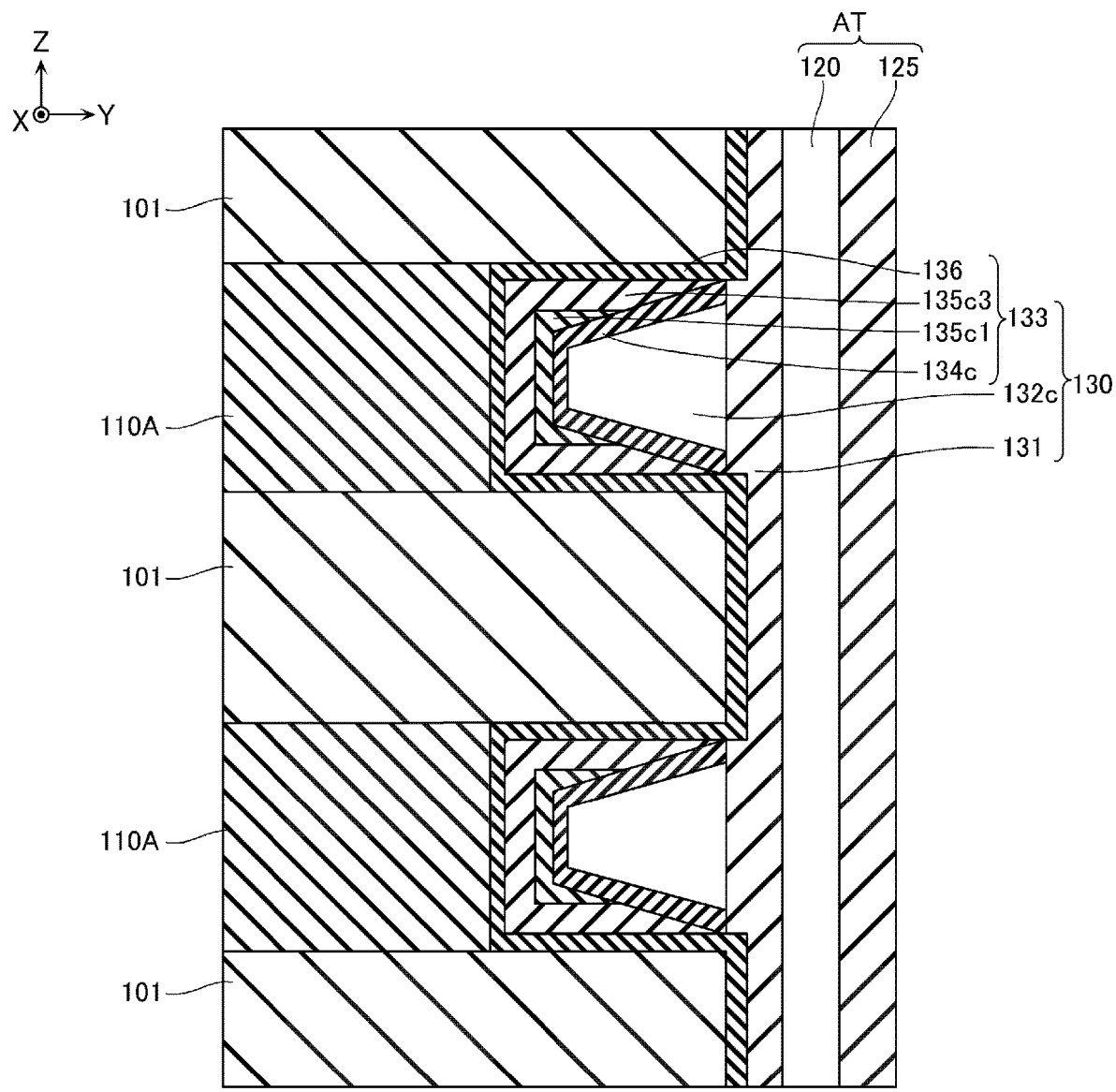
FIG. 51 is a schematic cross-sectional view illustrating the manufacturing method.

Subsequently, as illustrated in FIG. 51, the tunnel insulating layers 131, the semiconductor layers 120, and the insulating layer 125 are formed in the same manner as the processes described with reference to FIG. 33. In addition, the plurality of sacrifice layers 110A are removed via openings (not illustrated), and the metal oxide layers 113, the barrier conductive layers 111, and the conductive layers 110 are formed. Thereafter, the bit line contacts BLC, the bit lines BL, and the like are formed, and the semiconductor storage device according to the third embodiment is manufactured.

[Effect of Third Embodiment]

The effect in the third embodiment is described with reference to the comparative example illustrated in FIG. 34. In the comparative example, as described with reference to FIG. 34, the high dielectric constant layers 135x are provided between the charge storage layers 132x and the conductive layers 110. Here, the side surface of the charge storage layer 132x on the conductive layer 110 side has a smaller width than the conductive layer 110 in the Z direction. Accordingly, the electric lines extending from the conductive layer 110 to the charge storage layer 132x easily concentrate on this side surface. In addition, a leak current may occur in a high electric field portion where the electric field is concentrated.

Meanwhile, according to the third embodiment, as described with reference to FIG. 44, the high dielectric constant layer 135c1 and the high dielectric constant layer 135c3 are provided between the charge storage layer 132c and the conductive layer 110. Here, the side surface of the charge storage layer 132c on the conductive layer 110 side has a smaller width than the conductive layer 110 in the Z direction.

However, in the third embodiment, the side surface of the charge storage layer 132c on the conductive layer 110 side is covered with the high dielectric constant layer 135c1 with a lower relative dielectric constant. In such a configuration, the lines of electric force generated from the conductive layer 110 can easily escape to the upper and lower surfaces of the charge storage layer 132c covered with the high dielectric constant layer 135c3 with a relatively higher relative dielectric constant. That is, by disposing the high dielectric constant layers 135c1 on the side surface of the charge storage layers 132c on the conductive layers 110 side, the occurrence of the leak current by the electric field concentration can be prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a first conductive layer extending in a first direction;
a second conductive layer extending in the first direction and arranged with the first conductive layer in a second direction intersecting the first direction;

a first insulating layer extending in the first direction and provided between the first conductive layer and the second conductive layer in the second direction;

a semiconductor layer: (i) extending in the second direction and (ii) facing, in a third direction intersecting the first direction and the second direction, the first conductive layer, the second conductive layer, and the first insulating layer;

a first charge storage layer provided between the first conductive layer and the semiconductor layer;

a second charge storage layer provided between the second conductive layer and the semiconductor layer;

a first high dielectric constant layer provided between the first conductive layer and the first charge storage layer;

a second high dielectric constant layer provided between the second conductive layer and the second charge storage layer, wherein at least a portion of the first charge storage layer faces the second charge storage layer without the second high dielectric constant layer being interposed between them in the second direction; and a third high dielectric constant layer provided between the first conductive layer and the first high dielectric constant layer, wherein the first high dielectric constant layer has a lower dielectric constant than the third high dielectric constant layer, wherein the first high dielectric constant layer and the third high dielectric constant layer include nitrogen (N), and wherein the first high dielectric constant layer has a higher N concentration than the third high dielectric constant layer.

2. The semiconductor storage device according to claim 1, wherein at least a portion of the first charge storage layer is at least as wide as the first high dielectric constant layer in the second direction.

3. The semiconductor storage device according to claim 1, wherein the first charge storage layer includes:
   a first facing surface facing the first conductive layer in the third direction; and
   a second facing surface facing the semiconductor layer in the third direction, and
wherein, in the second direction, the first charge storage layer at a first position between the first facing surface and the second facing surface is thinner than the first charge storage layer at a second position between the first position and the second facing surface.

4. The semiconductor storage device according to claim 1, wherein the first high dielectric constant layer and the third high dielectric constant layer include: (i) at least one of hafnium (Hf), zirconium (Zr), lanthanum (La), or yttrium (Y), and (ii) silicon (Si), and
wherein the first high dielectric constant layer has a higher Si concentration than the third high dielectric constant layer.

5. The semiconductor storage device according to claim 1, wherein the first high dielectric constant layer has a lower density than the third high dielectric constant layer.

6. The semiconductor storage device according to claim 1, further comprising:
   a third conductive layer separated from the first conductive layer in the third direction and extending in the first direction;
   a plurality of semiconductor layers provided between the first conductive layer and the third conductive layer and arranged in the first direction;
   a plurality of first memory cells respectively provided between the first conductive layer and the plurality of semiconductor layers; and
   a plurality of second memory cells respectively provided between the third conductive layer and the plurality of semiconductor layers.

7. The semiconductor storage device according to claim 1, further including a memory cell array.

8. The semiconductor storage device according to claim 1, wherein the semiconductor layer include polycrystalline silicon.

9. The semiconductor storage device according to claim 1, wherein the first high dielectric layer includes at least one of carbon, nitrogen, fluorine, aluminum, chlorine or silicon.

10. The semiconductor storage device according to claim 1, wherein the first charge storage layer includes a floating gate.

11. The semiconductor storage device according to claim 1, wherein the first high dielectric layer includes an insulating material.

* * * * *